(12) United States Patent
Toyotaka et al.

(10) Patent No.: US 11,075,255 B2
(45) Date of Patent: Jul. 27, 2021

(54) DISPLAY PANEL, DISPLAY DEVICE, INPUT/OUTPUT DEVICE, AND DATA PROCESSING DEVICE

(71) Applicant: Semiconductor Energy Laboratory Co., Ltd., Atsugi (JP)

(72) Inventors: Kouhei Toyotaka, Kanagawa (JP); Kei Takahashi, Kanagawa (JP); Hideaki Shishido, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/854,067

(22) Filed: Dec. 26, 2017

(65) Prior Publication Data

US 2018/0182834 A1    Jun. 28, 2018

(30) Foreign Application Priority Data

Dec. 27, 2016   (JP) .............................. JP2016-253066
Jan. 18, 2017   (JP) .............................. JP2017-006410
Apr. 4, 2017    (JP) .............................. JP2017-074196

(51) Int. Cl.
*H01L 27/32*      (2006.01)
*H01L 27/02*      (2006.01)
(Continued)

(52) U.S. Cl.
CPC ........ *H01L 27/3262* (2013.01); *G06F 3/0412* (2013.01); *G09G 3/2007* (2013.01);
(Continued)

(58) Field of Classification Search
CPC .. G09G 3/3208; G09G 3/2007; G09G 3/3233; G09G 2310/027; G09G 2330/04;
(Continued)

(56) References Cited

U.S. PATENT DOCUMENTS 7,674,650 B2    3/2010  Akimoto et al.
7,732,819 B2    6/2010  Akimoto et al.
(Continued)

FOREIGN PATENT DOCUMENTS

CN    102013228 A    4/2011
CN    103681874 A    3/2014
(Continued)

OTHER PUBLICATIONS

Invitation to Pay Additional Fees (Application No. PCT/IB2017/057978), International Searching Authority, dated Feb. 27, 2018.

*Primary Examiner* — Kent W Chang
*Assistant Examiner* — Sujit Shah
(74) *Attorney, Agent, or Firm* — Fish & Richardson P.C.

(57) ABSTRACT

A novel display panel that is highly convenient or reliable is provided. The display panel includes a display region, and the display region includes a first group of pixels, a second group of pixels, a third group of pixels, a fourth group of pixels, a first scan line, a second scan line, a first signal line, and a second signal line. The first group of pixels include a first pixel and are arranged in a row direction. The second group of pixels include a second pixel and are arranged in the row direction. The third group of pixels include a first pixel and are arranged in a column direction that intersects the row direction. The fourth group of pixels include a second pixel and are arranged in the column direction. The first signal line is electrically connected to the third group of pixels and the second signal line is electrically connected to the fourth group of pixels. The first scan line is electrically connected to the first group of pixels and the second scan line is electrically connected to the second group of pixels.

14 Claims, 40 Drawing Sheets

(51) Int. Cl.
- *H01L 51/56* (2006.01)
- *G09G 3/20* (2006.01)
- *G06F 3/041* (2006.01)
- *H01L 27/12* (2006.01)
- *H01L 29/66* (2006.01)
- *G09G 3/3233* (2016.01)
- *H01L 29/786* (2006.01)

(52) U.S. Cl.
CPC ....... *G09G 3/3233* (2013.01); *H01L 27/0251* (2013.01); *H01L 27/1225* (2013.01); *H01L 27/1255* (2013.01); *H01L 27/3218* (2013.01); *H01L 27/3248* (2013.01); *H01L 27/3258* (2013.01); *H01L 27/3265* (2013.01); *H01L 27/3276* (2013.01); *H01L 29/66969* (2013.01); *H01L 51/56* (2013.01); *G06F 2203/04101* (2013.01); *G06F 2203/04103* (2013.01); *G09G 2310/027* (2013.01); *G09G 2330/04* (2013.01); *G09G 2330/06* (2013.01); *G09G 2354/00* (2013.01); *H01L 27/124* (2013.01); *H01L 27/1262* (2013.01); *H01L 29/7869* (2013.01); *H01L 29/78606* (2013.01); *H01L 2227/323* (2013.01)

(58) Field of Classification Search
CPC .............. G09G 2330/06; G06F 3/0412; G06F 2203/04101; G06F 2203/04103; H01L 27/3263; H01L 27/0251; H01L 27/1225; H01L 27/1255; H01L 27/3218; H01L 27/3248; H01L 27/3258; H01L 27/3265; H01L 27/3276
USPC ........................................................ 345/690
See application file for complete search history.

(56) References Cited

U.S. PATENT DOCUMENTS

| | | | |
|---|---|---|---|
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,742,422 B2 | 6/2014 | Sakakura et al. | |
| 8,790,959 B2 | 7/2014 | Akimoto et al. | |
| 8,796,069 B2 | 8/2014 | Akimoto et al. | |
| 9,041,202 B2 | 5/2015 | Kimura | |
| 9,099,562 B2 | 8/2015 | Akimoto et al. | |
| 9,397,255 B2 | 7/2016 | Kimura | |
| 9,601,516 B2 | 3/2017 | Sakakura et al. | |
| 2002/0101395 A1* | 8/2002 | Inukai | G09G 3/3258 345/83 |
| 2006/0118699 A1* | 6/2006 | Osame | G09G 3/3208 250/214.1 |
| 2006/0139275 A1* | 6/2006 | Yu | H01L 27/3276 345/92 |
| 2007/0001587 A1* | 1/2007 | Hatwar | H01L 51/5278 313/504 |
| 2008/0308805 A1 | 12/2008 | Akimoto et al. | |
| 2011/0017995 A1* | 1/2011 | Yamazaki | H01L 27/124 257/59 |
| 2011/0057918 A1 | 3/2011 | Kimura et al. | |
| 2011/0104851 A1 | 5/2011 | Akimoto et al. | |
| 2011/0121290 A1 | 5/2011 | Akimoto et al. | |
| 2012/0287099 A1* | 11/2012 | Toyotaka | G09G 3/20 345/209 |
| 2014/0070224 A1* | 3/2014 | Yamazaki | H01L 27/1225 257/71 |
| 2015/0237382 A1* | 8/2015 | Nishida | H04N 21/2365 725/116 |
| 2015/0340513 A1 | 11/2015 | Akimoto et al. | |
| 2016/0322450 A1* | 11/2016 | Lee | H01L 27/10882 |
| 2016/0358531 A1* | 12/2016 | Nakakita | G09G 3/3266 |
| 2017/0107609 A1* | 4/2017 | Hsu | C23C 14/542 |
| 2017/0186774 A1 | 6/2017 | Sakakura et al. | |
| 2017/0301699 A1 | 10/2017 | Yamazaki et al. | |

FOREIGN PATENT DOCUMENTS

| | | |
|---|---|---|
| JP | 2001-296551 A | 10/2001 |
| JP | 2009-302520 A | 12/2009 |
| JP | 2011-076079 A | 4/2011 |
| JP | 2014-074906 A | 4/2014 |
| KR | 2011-0025604 A | 3/2011 |
| TW | 201207826 | 2/2012 |

\* cited by examiner

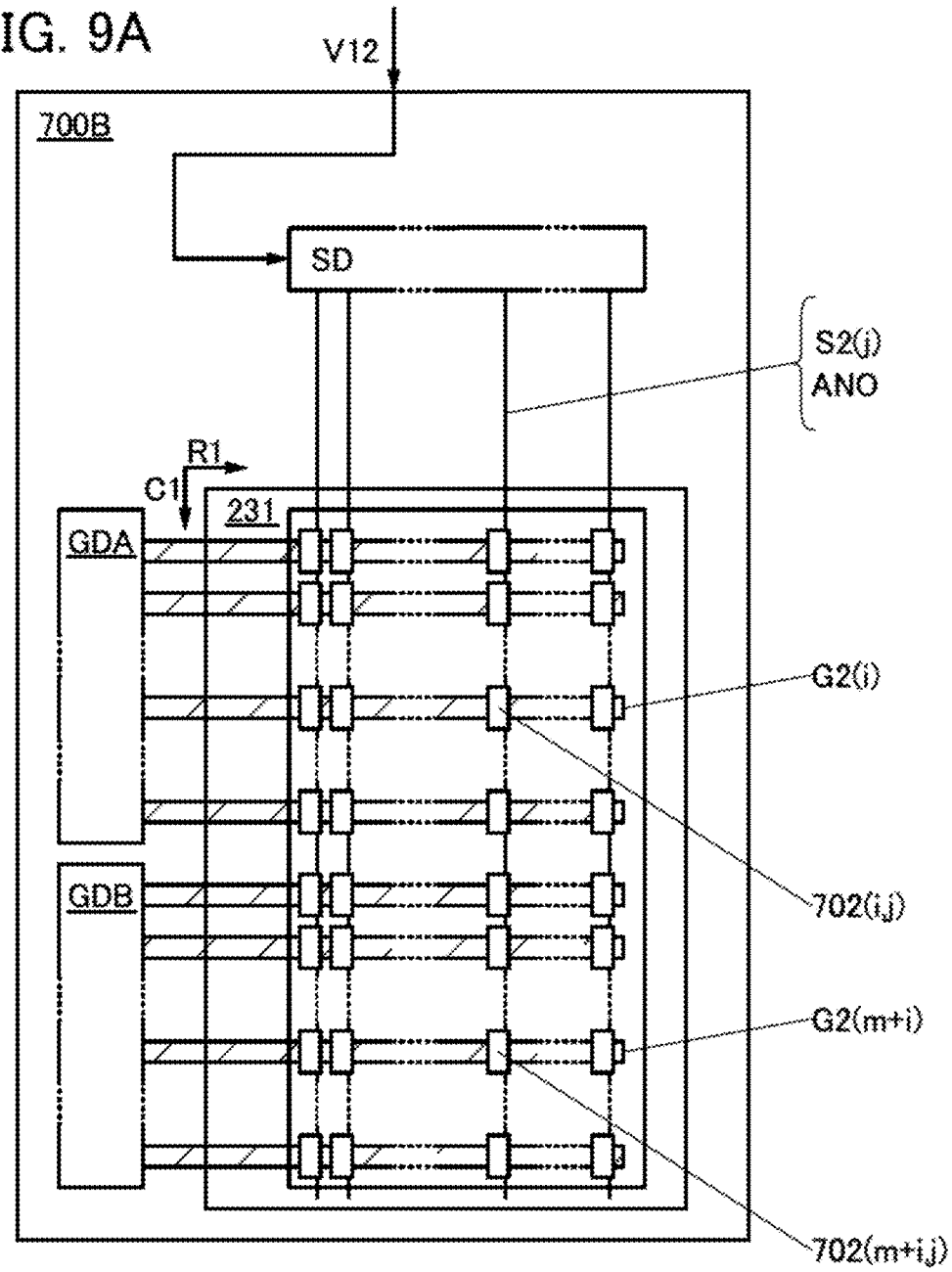
FIG. 9A
FIG. 9B-1
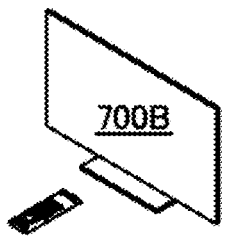
FIG. 9B-2
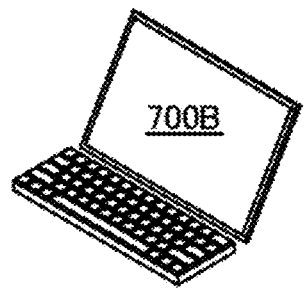
FIG. 9B-3
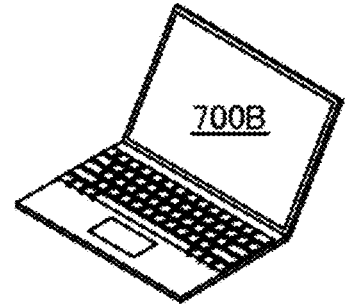

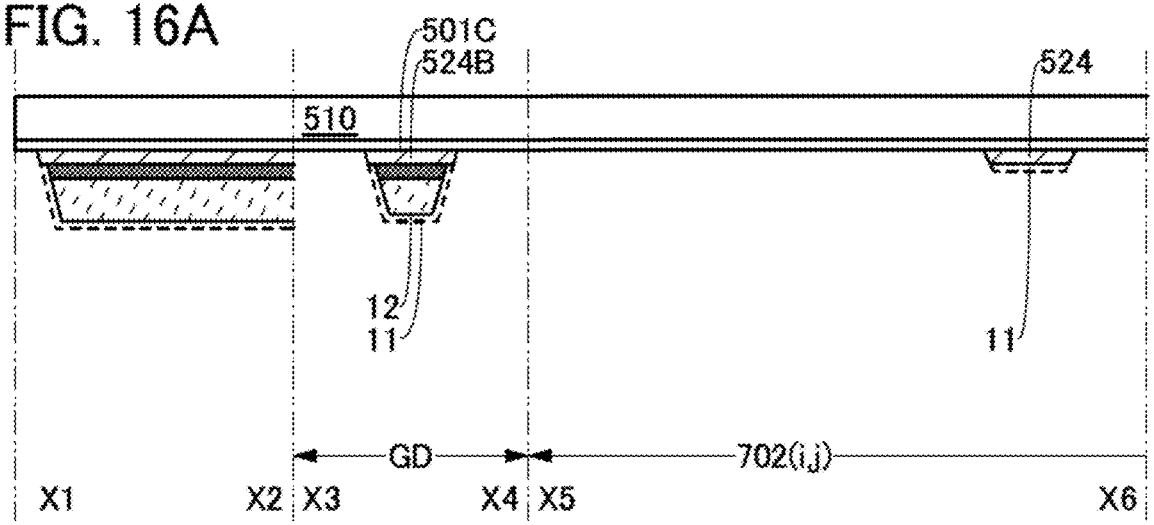
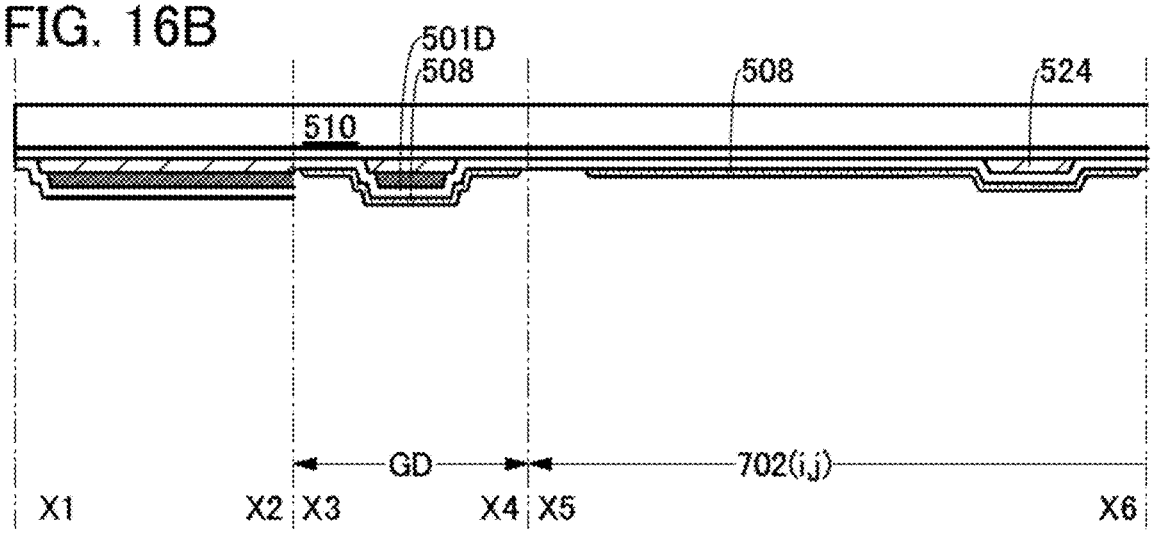
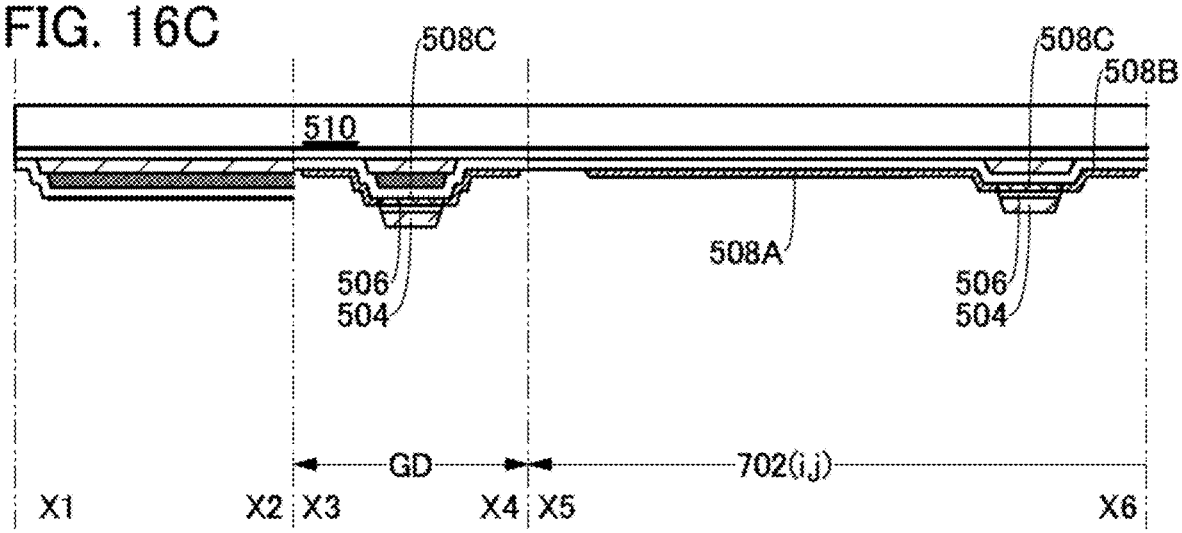

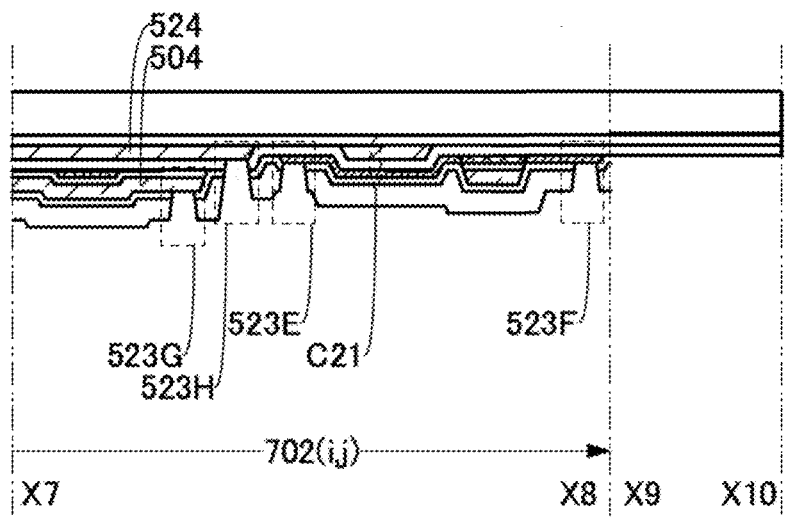
FIG. 19A
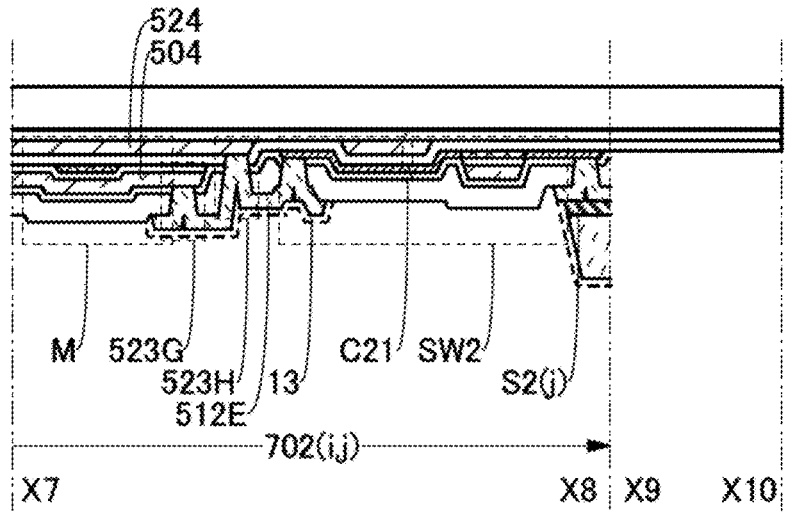
FIG. 19B
FIG. 19C
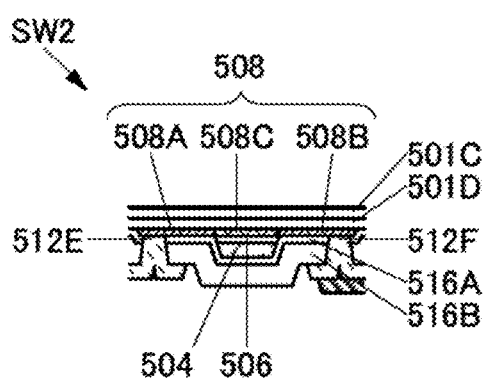

DISPLAY PANEL, DISPLAY DEVICE, INPUT/OUTPUT DEVICE, AND DATA PROCESSING DEVICE

TECHNICAL FIELD

One embodiment of the present invention relates to a display panel, a display device, an input/output device, or a data processing device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, and a memory device, and a method for driving any of them and a method for manufacturing any of them.

BACKGROUND ART

As a semiconductor device with high aperture ratio and low power consumption, a semiconductor device including a light-transmitting conductive layer which functions as a gate electrode, a gate insulating film formed over the light-transmitting conductive layer, a semiconductor layer formed over the light-transmitting conductive layer which functions as the gate electrode with the gate insulating film provided therebetween, and light-transmitting conductive layers which function as source and drain electrodes and are electrically connected to the semiconductor layer is known (Patent Document 1).

REFERENCE

Patent Document

[Patent Document 1] Japanese Published Patent Application No. 2009-302520

DISCLOSURE OF INVENTION

An object of one embodiment of the present invention is to provide a novel display panel that is highly convenient or reliable. Another object is to provide a novel display device that is highly convenient or reliable. Another object is to provide a novel input/output device that is highly convenient or reliable. Another object is to provide a novel data processing device that is highly convenient or reliable. Another object is to provide a novel display panel, a novel display device, a novel input/output device, a novel data processing device, or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a display panel including a pixel. The pixel includes a functional layer and a display element.

The functional layer includes a light-transmitting region transmitting visible light and a pixel circuit. The pixel circuit includes a conductive film and a transistor.

The conductive film includes a region transmitting visible light in the light-transmitting region. The transistor includes a semiconductor film, a first electrode, a second electrode, and a gate electrode.

The semiconductor film includes a first region, a second region, and a region overlapping with the gate electrode between the first region and the second region. The first region includes a region electrically connected to the first electrode and a region transmitting visible light in the light-transmitting region. The second region includes a region electrically connected to the second electrode and a region transmitting visible light in the light-transmitting region.

The display element is electrically connected to the pixel circuit and has a function of emitting visible light through the light-transmitting region.

(2) Another embodiment of the present invention is the above display panel in which the band gap of the semiconductor film is greater than or equal to 2.5 eV and the conductive film includes a conductive oxide.

(3) Another embodiment of the present invention is the above display panel in which the pixel circuit includes a capacitor in the light-transmitting region and the capacitor includes the first region or the second region.

(4) Another embodiment of the present invention is the above display panel in which the light-transmitting region has a transmittance to red, green, or blue light of higher than or equal to 60%.

Thus, the pixel circuit of the display panel can be positioned closer to the user's side than the display element is. Alternatively, the aperture ratio of the pixel can be increased. Alternatively, the flexibility in the layout of the pixel can be increased. Alternatively, the density of current flowing through the display element can be decreased while keeping the brightness of display of the display element. Alternatively, the brightness of display can be increased while keeping the density of current flowing through the display element. Alternatively, the reliability of the light-emitting element can be increased. For example, an organic EL element can be used as the light-emitting element. Consequently, a novel display panel that is highly convenient or reliable can be provided.

(5) Another embodiment of the present invention is the display panel in which the functional layer includes a first insulating film and a second insulating film.

The first insulating film includes a region sandwiched between the pixel circuit and the display element, and a first opening portion.

The second insulating film includes a region sandwiched between the pixel circuit and the first insulating film, and a second opening portion. The second opening portion includes a region overlapping with the first opening portion and has an outer edge aligned with an outer edge of the first opening portion.

The display element is electrically connected to the pixel circuit through the first opening portion and the second opening portion.

Thus, the display element can be electrically connected to the pixel circuit reliably. Alternatively, with the use of the first insulating film as a mask, a second opening portion can be formed in the second insulating film. Alternatively, the number of photomasks, materials, and steps used when the display panel is fabricated can be reduced. Alternatively, manufacturing yield of the display panel can be increased and the cost can be decreased. Consequently, a novel display panel that is highly convenient or reliable can be provided.

(6) Another embodiment of the present invention is the above display panel including a display region.

The display region includes one group of pixels, another group of pixels, a scan line, and a signal line.

The one group of pixels include the pixel and are arranged in the row direction.

The another group of pixels include the pixel and are arranged in the column direction intersecting the row direction.

The scan line is electrically connected to the one group of pixels. The signal line is electrically connected to the another group of pixels. The scan line includes a metal film and the signal line includes a metal film.

(7) Another embodiment of the present invention is a display panel including a display region.

The display region includes a first group of pixels, a second group of pixels, a third group of pixels, a fourth group of pixels, a first scan line, a second scan line, a first signal line, and a second signal line.

The first group of pixels include a first pixel and are arranged in the row direction.

The second group of pixels include a second pixel and are arranged in the row direction.

The third group of pixels include the first pixel and are arranged in the column direction intersecting the row direction.

The fourth group of pixels include the second pixel and are arranged in the column direction.

The first signal line is electrically connected to the third group of pixels and the second signal line is electrically connected to the fourth group of pixels.

The first scan line is electrically connected to the first group of pixels and the second scan line is electrically connected to the second group of pixels.

Thus, image data can be supplied to a plurality of pixels. Consequently, a novel display panel that is highly convenient or reliable can be provided.

(8) Another embodiment of the present invention is the above display panel in which the fourth group of pixels and the third group of pixels are alternately arranged.

(9) Another embodiment of the present invention is the above display panel in which the second pixel is adjacent to the first pixel in the column direction.

Thus, the third group of pixels and the fourth group of pixels can be arranged to be mixed. Alternatively, a difference between display on the third group of pixels and display on the fourth group of pixels can be hardly distinguished. Consequently, a novel display panel that is highly convenient or reliable can be provided.

(10) Another embodiment of the present invention is the above display panel in which the first scan line is supplied with a selection signal and the second scan line is supplied with the selection signal in a period during which the first scan line is supplied with the selection signal.

(11) Another embodiment of the present invention is the above display panel in which the second scan line is electrically connected to the first scan line.

Thus, while one scan line is supplied with a selection signal, the other scan line can be supplied with the selection signal. Alternatively, while one scan line is supplied with a selection signal, image data which is different from image data supplied to pixels electrically connected to one scan line can be supplied to pixels electrically connected to the other scan line. Consequently, a novel display panel that is highly convenient or reliable can be provided.

(12) Another embodiment of the present invention is the above display panel including a first protective circuit, a second protective circuit, and a common wiring.

The first protective circuit is electrically connected to the first scan line and the common wiring.

The second protective circuit is electrically connected to the first signal line and the common wiring.

Thus, the pixel can be protected from noise, surge, electrostatic discharge, and the like. Consequently, a display panel that is highly convenient or reliable can be provided.

(13) Another embodiment of the present invention is the above display panel including a first scan line driver circuit and a first signal line driver circuit.

The first scan line driver circuit is electrically connected to the first scan line and the second scan line.

The first signal line driver circuit is electrically connected to the first signal line and the second signal line.

Thus, in a period during which the first scan line is supplied with a selection signal, the second scan line can be supplied with the selection signal. Alternatively, in a period during which the first signal line is supplied with image data, image data which is different from image data supplied to the first signal line can be supplied to the second signal line. Consequently, a display panel that is highly convenient or reliable can be provided.

(14) Another embodiment of the present invention is the above display panel including the first scan line driver circuit, a second scan line driver circuit, the first signal line driver circuit, and a second signal line driver circuit.

The first scan line driver circuit is electrically connected to one end of the first scan line and one end of the second scan line.

The second scan line driver circuit is electrically connected to the other end of the first scan line and the other end of the second scan line and supplies a selection signal in synchronization with the first scan line driver circuit.

The first signal line driver circuit is electrically connected to one end of the first signal line and one end of the second signal line.

The second signal line driver circuit is electrically connected to the other end of the first signal line and the other end of the second signal line and supplies data in synchronization with the first signal line driver circuit.

Thus, for example, deterioration of a selection signal due to wiring resistance or capacitive coupling can be suppressed. Alternatively, a selection signal whose deterioration is suppressed can be supplied to a plurality of pixels. For example, deterioration of image data due to wiring resistance or capacitive coupling can be suppressed. Alternatively, image data whose deterioration is suppressed can be supplied to a plurality of pixels. Consequently a display panel that is highly convenient or reliable can be provided.

(15) Another embodiment of the present invention is the above display panel in which the display region includes a plurality of pixels in a matrix, 7600 or more pixels in the row direction, and 4300 or more pixels in the column direction.

Thus, for example, deterioration of a selection signal supplied to the pixel circuit can be suppressed. Alternatively, deterioration of an image signal supplied to the pixel circuit can be suppressed. Alternatively, a drop in power supply potential supplied to the pixel circuit can be suppressed. Consequently, a novel display panel that is highly convenient or reliable can be provided.

(16) Another embodiment of the present invention is the above display panel in which the display region includes a first pixel, a second pixel, and a third pixel.

The first pixel emits light of color having a chromaticity x of greater than 0.680 and less than or equal to 0.720 and a chromaticity y of greater than or equal to 0.260 and less than or equal to 0.320 on the CIE 1931 chromaticity coordinates.

The second pixel emits light of color having a chromaticity x of greater than or equal to 0.130 and less than or equal to 0.250 and a chromaticity y of greater than 0.710 and less than or equal to 0.810 on the CIE 1931 chromaticity coordinates.

The third pixel emits light of color having a chromaticity x of greater than or equal to 0.120 and less than or equal to 0.170 and a chromaticity y of greater than or equal to 0.020 and less than 0.060 on the CIE 1931 chromaticity coordinates.

(17) Another embodiment of the present invention is the above display panel in which the display element has a function of emitting white light toward the light-transmitting region and the first insulating film contains a coloring material in the light-transmitting region.

(18) Another embodiment of the present invention is the above display panel in which the display region includes 600 or more pixels per inch and the pixel has an aperture ratio of higher than or equal to 20%.

Thus, high-definition pixels which emit light with different hues can be arranged to be adjacent to each other. Alternatively, the difficulty of arranging the layer containing the light-emitting material formed to emit light with different hues in the pixels which are adjacent to each other with high density in the manufacturing process can be avoided. Alternatively, the yield of the manufacturing process of the display panel can be increased. Consequently, a novel display device that is highly convenient or reliable can be provided.

(19) Another embodiment of the present invention is the above display panel including a first base, a second base, a bonding layer, and a dry agent.

The second base includes a region overlapping with the first base, the functional layer includes a region sandwiched between the first base and the second base, the bonding layer has a function of bonding the first base with the second base, and the dry agent is positioned in a region surrounded by the first base, the second base, and the bonding layer.

Thus, diffusion of impurities such as moisture into the display element can be inhibited. Consequently, a novel display device that is highly convenient or reliable can be provided.

(20) Another embodiment of the present invention is a display device including the above display panel and a control portion.

The control portion has functions of receiving image data and control data, generating data on the basis of the image data, and supplying the data. The data has a gray scale of greater than or equal to 12 bit.

The display panel is supplied with the data and the scan line is supplied with a selection signal at a frequency of greater than or equal to 120 Hz. The display element has a function of performing display on the basis of the data.

With such a structure, image data can be displayed using the display element. Consequently, a novel display device that is highly convenient or reliable can be provided.

(21) Another embodiment of the present invention is an input/output device including an input portion and a display portion. The display portion includes the above display panel.

The input portion includes a sensing region and senses an object approaching the sensing region. The sensing region includes a region overlapping with the pixel.

With such a structure, an object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. Consequently, a novel input/output device that is highly convenient or reliable can be provided.

(22) Another embodiment of the present invention is a data processing device including at least one of a keyboard, a hardware button, a pointing device, a touch sensor, an illuminance sensor, an imaging device, an audio input device, a viewpoint input device, and an attitude determination device, and the above display panel.

Thus, the arithmetic device can generate the image data or the control data on the basis of the data which is supplied using a variety of input devices. Consequently, a novel data processing device that is highly convenient or reliable can be provided.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually the names of the source and the drain interchange with each other depending on the relation of the potentials.

Note that in this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor so that current, voltage, or a potential can be supplied or transmitted.

In this specification, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Furthermore, in this specification, one of a first electrode and a second electrode of a transistor refers to a source electrode and the other refers to a drain electrode.

According to one embodiment of the present invention, a novel display panel that is highly convenient or reliable is provided. Furthermore, a novel display device that is highly convenient or reliable is provided. Furthermore, a novel input/output device that is highly convenient or reliable can be provided. Furthermore, a novel data processing device that is highly convenient or reliable is provided. Furthermore, a novel display panel, a novel display device, a novel input/output device, a novel data processing device, or a novel semiconductor device is provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIG. 9A is a block diagram illustrating a structure of a display panel of one embodiment and FIGS. 9B-1, 9B-2, and 9B-3 are external views of display devices;

FIGS. 16A to 16C are cross-sectional views illustrating a method for manufacturing a display panel of one embodiment;

FIGS. 19A to 19C are cross-sectional views illustrating a method for manufacturing a display panel of one embodiment;

FIGS. 40A, 40B, 40C-1, and 40C-2 illustrate structures of display elements that can be used for a display panel of one embodiment.

BEST MODE FOR CARRYING OUT THE INVENTION

Figure 1A:
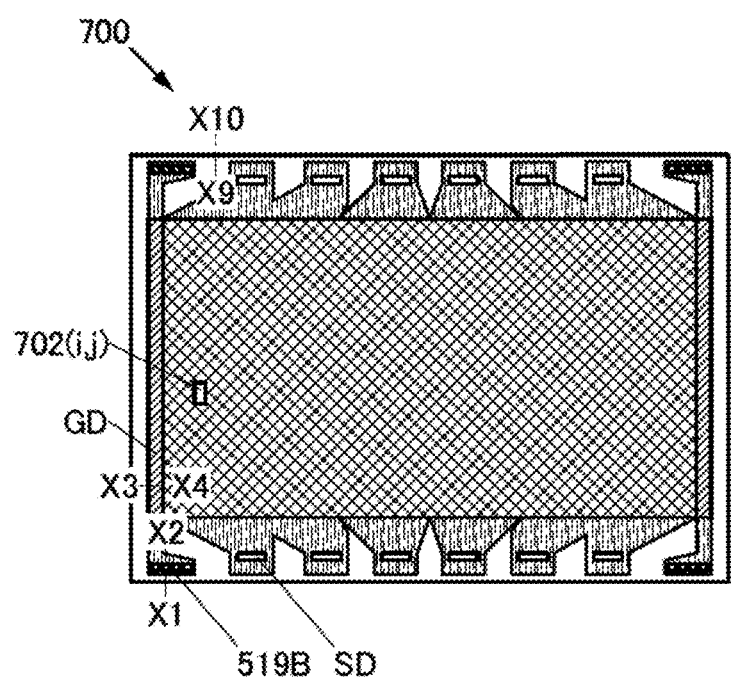
FIGS. 1A to 1C are top views and a schematic diagram illustrating a structure of a display panel of one embodiment.

One embodiment of the present invention is a display panel including a display region. The display region includes a first group of pixels, a second group of pixels, a third group of pixels, a fourth group of pixels, a first scan line, a second scan line, a first signal line, and a second signal line. The first group of pixels include a first pixel and are arranged in the row direction. The second group of pixels include a second pixel and are arranged in the row direction. The third group of pixels include the first pixel and are arranged in the column direction intersecting the row direction. The fourth group of pixels include the second pixel and are arranged in the column direction. The first signal line is electrically connected to the third group of pixels and the second signal line is electrically connected to the fourth group of pixels. The first scan line is electrically connected to the first group of pixels and the second scan line is electrically connected to the second group of pixels.

Thus, image data can be supplied to a plurality of pixels. Consequently, a novel display panel that is highly convenient or reliable can be provided.

Embodiments will be described in detail with reference to the drawings. Note that the present invention is not limited to the following description, and it is easily understood by those skilled in the art that various changes and modifications can be made without departing from the spirit and scope of the present invention. Thus, the present invention should not be construed as being limited to the description in the following embodiments and example. Note that in structures of the invention described below, the same portions or portions having similar functions are denoted by the same reference numerals in different drawings, and a description thereof is not repeated.

Embodiment 1

In this embodiment, a structure of a display panel of one embodiment of the present invention will be described with reference to FIGS. 1A to 1C, FIGS. 2A to 2C, FIGS. 3A and 3B, FIG. 4, FIG. 5, FIG. 6, and FIGS. 7A and 7B.

Figure 1B:
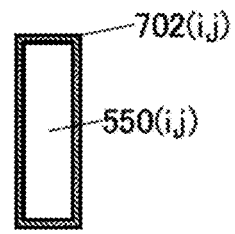
Figure 1C:
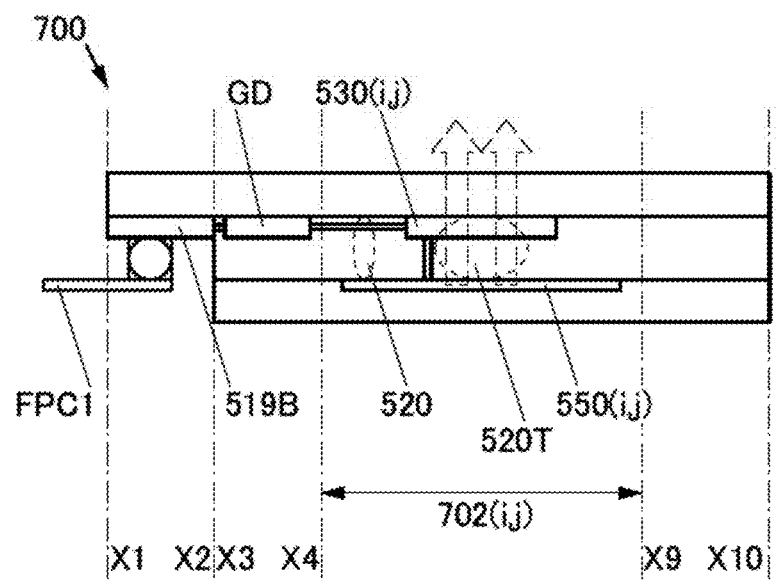

FIGS. 1A to 1C illustrate the structure of the display panel of one embodiment of the present invention. FIG. 1A is a top view of the display panel. FIG. 1B is a top view illustrating part of a pixel in the display panel in FIG. 1A. FIG. 1C is a schematic view illustrating a cross-sectional structure of the display panel in FIG. 1A.

FIGS. 2A to 2C and FIGS. 3A and 3B are cross-sectional views illustrating the structure of the display panel. FIG. 4 is a bottom view illustrating a structure of a pixel in the display panel in FIG. 1A.

Figure 2A:
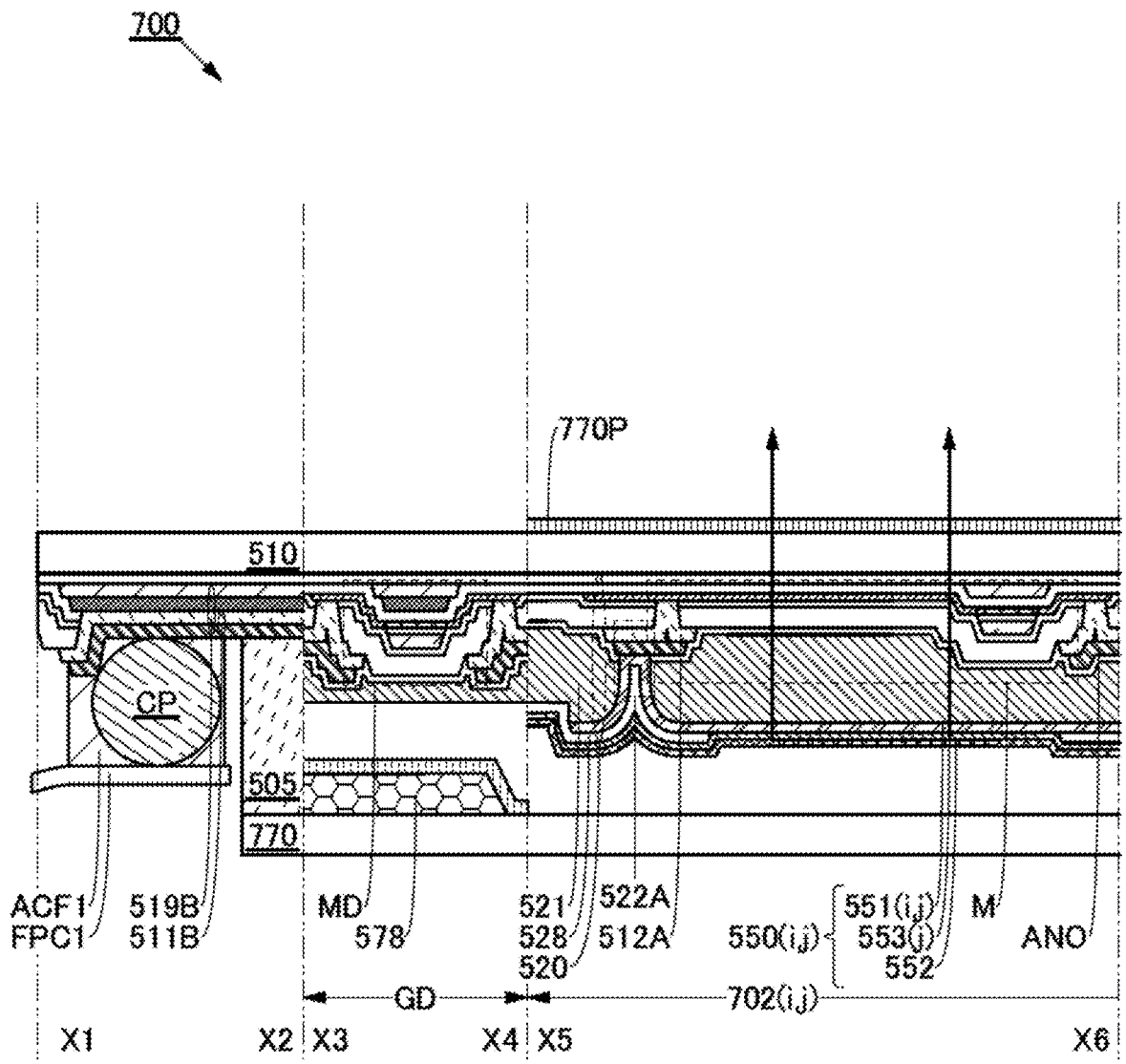
FIGS. 2A to 2C are cross-sectional views illustrating a structure of a display panel of one embodiment.
Figure 2B:
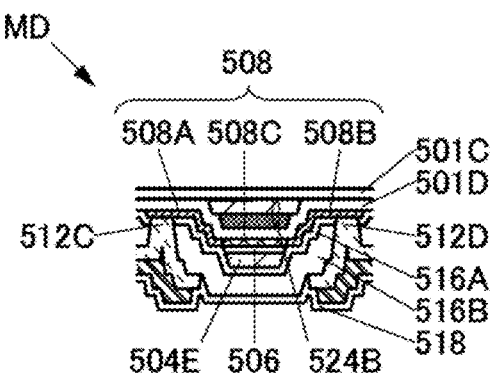
Figure 2C:
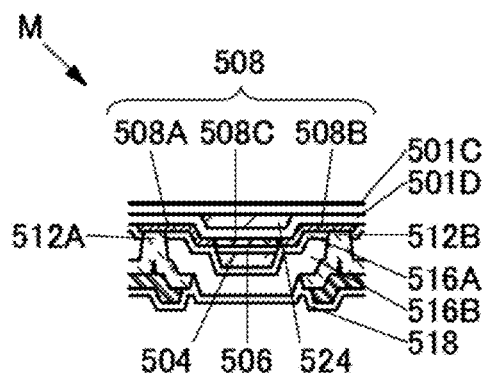

FIG. 2A is a cross-sectional view taken along line X1-X2 and line X3-X4 in FIG. 1A, and line X5-X6 in FIG. 4. FIGS. 2B and 2C each illustrate part of FIG. 2A.

Figure 3A:
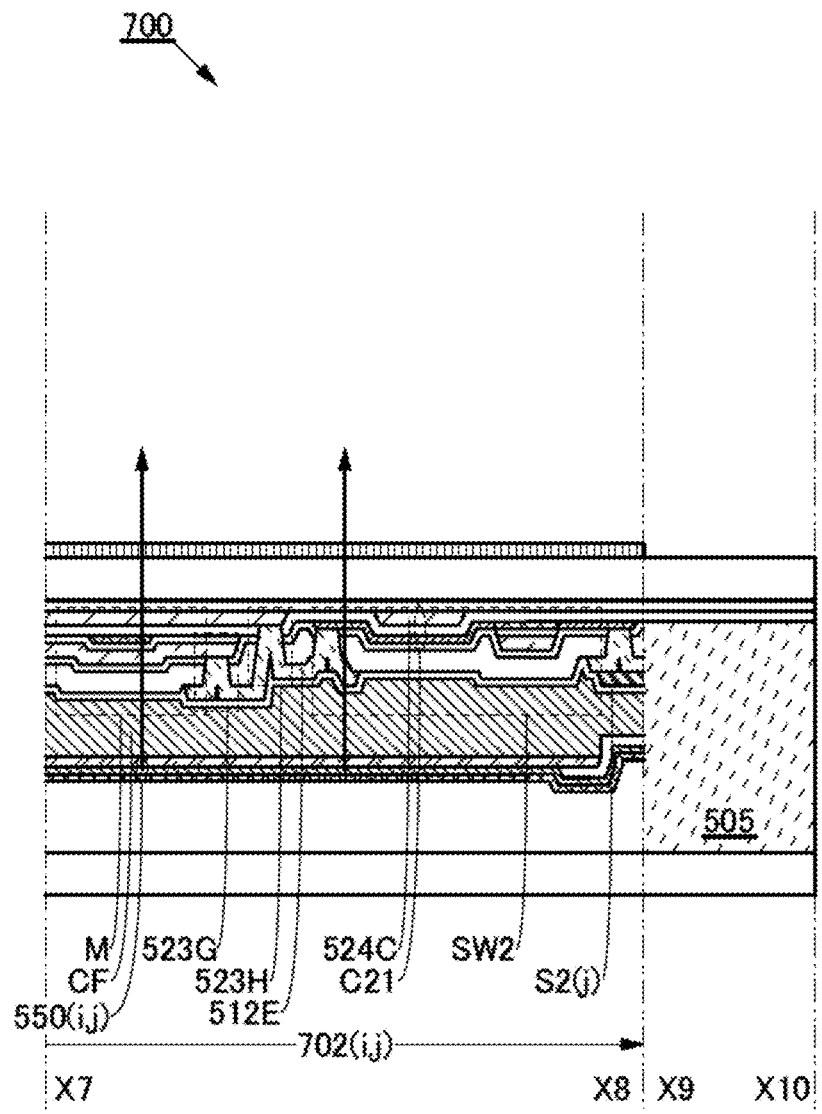
FIGS. 3A and 3B are cross-sectional views illustrating a structure of a display panel of one embodiment.
Figure 3B:
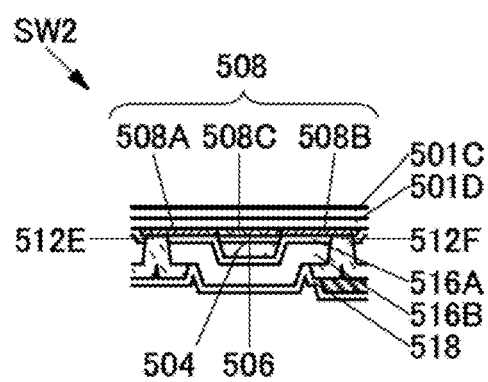
Figure 4:
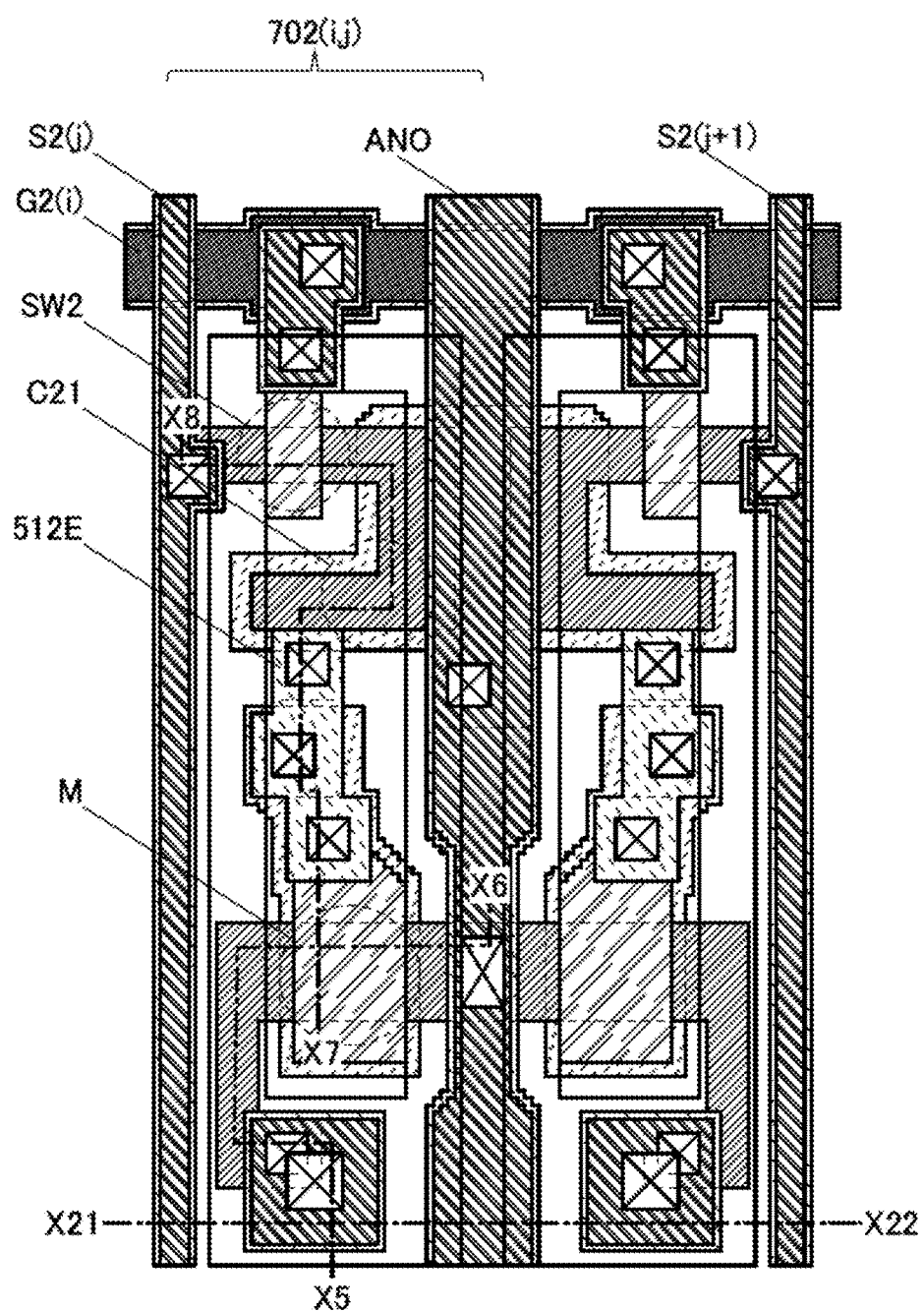
FIG. 4 is a bottom view illustrating a structure of a pixel in a display panel of one embodiment.
Figure 11A:
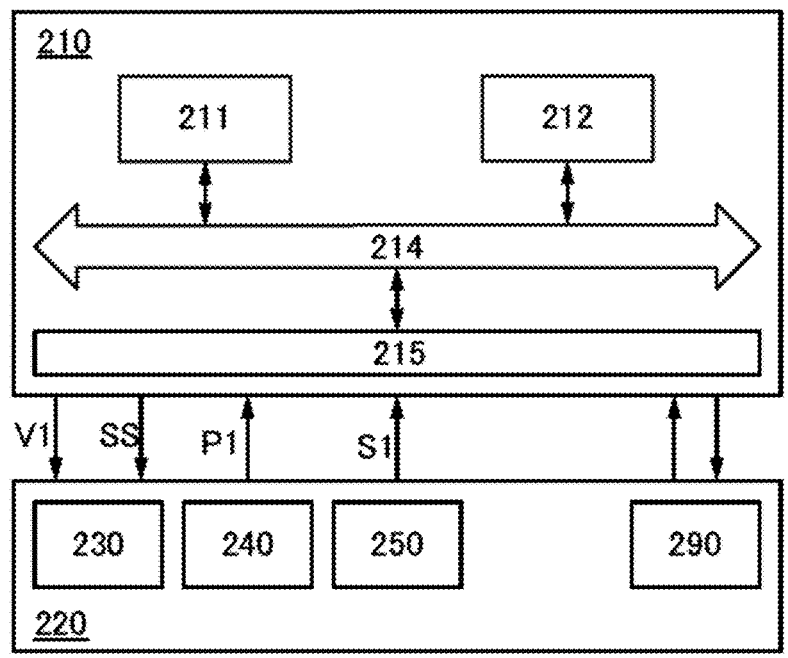
FIGS. 11A to 11C are a block diagram and projection views illustrating structures of a data processing device of one embodiment.

FIG. 3A is a cross-sectional view taken along line X7-X8 in FIG. 4, and line X9-X10 in FIG. 11A.

Figure 5:
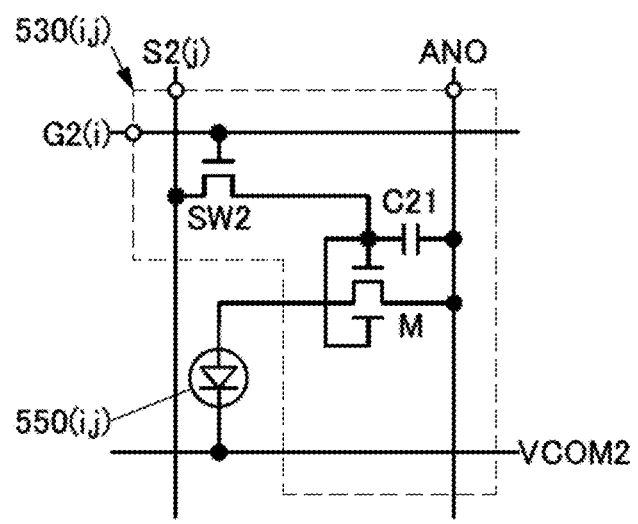
FIG. 5 is a circuit diagram illustrating a pixel circuit in a display panel of one embodiment.

FIG. 5 is a circuit diagram illustrating a configuration of a pixel circuit included in a display panel of one embodiment of the present invention.

Figure 6:
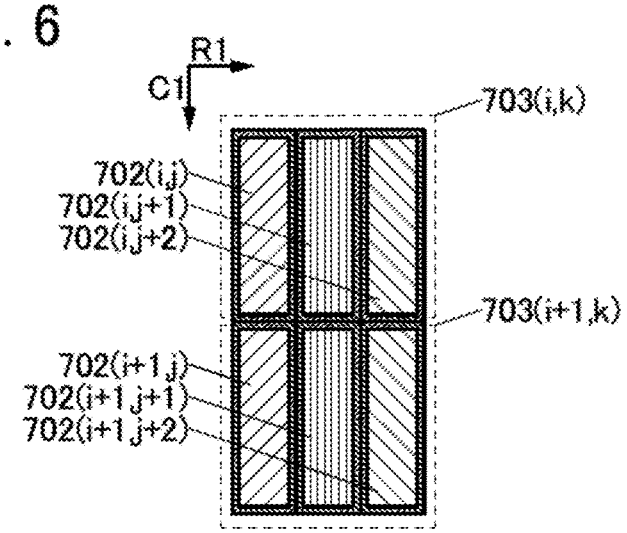
FIG. 6 is a top view illustrating pixels and subpixels in a display panel of one embodiment.

FIG. 6 is a top view illustrating a structure of pixels.

Figure 7A:
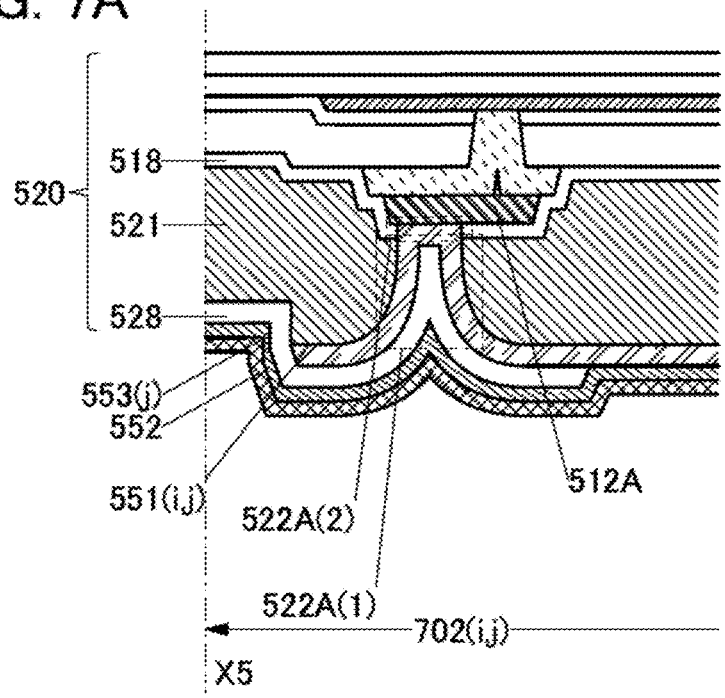
FIGS. 7A and 7B are cross-sectional views illustrating a structure of a pixel in a display panel of one embodiment.
Figure 7B:
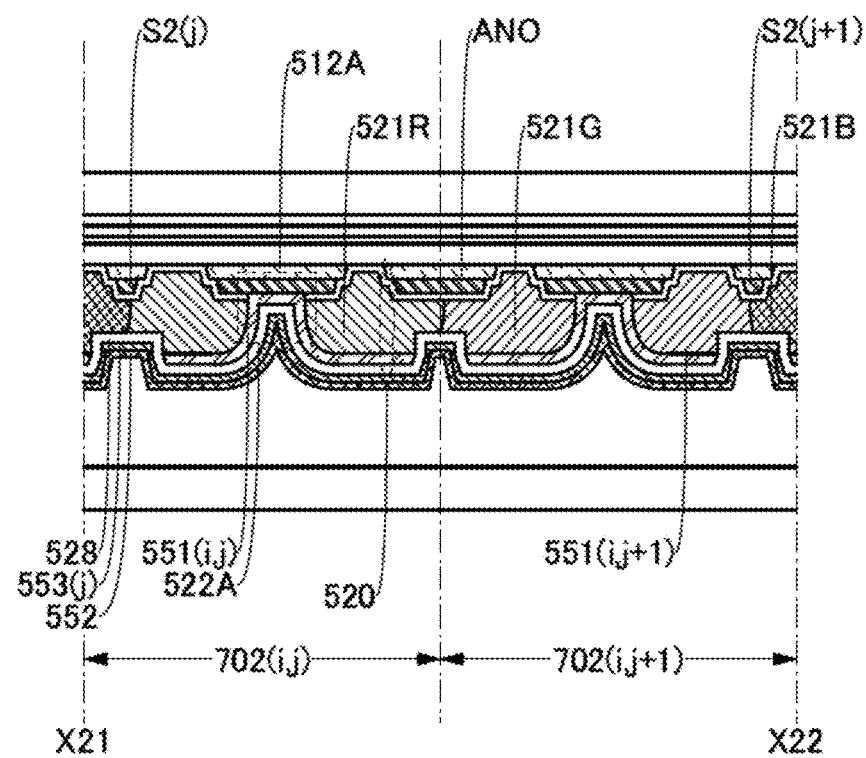

FIGS. 7A and 7B are cross-sectional views illustrating the structure of the display panel. FIG. 7A illustrates part of FIG. 2A, and FIG. 7B is a cross-sectional view taken along line X21-X22 in FIG. 4.

Note that in this specification, an integral variable of 1 or more may be used for reference numerals. For example, "(p)" where p is an integral variable of 1 or more may be used for part of a reference numeral that specifies any one of components (p components at a maximum). For another example, "(m,n)" where m and n are each an integral variable of 1 or more may be used for part of a reference numeral that specifies any one of components (m×n components at a maximum).

<Structure Example 1 of Display Panel>

Figure 8A:
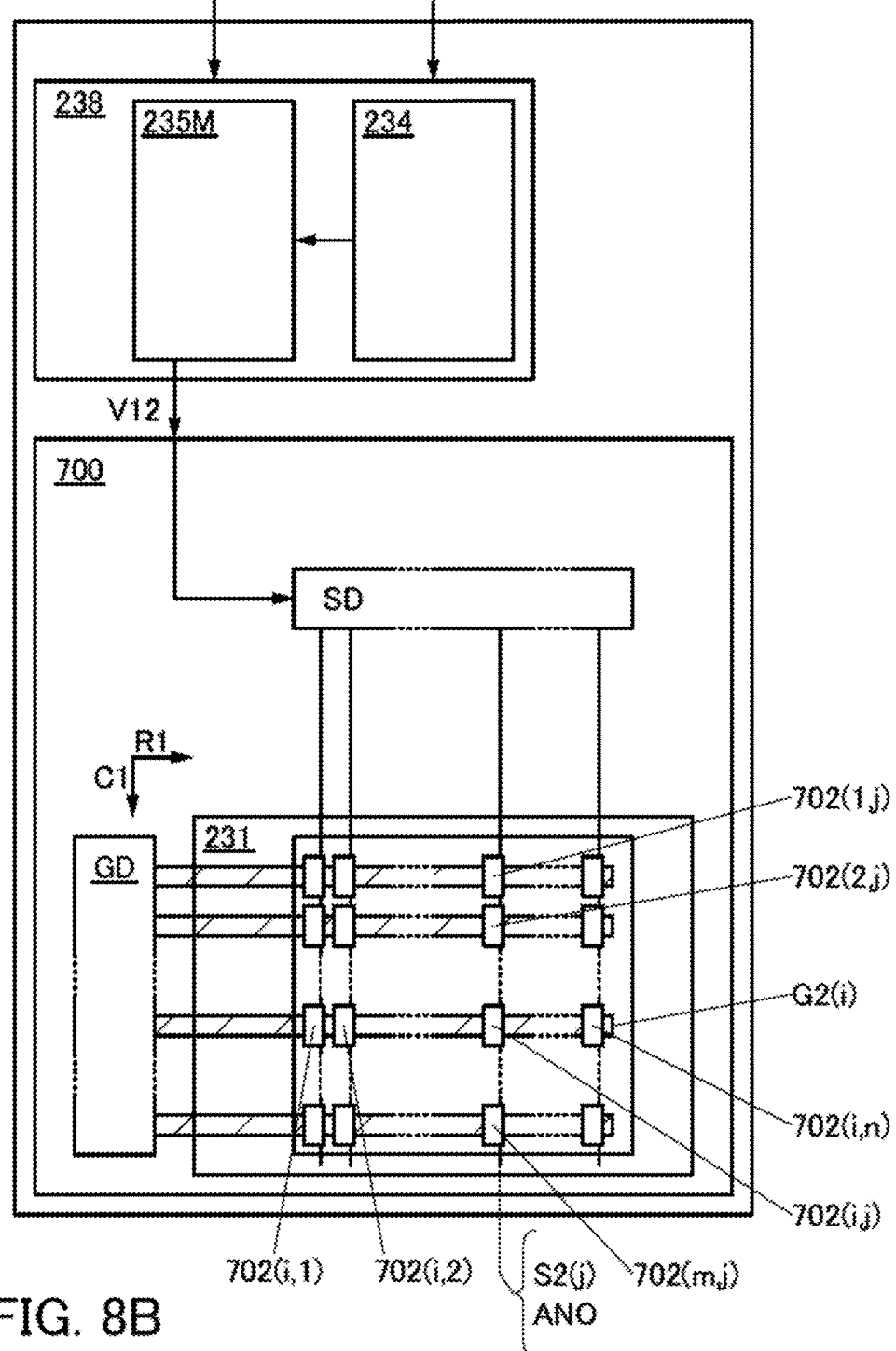
FIGS. 8A and 8B are block diagrams illustrating a structure of a display device of one embodiment.

A display panel 700 described in this embodiment includes a pixel 702(i,j) (see FIG. 1A or FIG. 8A).

<<Structure Example 1 of Pixel>>

The pixel 702(i,j) includes a functional layer 520 and a display element 550(i,j) (see FIG. 1C).

<<Structure Example 1 of Functional Layer>>

The functional layer 520 includes a light-transmitting region 520T which transmits visible light. In addition, the functional layer 520 includes a pixel circuit 530(i,j).

The pixel circuit 530(i,j) includes a conductive film and a transistor. The conductive film includes a region transmitting visible light in the light-transmitting region 520T. For example, a conductive film which transmits visible light can be used as a conductive film 512E, a conductive film 504, or a conductive film 524 (see FIG. 2C or FIG. 3A).

Note that the conductive film 524 or the conductive film 504 serves as an electrode of a transistor M. The conductive film 512E or the conductive film 504 serves as an electrode of a transistor which can be used as a switch SW2. Furthermore, the conductive film 512E, the conductive film 504, or the conductive film 524 serves as a wiring of the pixel circuit 530(i,j) (see FIG. 2C or FIG. 3A).

<<Structure Example of Transistor>>

The transistor M includes a semiconductor film 508, a first electrode, a second electrode, and a gate electrode (see FIG. 2C).

The semiconductor film 508 includes a first region 508A and a second region 508B. In addition, the semiconductor film 508 includes a region 508C overlapping with the conductive film 504, which serves as a gate electrode, between the first region 508A and the second region 508B.

The first region 508A includes a region electrically connected to a conductive film 512A serving as the first electrode and has a region which transmits visible light in the light-transmitting region 520T (see FIG. 1C and FIG. 2A).

The second region 508B has a region electrically connected to a conductive film 512B serving as the second electrode and has a region which transmits visible light in the light-transmitting region 520T.

<<Structure Example of Display Element>>

The display element 550(i,j) is electrically connected to the pixel circuit 530(i,j) (see FIG. 2A). For example, the display element 550(i,j) is electrically connected to the pixel circuit 530(i,j) in an opening portion 522A. Specifically, an electrode 551(i,j) of the display element 550(i,j) is electrically connected to the conductive film 512A of the transistor M.

The display element 550(i,j) has a function of emitting visible light through the light-transmitting region 520T (see FIG. 1C). Note that solid arrows in the drawing denote light emitted from the display element 550(i,j) (see FIG. 2A).

<<Configuration Example of Pixel Circuit>>

The band gap of the semiconductor film 508 is 2.5 eV or more. In addition, the conductive film contains a conductive oxide in the region transmitting visible light.

The pixel circuit 530(i,j) includes a capacitor C21 in the light-transmitting region 520T. The capacitor C21 includes the first region 508A or the second region 508B (see FIG. 3A or FIG. 4). For example, a light-transmitting conductive film can be used as a conductive film 524C. Specifically, a conductive oxide film can be used as the conductive film 524C.

<<Structure Example of Light-Transmitting Region>>

The light-transmitting region 520T has a transmittance to red, green, or blue light of 60% or more, preferably 65% or more, further preferably 70% or more.

Thus, the pixel circuit of the display panel can be positioned closer to the user's side than the display element is. Alternatively, the aperture ratio of the pixel can be increased. Alternatively, the flexibility in the layout of the pixel can be increased. Alternatively, the density of current flowing through the display element can be decreased while keeping the brightness of display of the display element. Alternatively, the brightness of display can be increased while keeping the density of current flowing through the display element. Alternatively, the reliability of the light-emitting element can be increased. For example, an organic EL element can be used as the light-emitting element. Consequently, a novel display panel that is highly convenient or reliable can be provided.

<<Structure Example 2 of Functional Layer>>

The functional layer 520 includes a first insulating film 521 and a second insulating film 518 (see FIGS. 2A and 2C).

The first insulating film 521 has a region sandwiched between the pixel circuit 530($i,j$) and the display element 550($i,j$) and an opening portion 522A(1) (see FIG. 7A).

The second insulating film 518 has a region sandwiched between the pixel circuit 530($i,j$) and the first insulating film 521 and an opening portion 522A(2).

The opening portion 522A(2) has a region overlapping with the opening portion 522A(1) and has an outer edge aligned with that of the opening portion 522A(1).

The display element 550($i,j$) is electrically connected to the pixel circuit 530($i,j$) through the opening portion 522A(1) and the opening portion 522A(2).

Thus, the display element can be electrically connected to the pixel circuit reliably. Alternatively, with the use of the first insulating film as a mask, a second opening portion can be formed in the second insulating film. Alternatively, the number of photomasks, materials, and steps used when the display panel is fabricated can be reduced. Alternatively, manufacturing yield of the display panel can be increased and the cost can be decreased. Consequently, a novel display panel that is highly convenient or reliable can be provided.

<Structure Example 2 of Display Panel>

The display panel 700 described in this embodiment includes a display region 231 (see FIG. 8A).

<<Structure Example 1 of Display Region>>

The display region 231 includes one group of pixels 702($i,1$) to 702($i,n$), another group of pixels 702($1,j$) to 702($m,j$), a scan line G2($i$), and a signal line S2($j$) (see FIG. 8A). Furthermore, the display region 231 includes a conductive film VCOM2 and a conductive film ANO. Note that i is an integer greater than or equal to 1 and less than or equal to m, j is an integer greater than or equal to 1 and less than or equal to n, and each of m and n is an integer greater than or equal to 1.

The one group of pixels 702($i,1$) to 702($i,n$) include the pixel 702($i,j$) and are provided in the row direction (the direction indicated by the arrow R1 in the drawing).

The another group of pixels 702($1,j$) to 702($m,j$) include the pixel 702($i,j$) and are provided in the column direction (the direction indicated by the arrow C1 in the drawing) that intersects the row direction.

The scan line G2($i$) is electrically connected to the one group of pixels 702($i,1$) to 702($i,n$) provided in the row direction.

The signal line S2($j$) is electrically connected to the another group of pixels 702($1,j$) to 702($m,j$) provided in the column direction.

The scan line G2($i$) and the signal line S2($j$) each include a metal film.

<<Structure Example 2 of Display Region>>

The display region 231 includes a plurality of pixels in a matrix. For example, the display region 231 includes 7600 or more pixels in the row direction and 4300 or more pixels in the column direction. For example, 7680 pixels are provided in the row direction and 4320 pixels are provided in the column direction.

Thus, for example, deterioration of a selection signal supplied to the pixel circuit can be suppressed. Alternatively, deterioration of an image signal supplied to the pixel circuit can be suppressed. Alternatively, a drop in power supply potential supplied to the pixel circuit can be suppressed. Consequently, a novel display panel that is highly convenient or reliable can be provided.

The frame frequency can be variable. Alternatively, for example, display can be performed at a frame frequency of higher than or equal to 1 Hz and lower than or equal to 120 Hz. Alternatively, display can be performed at a frame frequency of 120 Hz by a progressive method. Alternatively, extremely high-resolution display satisfying Recommendation ITU-R BT.2020-2, which is an international standard, can be performed. Alternatively, extremely high-resolution display can be performed.

<Structure Example 3 of Display Panel>

The display panel 700 described in this embodiment includes a plurality of pixels. The plurality of pixels have a function of representing colors with different hues. Alternatively, colors with hues that cannot be represented by each of the plurality of pixels can be represented by additive color mixing with the use of the plurality of pixels.

<<Structure Example 2 of Pixel>>

Note that when a plurality of pixels capable of representing colors with different hues are used for color mixture, each of the pixels can be referred to as a subpixel. In addition, a set of subpixels can be referred to as a pixel.

For example, the pixel 702($i,j$), the pixel 702($i,j+1$), or the pixel 702($i,j+2$) can be referred to as a subpixel, and the pixel 702($i,j$), a pixel 702($i,j+1$), and a pixel 702($i,j+2$) can be collectively referred to as a pixel 703($i,k$) (see FIG. 6).

Specifically, a subpixel that represents blue, a subpixel that represents green, and a subpixel that represents red can be collectively used as the pixel 703($i,k$). Alternatively, a subpixel that represents cyan, a subpixel that represents magenta, and a subpixel that represents yellow can be collectively used as the pixel 703($i,k$).

Alternatively, for example, the above set to which a subpixel that represents white is added can be used as the pixel.

<Structure Example 4 of Display Panel>

The display region 231 includes the pixel 702($i,j$), the pixel 702($i,j+1$), and the pixel 702($i,j+2$) (see FIG. 6).

The pixel 702($i,j$) emits light that has, on the CIE 1931 chromaticity coordinates, a chromaticity x of greater than 0.680 and less than or equal to 0.720 and a chromaticity y of greater than or equal to 0.260 and less than or equal to 0.320.

The pixel 702($i,j+1$) emits light that has, on the CIE 1931 chromaticity coordinates, a chromaticity x of greater than or equal to 0.130 and less than or equal to 0.250 and a chromaticity y of greater than 0.710 and less than or equal to 0.810.

The pixel 702($i,j+2$) emits light that has, on the CIE 1931 chromaticity coordinates, a chromaticity x of greater than or equal to 0.120 and less than or equal to 0.170 and a chromaticity y of greater than or equal to 0.020 and less than 0.060.

The pixel 702($i,j$), the pixel 702($i,j+1$), and the pixel 702($i,j+2$) are provided so that the area ratio of the color gamut of the pixels 702(i,j), 702(i,j+1), and 702(i,j+2) to the BT.2020 color gamut in the CIE chromaticity coordinates (x,y) can be higher than or equal to 80%, preferably higher than or equal to 90%, or the color gamut coverage can be higher than or equal to 75%, preferably higher than or equal to 85%.

Furthermore, for example, the display element 550(i,j) has a function of emitting white light toward the light-transmitting region 520T (see FIG. 1C and FIG. 2A). In addition, the first insulating film 521 contains a coloring material in the light-transmitting region 520T. Specifically, a stacked-layer material for emitting white light can be used for a layer 553(j) containing a light-emitting material and the layer 553(j) containing a light-emitting material can be used in the display element 550(i,j), a display element 550(i,j+1), and a display element 550(i,j+2). Thus, a display element which emits white light can be formed in one step.

<<Structure of Insulating Film 521>>

For example, a coloring material which has a region overlapping with the display element 550(i,j) and through which red light is obtained from white light emitted from the display element 550(i,j) can be used for the first insulating film 521. Specifically, an insulating film 521R containing a coloring material through which red light is obtained can be used for the subpixel 702(i,j) (see FIG. 7B). Thus, the subpixel 702(i,j) can represent red.

For example, a coloring material which has a region overlapping with the display element 550(i,j+1) and through which green light is obtained from white light emitted from the display element 550(i,j+1) can be used for the first insulating film 521. Specifically, an insulating film 521G containing a coloring material through which green light is obtained can be used for the subpixel 702(i,j+1). Thus, the subpixel 702(i,j+1) can represent green.

For example, a coloring material which has a region overlapping with the display element 550(i,j+2) and through which blue light is obtained from white light emitted from the display element 550(i,j+2) can be used for the first insulating film 521. Specifically an insulating film 521B containing a coloring material through which blue light is obtained can be used for the subpixel 702(i,j+2). Thus, the subpixel 702(i,j+2) can represent blue.

<<Structure Example 3 of Display Region>>

The display region 231 includes 600 or more pixels per inch. Furthermore, the aperture ratio of the pixel 702(i,j) is higher than or equal to 20%. For example, the display region 231 includes 600 or more pixels, preferably 664 or more pixels, per inch. Furthermore, the aperture ratio of the pixel 702(i,j) is higher than or equal to 20%, preferably higher than or equal to 25%.

Thus, high-definition pixels which emit light with different hues can be arranged to be adjacent to each other. Alternatively, the difficulty of arranging the layer containing the light-emitting material formed to emit light with different hues in the pixels which are adjacent to each other with high density in the manufacturing process can be avoided. Alternatively, the yield of the manufacturing process of the display panel can be increased. Consequently, a novel display device that is highly convenient or reliable can be provided.

<Structure Example 5 of Display Panel>

The display panel 700 includes a base 510, a base 770, a bonding layer 505, and a drying agent 578.

The base 770 has a region overlapping with the base 510, and the functional layer 520 has a region sandwiched between the base 510 and the base 770.

The bonding layer 505 has a function of bonding the base 510 to the base 770, and the dry agent 578 is provided in a region surrounded by the bases 510 and 770 and the bonding layer 505.

Thus, impurities such as moisture can be trapped with the use of the drying agent. The diffusion of the impurities such as moisture into the display element or the pixel circuit can be suppressed. Consequently, a novel display device that is highly convenient or reliable can be provided.

<Structure Example 6 of Display Panel>

The display panel 700 described in this embodiment can include a driver circuit GD or a driver circuit SD (see FIG. 1A and FIG. 8A).

<<Driver Circuit GD>>

The driver circuit GD is configured to supply a selection signal in accordance with the control data.

For example, the driver circuit GD is configured to supply a selection signal to one scan line at a frequency of 30 Hz or higher, preferably 60 Hz or higher, in accordance with the control data. Accordingly, moving images can be smoothly displayed.

For example, the driver circuit GD is configured to supply a selection signal to one scan line at a frequency of lower than 30 Hz, preferably lower than 1 Hz, further preferably less than once per minute, in accordance with the control data. Accordingly, a still image can be displayed while flickering is suppressed.

A display panel can include a plurality of driver circuits. For example, a display panel 700B includes a driver circuit GDA and a driver circuit GDB (see FIG. 9A).

For example, in the case where a plurality of driver circuits are provided, driver circuits GDA and GDB may supply selection signals at different frequencies. Specifically, the selection signal can be supplied at a higher frequency to one region on which moving images are displayed than to another region on which a still image is displayed. Accordingly, a still image can be displayed in the one region with reduced flickering, and moving images can be smoothly displayed in the another region.

<<Driver Circuit SD>>

The driver circuit SD includes a driver circuit SD2. The driver circuit SD2 has a function of supplying an image signal on the basis of data V12 (see FIG. 8A).

The driver circuit SD2 has a function of generating an image signal and a function of supplying the image signal to a pixel circuit electrically connected to a display element.

For example, any of a variety of sequential circuits, such as a shift register, can be used as the driver circuit SD.

For example, an integrated circuit formed on a silicon substrate can be used as the driver circuit SD.

An integrated circuit can be mounted on a terminal by a chip on glass (COG) method or a chip on film (COF) method, for example. Specifically, an anisotropic conductive film can be used to mount an integrated circuit on the terminal.

<Structure Example 7 of Display Panel>

The display panel 700 described in this embodiment includes a terminal 519B, the base 510, the base 770, the bonding layer 505, a functional film 770P, and the like (see FIG. 2A or FIG. 3A).

<<Terminal 519B>>

The terminal 519B includes a conductive film 511B, for example. The terminal 519B can be electrically connected to the signal line S1(j), for example.

<<Base 510, Base 770>>

The base 770 includes a region overlapping with the base 570. The base 770 includes a region provided so that the functional layer 520 is positioned between the base 770 and the base 570.

The base 770 includes a region overlapping with the display element 550(i,j). For example, a material with low birefringence can be used for the region.

<<Bonding Layer 505>>

The bonding layer 505 includes a region positioned between the base 770 and the base 510, and has a function of bonding the base 770 to the base 510 together.

<<Functional Film 770P and the Like>>

The functional film 770P includes a region overlapping with the display element 550(i,j).

<Example of Components>

The display panel 700 includes the base 510, the base 770, or the bonding layer 505.

The display panel 700 further includes the functional layer 520, an insulating film 501C, an insulating film 501D, an insulating film 506, an insulating film 516, the insulating film 518, the insulating film 521, or an insulating film 528.

The display panel 700 includes the signal line S2(j), the scan line G2(i), or the conductive film ANO.

The display panel 700 includes the terminal 519B or the conductive film 511B.

The display panel 700 includes the pixel circuit 530(i,j) or the transistor M.

In addition, the display panel 700 includes the display element 550(i,j), the electrode 551(i,j), the electrode 552, or the layer 553(j) containing a light-emitting material.

The display panel 700 includes the driver circuit GD or the driver circuit SD.

<<Base 510, Base 770>>

A light-transmitting material can be used for the base 510 or the base 770.

A material having a surface provided with an antireflective film with a thickness of 1 μm or less can be used. Specifically, a stacked-layer film including three or more, preferably five or more, further preferably 15 or more dielectrics can be used for the base 510 or 770. This allows reflectivity to be as low as 0.5% or less, preferably 0.08% or less.

For example, a material having heat resistance high enough to withstand heat treatment in the manufacturing process can be used for the base 510 or 770. For example, a material with a thickness greater than or equal to 0.1 mm and less than or equal to 0.7 mm can be used. Specifically, a material polished to a thickness of approximately 0.1 mm can be used. As a result, the base 510 or 770 can be light-weight.

For example, a large-sized glass substrate having any of the following sizes can be used as the base 510 or 770: the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), and the 11th generation (3000 mm×3320 mm). Thus, a large-sized display device can be manufactured.

Figure 34A:
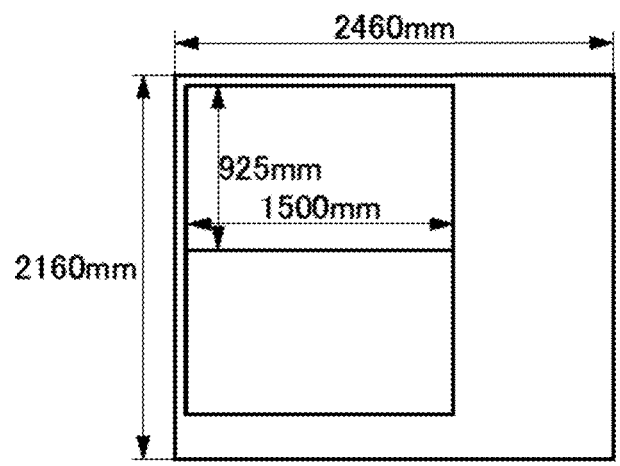
FIGS. 34A and 34B are schematic diagrams of glass substrates which can be used for a display panel of one embodiment.
Figure 34B:
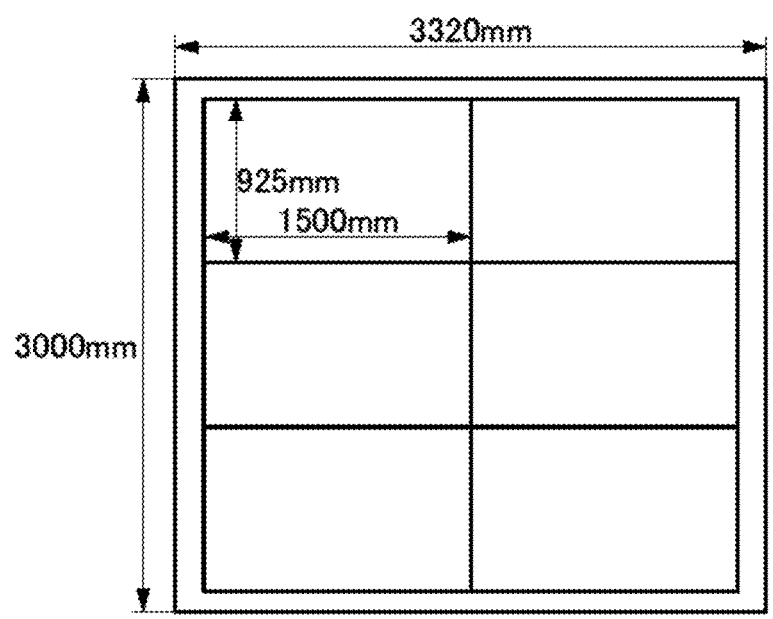

The 8th-generation (2200 mm×2400 mm) glass substrate can be cut into two substrates each having a half size of the 6th generation (1500 mm×1850 mm) (see FIG. 34A). In contrast, the 11th-generation (3000 mm×3320 mm) glass substrate can be cut into six substrates each having a half size of the 6th generation (1500 mm×1850 mm) (see FIG. 34B). Therefore, in the case where the size of the substrate which can be transferred to a vapor deposition apparatus is a half size of the 6th generation (1500 mm×1850 mm), waste of the 11th-generation glass substrate is less than that of the 8th-generation glass substrate.

For the base 510 or 770, an organic material, an inorganic material, a composite material of an organic material and an inorganic material, or the like can be used.

For example, an inorganic material such as glass, ceramic, or metal can be used. Specifically, non-alkali glass, soda-lime glass, potash glass, crystal glass, aluminosilicate glass, tempered glass, chemically tempered glass, quartz, sapphire, or the like can be used for the base 510 or 770. Alternatively, aluminosilicate glass, tempered glass, chemically tempered glass, sapphire, or the like can be favorably used for the base 510 or 770 that is on the side closer to a user of the display panel. This can prevent breakage or damage of the display panel caused by the use.

Specifically, an inorganic oxide film, an inorganic nitride film, an inorganic oxynitride film, or the like can be used. For example, a silicon oxide film, a silicon nitride film, a silicon oxynitride film, or an aluminum oxide film can be used. Stainless steel, aluminum, or the like can be used for the base 510 or 770.

For example, a single-crystal semiconductor substrate or a polycrystalline semiconductor substrate made of silicon or silicon carbide, a compound semiconductor substrate made of silicon germanium or the like, or an SOI substrate can be used as the base 510 or 770. Thus, a semiconductor element can be formed over the base 510 or 770.

For example, an organic material such as a resin, a resin film, or plastic can be used for the base 510 or 770. Specifically, a resin film or resin plate of polyester, polyolefin, polyamide, polyimide, polycarbonate, an acrylic resin, or the like can be used. As a result, the base 510 or 770 can be light-weight. Alternatively, for example, the display device can be made less likely to suffer from damage by dropping or the like.

For example, a composite material formed by attaching a metal plate, a thin glass plate, or a film of an inorganic material to a resin film or the like can be used for the base 510 or 770. For example, a composite material formed by dispersing a fibrous or particulate metal, glass, an inorganic material, or the like into a resin film can be used. For example, a composite material formed by dispersing a fibrous or particulate resin, organic material, or the like into an inorganic material can be used.

Furthermore, a single-layer material or a stacked-layer material in which a plurality of layers are stacked can be used for the base 510 or 770. For example, a stacked-layer material in which a base, an insulating film that prevents diffusion of impurities contained in the base, and the like are stacked can be used. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used. Alternatively, a stacked-layer material in which a resin and a film for preventing diffusion of impurities that penetrate the resin, such as a silicon oxide film, a silicon nitride film, or a silicon oxynitride film, are stacked can be used.

Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base 510 or 770. For example, a resin film, a resin plate, a stacked-layer material, or the like containing any of these resins can be used.

Specifically, polyethylene terephthalate (PET), polyethylene naphthalate (PEN), polyethersulfone (PES), a cyclic olefin polymer (COP), a cyclic olefin copolymer (COC), or the like can be used for the base 510 or 770.

Alternatively, paper, wood, or the like can be used for the base 510 or 770.

For example, a flexible material can be used for the base 510 or 770.

For example, a transistor, a capacitor, or the like can be directly formed over the substrate. Alternatively, a method in which a transistor, a capacitor, or the like is formed over a substrate for use in manufacturing processes which can withstand heat applied in the manufacturing process and is transferred to the base 510 or 770 can be employed. Thus, a transistor, a capacitor, or the like can be formed over a flexible substrate, for example.

<<Insulating Film 521>>

For example, an insulating inorganic material, an insulating organic material, or an insulating composite material containing an inorganic material and an organic material can be used for the insulating film 521.

Specifically, an inorganic oxide film, an inorganic nitride film, an inorganic oxynitride film, or the like, or a material obtained by stacking any of these films can be used for the insulating film 521.

For example, a film including any of a silicon oxide film, a silicon nitride film, a silicon oxynitride film, an aluminum oxide film, and the like, or a film including a stack of any of these films can be used as the insulating film 521. Note that the silicon nitride film is a dense film and has an excellent function of suppressing diffusion of impurities.

For example, polyester, polyolefin, polyamide, polyimide, polycarbonate, polysiloxane, an acrylic resin, or the like, or a layered or composite material including resins selected from these, or the like can be used for the insulating film 521. Alternatively, a photosensitive material may be used. Thus, with the insulating film 521, steps due to various components overlapping with the insulating film 521 can be reduced, for example.

Note that polyimide is excellent in the following properties compared with other organic materials: thermal stability, an insulating property, toughness, a low dielectric constant, a low coefficient of thermal expansion, and high chemical resistance, for example. Accordingly, in particular, polyimide can be suitably used for the insulating film 521 or the like.

For example, a film formed using a photosensitive material can be used as the insulating film 521. Specifically, a film formed using photosensitive polyimide, photosensitive acrylic, or the like can be used as the insulating film 521.

For example, a light-transmitting material can be used for the insulating film 521. Specifically, silicon nitride can be used for the insulating film 521.

For example, a material transmitting light of blue, green, or red can be used for the insulating film 521. Specifically, a resin containing a coloring material can be used for the insulating film 521. For example, an acrylic resin or the like containing a dye or a pigment can be used for the insulating film 521. Thus, the spectral width of light that is transmitted through the insulating film 521 can be narrowed. Alternatively, the insulating film 521 can be used as a color filter, for example. Alternatively, a backplane with a color filter on array structure can be provided.

<<Insulating Film 528>>

For example, a material that can be used for the insulating film 521 can be used for the insulating film 528. Specifically, a silicon oxide film, a film containing an acrylic resin, or a film containing polyimide can be used as the insulating film 528.

<<Insulating Film 518>>

For example, a material which can be used for the insulating film 521 can be used for the insulating film 518.

For example, a material that has a function of suppressing diffusion of oxygen, hydrogen, water, alkali metal, alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, impurity diffusion to the semiconductor film of the transistor can be suppressed. For example, diffusion of oxygen from the oxide semiconductor film used as the semiconductor film of the transistor to the outside of the transistor can be suppressed. Alternatively, diffusion of hydrogen, water, or the like from the outside of the transistor to the oxide semiconductor film can be suppressed.

For example, a material having a function of supplying hydrogen or nitrogen can be used for the insulating film 518. Thus, hydrogen or nitrogen can be supplied to a film in contact with the insulating film 518. For example, the insulating film 518 is formed in contact with the oxide semiconductor film to supply hydrogen or nitrogen to the oxide semiconductor film. Alternatively, the oxide semiconductor film can have conductivity. Alternatively, the oxide semiconductor film can be used as a gate electrode.

<<Insulating Film 516>>

For example, a material which can be used for the insulating film 521 can be used for the insulating film 516. Specifically, a stacked-layer film in which films formed by different manufacturing methods are stacked can be used.

For example, a stacked-layer film in which an insulating film 516A containing silicon oxide, silicon oxynitride, or the like having a thickness greater than or equal to 5 nm and less than or equal to 150 nm, preferably greater than or equal to 5 nm and less than or equal to 50 nm and an insulating film 516B containing silicon oxide, silicon oxynitride, or the like having a thickness greater than or equal to 30 nm and less than or equal to 500 nm, preferably greater than or equal to 50 nm and less than or equal to 400 nm are stacked can be used as the insulating film 516.

Specifically, a film in which the spin density of a signal that appears at g=2.001 due to a dangling bond of silicon, which can be observed by ESR measurement, is lower than or equal to $3 \times 10^{17}$ spins/cm$^3$ is preferably used as the insulating film 516A. Thus, for example, the oxide semiconductor film used as the semiconductor film of the transistor can be protected from damage due to formation of the insulating film. Alternatively, oxygen trapped by defects of silicon can be reduced. Alternatively, transmission or transfer of oxygen can be easily performed.

Furthermore, for example, a material in which the spin density of a signal that appears at g=2.001 due to a dangling bond of silicon, which can be observed by ESR measurement, is lower than $1.5 \times 10^{18}$ spins/cm$^3$, or lower than or equal to $1 \times 10^{18}$ spins/cm$^3$, is preferably used as the insulating film 516B.

<<Insulating Film 506>>

For example, a material which can be used for the insulating film 521 can be used for the insulating film 506. Specifically, a stacked-layer film in which a first film having a function of suppressing transmission of oxygen and a second film having a function of supplying oxygen are stacked can be used as the insulating film 506. Thus, for example, oxygen can be diffused to the oxide semiconductor film which is used as the semiconductor film of the transistor.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

For example, a film formed under an oxygen atmosphere can be used as the second film. Alternatively, a film to which oxygen is introduced after formation can be used as the second film. Specifically, oxygen can be introduced after formation by an ion implantation method, an ion doping method, a plasma immersion ion implantation method, plasma treatment, or the like.

For example, a stacked-layer film in which a 400-nm-thick film containing silicon and nitrogen and a 200-nm-thick film containing silicon, oxygen, and nitrogen are stacked can be used for the insulating film 506. Note that the film containing silicon and nitrogen includes a region provided so that the film containing silicon, oxygen, and nitrogen is positioned between the film containing silicon and nitrogen and the semiconductor film 508.

<<Insulating Film 501C, Insulating Film 501D>>

For example, a material which can be used for the insulating film 521 can be used for the insulating film 501C or the insulating film 501D. Specifically, silicon nitride, silicon nitride oxide, aluminum nitride, aluminum nitride oxide, silicon oxide, silicon oxynitride, or the like can be used. Thus, impurity diffusion to the semiconductor film of the transistor can be suppressed, for example.

<<Wiring, Terminal, and Conductive Film>>

A conductive material can be used for the wiring or the like. Specifically, the conductive material can be used for the signal line S2($j$), the scan line G2($i$), the conductive film ANO, the terminal 519B, the conductive film 511B, or the like.

For example, an inorganic conductive material, an organic conductive material, a metal, conductive ceramics, or the like can be used for the wiring or the like.

Specifically, a metal element or the like selected from aluminum, gold, platinum, silver, copper, chromium, tantalum, titanium, molybdenum, tungsten, nickel, iron, cobalt, palladium, and manganese can be used for the wiring or the like. Alternatively, an alloy including any of the above-described metal elements, or the like can be used for the wiring or the like. In particular, an alloy of copper and manganese is suitably used in microfabrication with the use of a wet etching method.

Specifically, any of the following structures can be used for the wiring or the like: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like.

Specifically, a conductive oxide, such as indium oxide, indium tin oxide, indium zinc oxide, zinc oxide, or zinc oxide to which gallium is added, can be used for the wiring or the like.

Specifically, a film containing graphene or graphite can be used for the wiring or the like.

For example, a film including graphene oxide is formed and is subjected to reduction, so that a film including graphene can be formed. As a reducing method, a method with application of heat, a method using a reducing agent, or the like can be employed.

A film containing a metal nanowire can be used for the wiring or the like, for example. Specifically, a nanowire containing silver can be used.

Specifically, a conductive high molecular compound can be used for the wiring or the like.

Note that the terminal 519B can be electrically connected to a flexible printed circuit FPC1 using a conductive material ACF1, for example. Specifically, the terminal 519B can be electrically connected to a flexible printed circuit FPC1 using a conductive material CP.

<<Functional Film 770P>>

For example, an anti-reflection film, a polarizing film, a retardation film, or the like can be used as the functional film 770P.

Specifically, a circularly polarizing film can be used as the functional film 770P.

Furthermore, an antistatic film preventing the attachment of a foreign substance, a water repellent film preventing stains, an antireflection film, an anti-glare (non-glare) film, a hard coat film suppressing a scratch in use, or the like can be used as the functional film 770P.

<<Display Element 550($i,j$)>>

A display element having a function of emitting light can be used as the display element 550($i,j$), for example. Specifically, an organic electroluminescent element, an inorganic electroluminescent element, a light-emitting diode, a quantum-dot LED (QDLED), or the like can be used as the display element 550($i,j$).

For example, a light-emitting organic compound can be used for the layer 553($j$) containing a light-emitting material.

Alternatively, a stacked-layer material for emitting white light can be used for the layer 553($j$) containing a light-emitting material. Specifically, a stacked-layer material in which a layer containing a light-emitting material including a fluorescent material that emits blue light and a layer containing a material that is other than a fluorescent material and that emits green light and/or red light are stacked can be used for the layer 553($j$) containing a light-emitting material. Alternatively, a stacked-layer material in which a layer containing a light-emitting material including a fluorescent material that emits blue light and a layer containing a material that is other than a fluorescent material and that emits yellow light are stacked can be used for the layer 553($j$) containing a light-emitting material.

For example, a belt-like layered material that extends in the column direction along the signal line S2($j$) can be used for the layer 553($j$) containing a light-emitting material.

For example, a high molecular compound (e.g., an oligomer, a dendrimer, or a polymer), a middle molecular compound (a compound with a molecular weight of 400 to 4000 between a low molecular compound and a high molecular compound), or the like can be used for the layer 553($j$) containing a light-emitting material.

For example, a light-emitting unit can be used for the layer 553($j$) containing a light-emitting material. The light-emitting unit includes a region where the electrons injected from one side are recombined with the holes injected from the other side. Note that the light-emitting material contained in the light-emitting unit releases the energy generated by recombination of electrons and holes as light.

For example, two light-emitting units and an intermediate layer can be used for the layer 553($j$) containing a light-emitting material. The intermediate layer includes a region sandwiched between the two light-emitting units. The intermediate layer includes a charge-generation region and has functions of supplying holes to the light-emitting unit provided on the cathode side and supplying electrons to the light-emitting unit provided on the anode side. In each of the light-emitting units, the electrons and the holes are recombined with each other. Note that the light-emitting material contained in each of the light-emitting units releases the energy generated by recombination of electrons and holes as light. Furthermore, a structure including a plurality of light-emitting units and an intermediate layer is referred to as a tandem structure in some cases.

<<Electrode 551(i,j), Electrode 552>>

For example, a material that can be used for the wiring or the like can be used for the electrode 551(i,j) or the electrode 552. Specifically, a material that transmits visible light can be used. For example, conductive oxide, indium-containing conductive oxide, indium oxide, indium tin oxide, indium zinc oxide, zinc oxide, zinc oxide to which gallium is added, or the like can be used. Alternatively, a metal film that is thin enough to transmit light can be used.

For example, a metal film that transmits part of light and reflects another part of light can be used as the electrode 551(i,j) or the electrode 552. Thus, the display element 550(i,j) can be provided with a microcavity structure. Alternatively, light of a predetermined wavelength can be extracted more efficiently than light of the other wavelengths. Alternatively, light with a narrow half width of an emission spectrum can be extracted. Alternatively, light of a bright color can be extracted.

<<Driver Circuit GD>>

Any of a variety of sequential circuits, such as a shift register, can be used as the driver circuit GD. For example, the transistor MD, a capacitor, and the like can be used in the driver circuit GD. Specifically, a transistor including a semiconductor film that can be formed in the same process as the semiconductor film of the transistor M or the transistor which can be used as the switch SW2 can be used.

For example, the transistor MD can have the same structure as the transistor M.

Alternatively, the transistor MD can have the structure different from that of the transistor M. Specifically, a metal film can be used as a conductive film 524B (see FIG. 2B). Thus, the electric resistance of the conductive film also serving as a wiring can be reduced. Alternatively, external light that travels to the region 508C can be blocked. Alternatively, abnormalities in the electrical characteristics of the transistor due to external light can be prevented. Alternatively, the reliability of the transistor can be improved.

For example, an integrated circuit formed on a silicon substrate can be used as the driver circuit GD. In addition, for example, the integrated circuit can be mounted on a terminal by a chip on glass (COG) method or a chip on film (COF) method. Specifically, an anisotropic conductive film can be used to mount an integrated circuit on the terminal.

<<Transistor>>

For example, semiconductor films formed at the same step can be used for transistors in the driver circuit and the pixel circuit.

As the transistor in the driver circuit or the pixel circuit, a bottom-gate transistor or a top-gate transistor can be used, for example.

A manufacturing line for a bottom-gate transistor including amorphous silicon as a semiconductor can be easily remodeled into a manufacturing line for a bottom-gate transistor including an oxide semiconductor as a semiconductor, for example. Furthermore, for example, a manufacturing line for a top-gate transistor including polysilicon as a semiconductor can be easily remodeled into a manufacturing line for a top-gate transistor including an oxide semiconductor as a semiconductor. In any reconstruction, a conventional manufacturing line can be effectively used.

For example, a transistor using an oxide semiconductor for a semiconductor film can be used. Specifically, an oxide semiconductor containing indium or an oxide semiconductor containing indium, gallium, and zinc can be used for the semiconductor film.

For example, a transistor having a lower leakage current in an off state than a transistor that uses amorphous silicon for a semiconductor film can be used. Specifically, a transistor that uses an oxide semiconductor in a semiconductor film can be used.

Thus, a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, further preferably less than once per minute while flickering is suppressed. Consequently, eyestrain on a user of the data processing device can be reduced, and power consumption for driving can be reduced.

For example, a transistor including a semiconductor film 508, a conductive film 504, a conductive film 512A, and a conductive film 512B can be used as the transistor M (see FIG. 2C). The insulating film 506 includes a region positioned between the semiconductor film 508 and the conductive film 504. For example, a 25-nm-thick film containing indium, gallium, and zinc can be used as the semiconductor film 508.

The conductive film 504 includes a region overlapping with the semiconductor film 508. The conductive film 504 functions as a gate electrode. The insulating film 506 functions as a gate insulating film.

The conductive films 512A and 512B are electrically connected to the semiconductor film 508. The conductive film 512A has one of a function as a source electrode and a function as a drain electrode, and the conductive film 512B has the other.

Furthermore, a transistor including the conductive film 524B can be used as the transistor included in the driver circuit or the pixel circuit (see FIG. 2B). The conductive film 524B includes a region so that the semiconductor film 508 is sandwiched between the conductive film 504 and the region. The insulating film 516 includes a region positioned between the conductive film 524B and the semiconductor film 508. For example, the conductive film 524B can be electrically connected to a wiring that supplies the same potential as that supplied to the conductive film 504.

A conductive film in which a 10-nm-thick film containing tantalum and nitrogen and a 300-nm-thick film containing copper are stacked can be used as a conductive film 504E of the transistor MD, for example. A film containing copper includes a region provided so that a film containing tantalum and nitrogen is positioned between the insulating film 506 and the region.

For example, a conductive film in which a light-transmitting film containing a conductive oxide, a 50-nm-thick film containing tungsten, a 400-nm-thick film containing aluminum, and a 100-nm-thick film containing titanium are stacked in this order can be used as a conductive film 512C or a conductive film 512D of the transistor MD. Note that the film containing tungsten includes a region in contact with the semiconductor film 508.

<Structure Example 8 of Display Panel>

A structure example of the display panel described in this embodiment is described with reference to FIGS. 35A to 35C and FIGS. 36A and 36B.

Figure 35A:
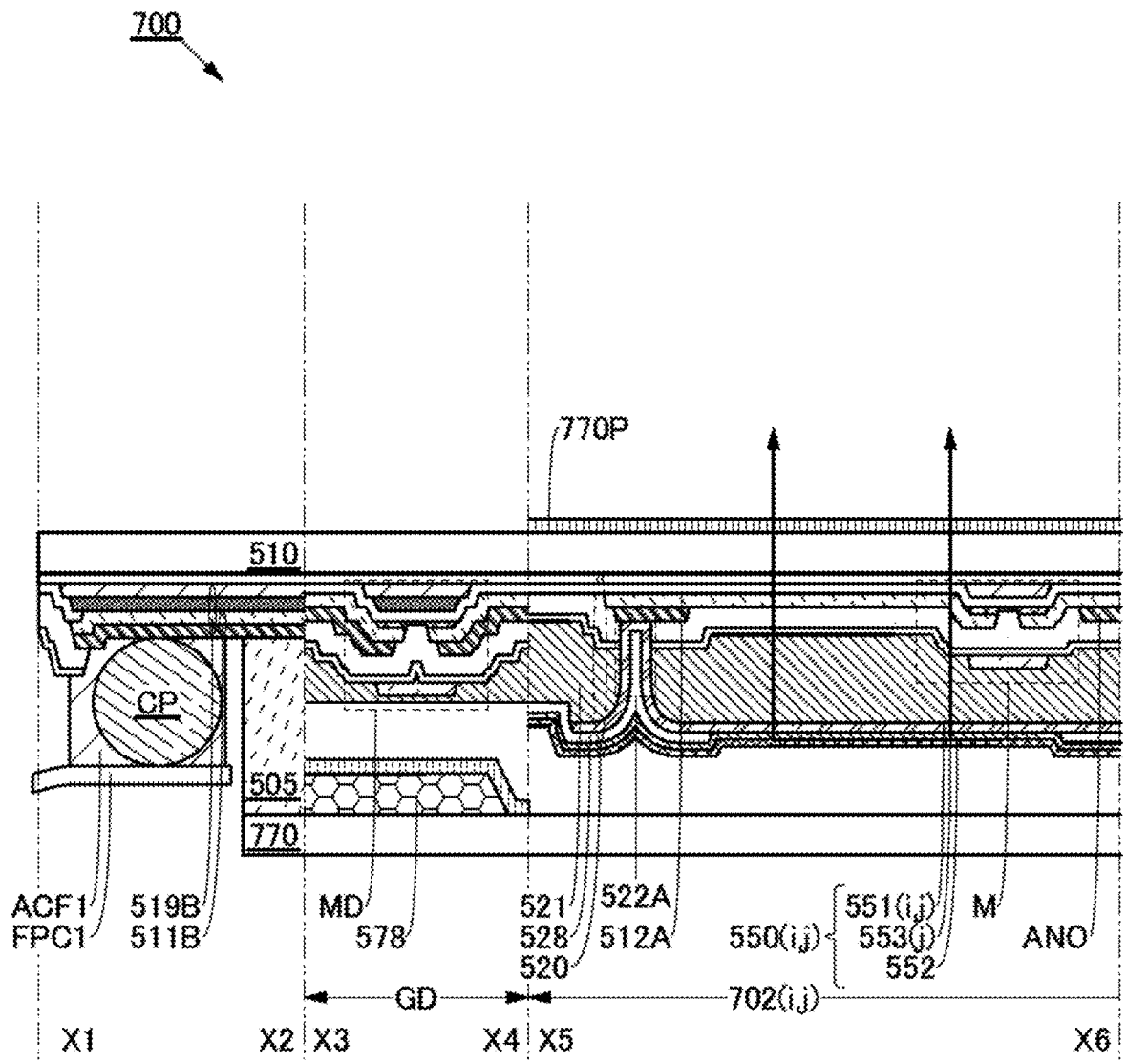
FIGS. 35A to 35C are cross-sectional views illustrating a structure of a display panel of one embodiment.
Figure 35B:
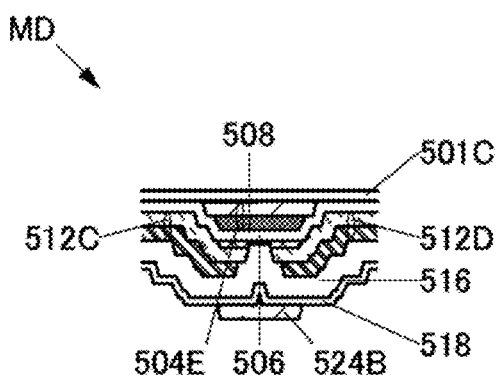
Figure 35C:
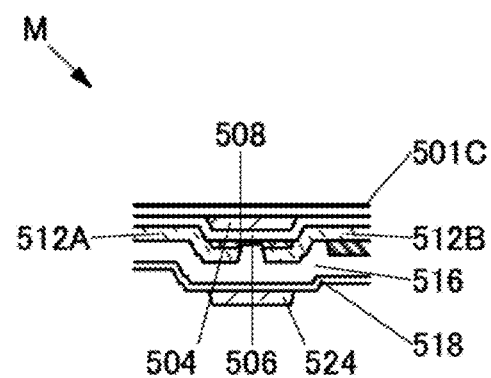

FIGS. 35A to 35C and FIGS. 36A and 36B are cross-sectional views illustrating a structure of a display panel. FIG. 35A is a cross-sectional view taken along line X1-X2 and line X3-X4 in FIG. 1A, and line X5-X6 in FIG. 4. FIGS. 35B and 35C each illustrate part of FIG. 35A.

Figure 36A:
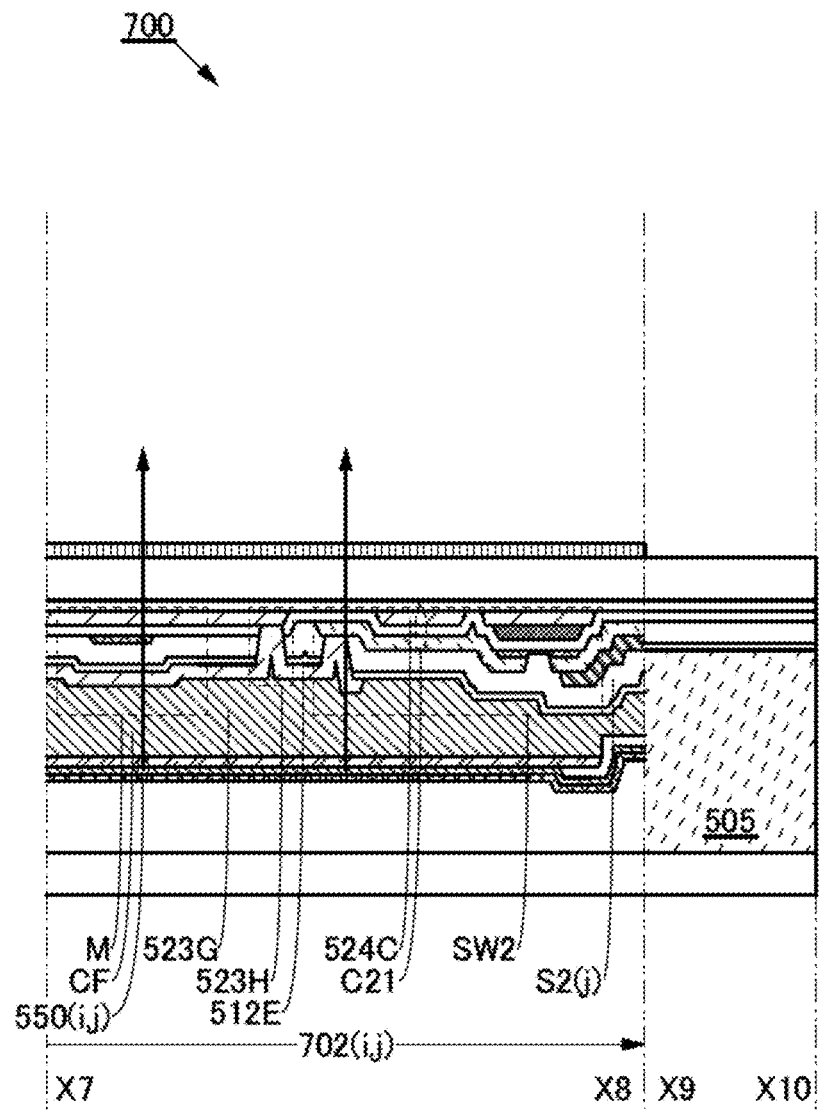
FIGS. 36A and 36B are cross-sectional views illustrating a structure of a display panel of one embodiment.
Figure 36B:
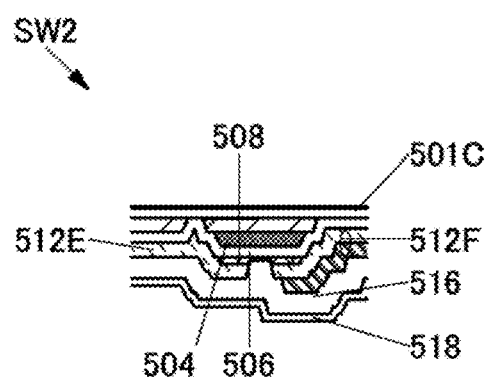

FIG. 36A is a cross-sectional view taken along line X7-X8 in FIG. 4, and line X9-X10 in FIG. 1A.

The display panel is different from the display panel described with reference to FIGS. 2A to 2C and FIGS. 3A and 3B in that a bottom-gate transistor is included instead of the top-gate transistor.

<Structure Example 9 of Display Panel>

Figure 24A:
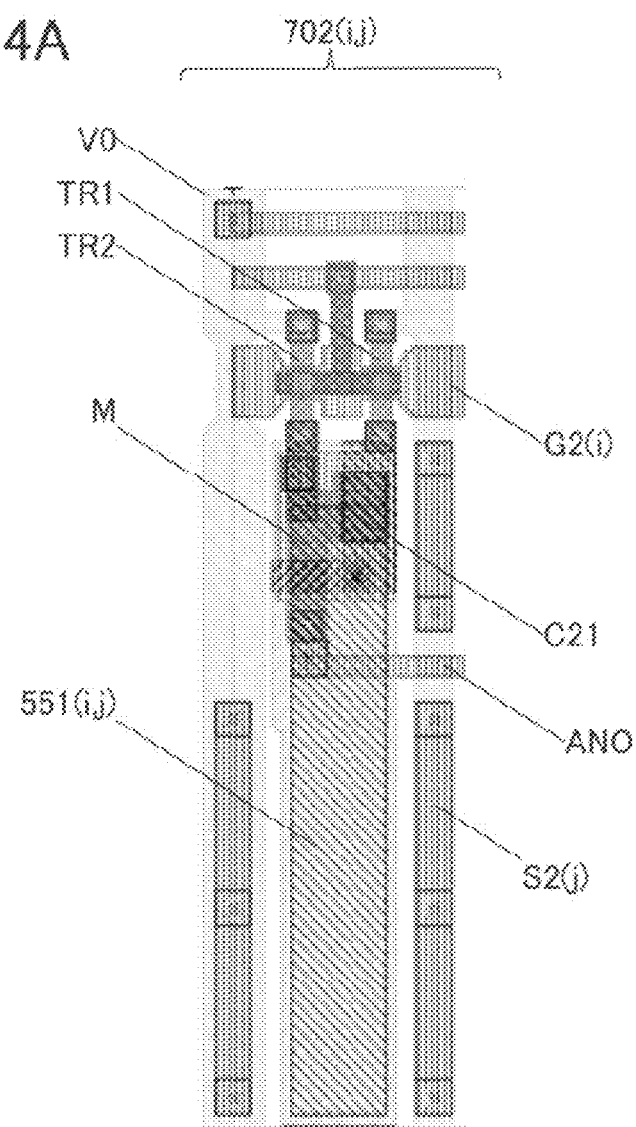
FIGS. 24A and 24B are a bottom view and a circuit diagram illustrating a structure of a pixel in a display panel of one embodiment.
Figure 24B:
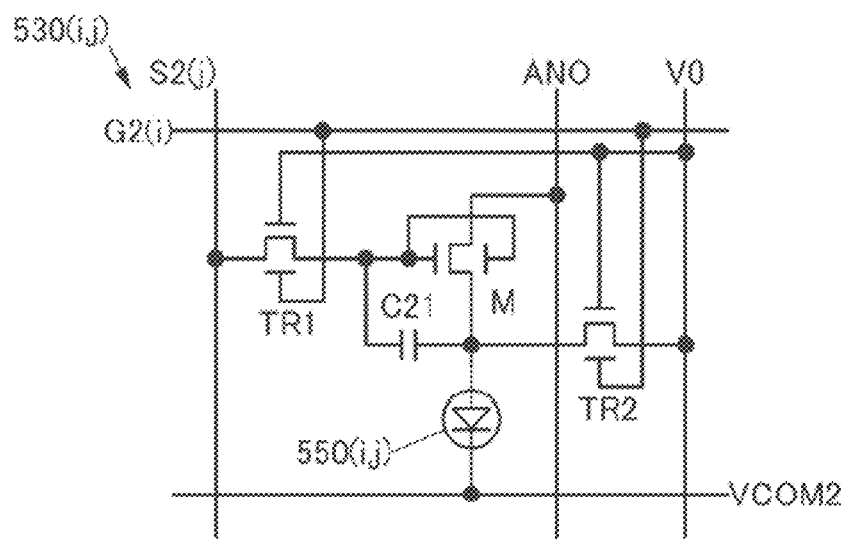

A structure example of a pixel in a display panel described in this embodiment is described with reference to FIGS. 24A and 24B. FIG. 24A is a bottom view illustrating the structure of the pixel. FIG. 24B is a circuit diagram illustrating a configuration of a pixel circuit.

The structure example is different from the structure example of the display panel described with reference to FIG. 5 in that a pixel circuit includes three transistors.

Different portions will be described in detail below, and the above description is referred to for the other similar portions.

The pixel $702(i,j)$ includes a display element and a pixel circuit.

The pixel circuit includes a transistor TR1, a transistor TR2, and the transistor M. In addition, the pixel circuit includes the capacitor C21. Thus, variations in the electrical characteristics of the transistor can be compensated. Alternatively, display unevenness of the display region can be reduced.

The pixel circuit is electrically connected to the scan line $G2(i)$, the signal line $S2(j)$, the conductive film ANO, a wiring V0, and the conductive film VCOM2.

The display element includes the electrode $551(i,j)$, and the electrode $551(i,j)$ is electrically connected to the pixel circuit. For example, an organic EL element can be used as the display element.

For example, a top-gate transistor whose lengths in the channel direction and the channel width direction are each 4 μm can be used. In addition, for example, a metal film can be used as the scan line $G2(i)$, the signal line $S2(j)$, the conductive film ANO, the wiring V0, and the conductive film VCOM2.

Thus, a connection portion between the transistor and the wiring can have a light-transmitting property. Alternatively, the capacitor can have a light-transmitting property. Alternatively, the aperture ratio can be 26.2%. The reliability of the organic EL element can be increased. Alternatively, a 65-inch diagonal display panel in which 7680 pixels are included in the row direction and 4320 pixels are included in the column direction can be provided. Alternatively, one group of pixels arranged in the column direction can be electrically connected to one signal line. Alternatively, for example, a seamless image can be displayed from an upper side to a lower side of the display region. Note that when a non-light-transmitting material is used, the aperture ratio is 17.4%.

<<Operation Example>>

Table 1 shows a structure example of a pixel in the display panel described in this embodiment. The pixel circuit includes a top-gate transistor. Furthermore, Table 2 shows evaluation results of the operation of a display panel having the structure shown in Table 1 that are obtained using a computer.

TABLE 1

| | |
|---|---|
| Panel size | 65 inch |
| Effective pixels | 7680 × RGBW(H) × 4320(V): 8K |
| Coloring method | White tandem OLED, Bottom emission, Color filter |
| FET | CAC-OS TGSA-FET |
| Gray scale | 12 bit |
| Pixel circuit | 3 transistors, 1 capacitor |
| Gate driver | Integrated circuit connected by COF method |
| Source driver | Integrated circuit connected by COF method |
| Source lines | One per one column |

TABLE 2

| Source lines | Aperture ratio | Aperture ratio | Frequency | Writing time | One horizontal period | Operation judgement |
|---|---|---|---|---|---|---|
| One | 17.4% | 21.7% | 60 Hz | 2.14 μs | 3.84 μs | Good |
| | | | 120 Hz | 2.14 μs | 1.92 μs | Fair |

From the calculation results, it is found that the display panel favorably operates at a frame rate of 60 Hz. In addition, it is found that when a wiring with an increased thickness is used or an insulating film sandwiched between wirings which intersect with each other has an increased thickness, the display panel can operate at a flame rate of 120 Hz.

<Structure Example 10 of Display Panel>

A structure example of the display panel of one embodiment of the present invention is described with reference to FIGS. 38A to 38C, FIGS. 39A and 39B, and FIGS. 40A, 40B, 40C-1, and 40C-2.

Figure 38A:
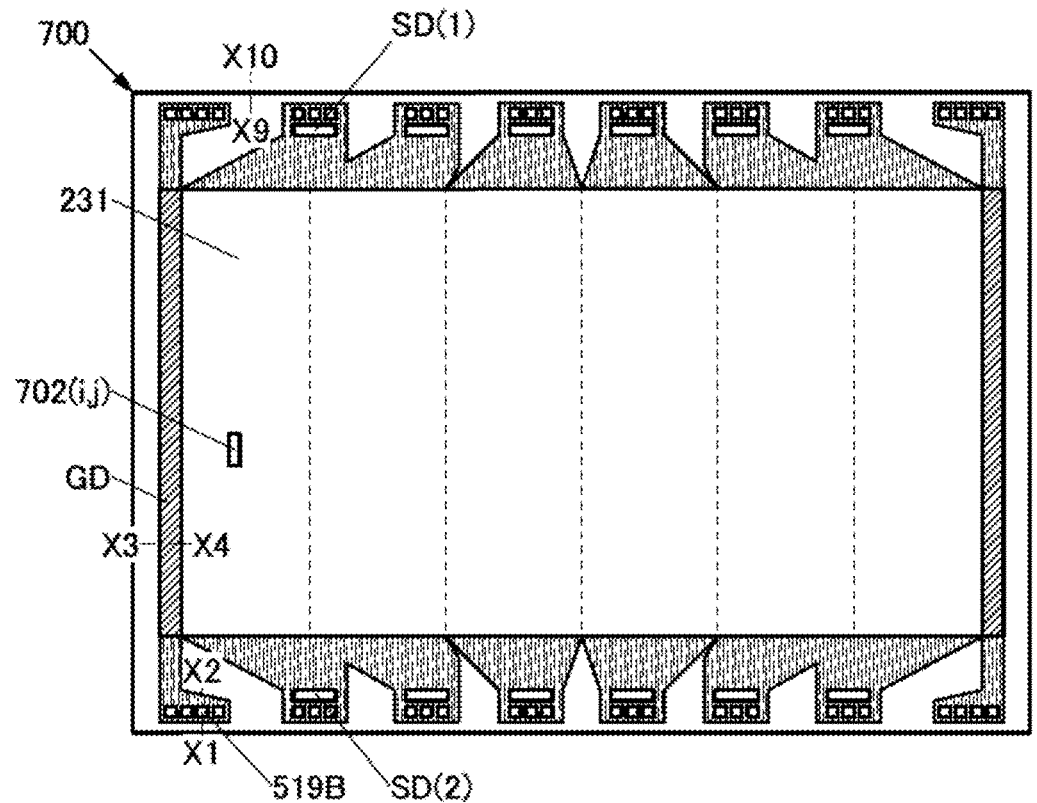
FIGS. 38A to 38C are top views illustrating structures of display panels of embodiments.
Figure 38B:
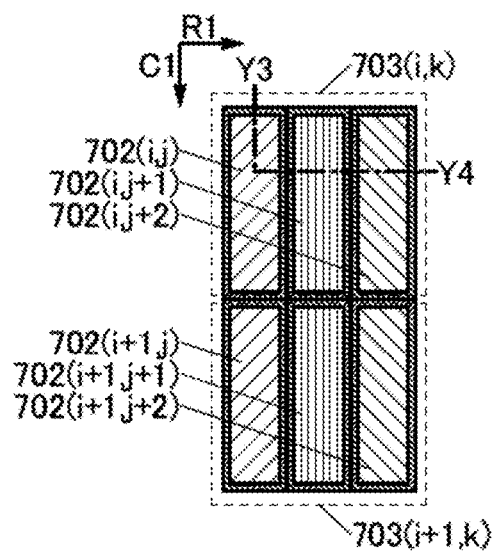
Figure 38C:
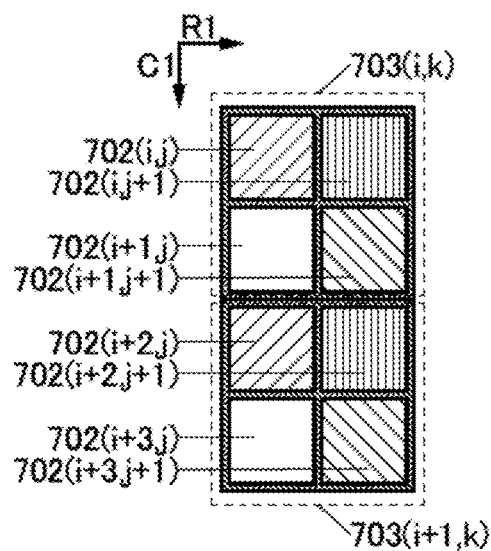

FIGS. 38A to 38C are top views illustrating structures of a display panel. FIG. 38A is a top view of a display panel. FIGS. 38B and 38C are top views illustrating structures of a pixel which can be used in the display panel in FIG. 38A.

Figure 39A:
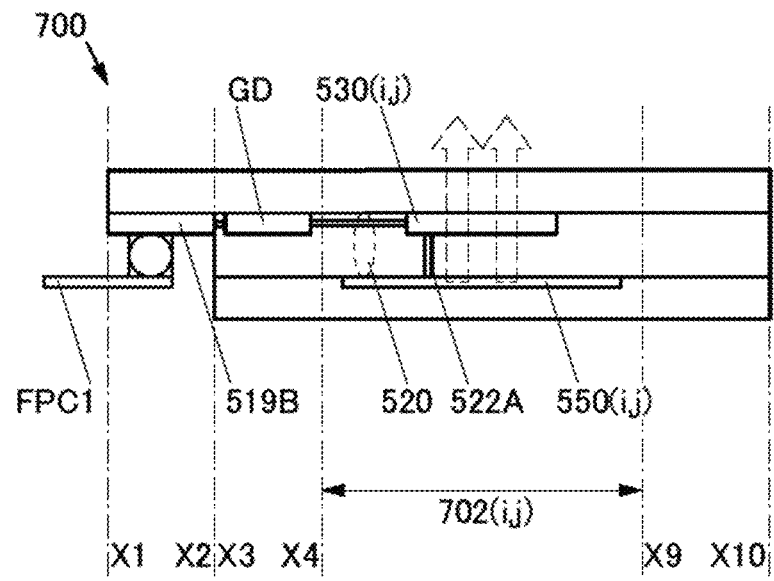
FIGS. 39A and 39B are a cross-sectional view and a circuit diagram illustrating a structure of a display panel of one embodiment.
Figure 39B:
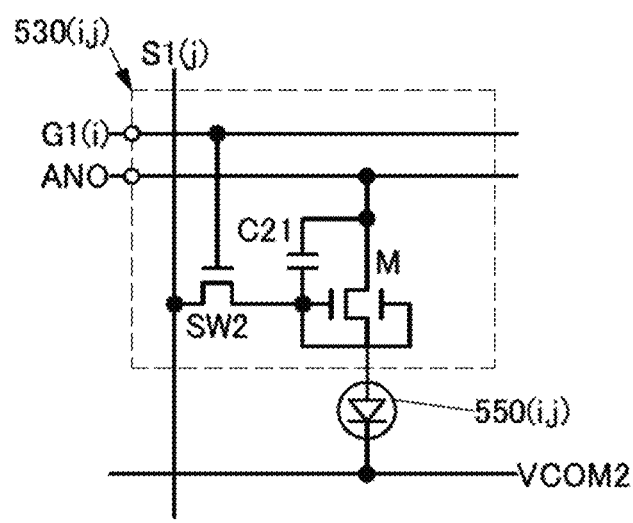

FIG. 39A is a cross-sectional view taken along line X1-X2, line X3-X4, and line X9-X10 in FIG. 38A. FIG. 39B is a circuit diagram illustrating a pixel circuit.

Figure 40A:
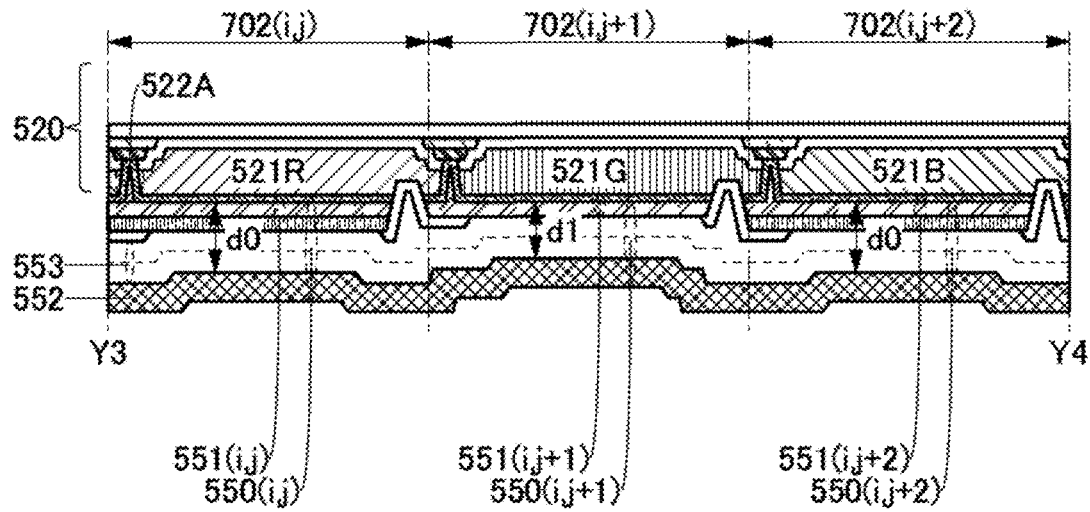
Figure 40B:
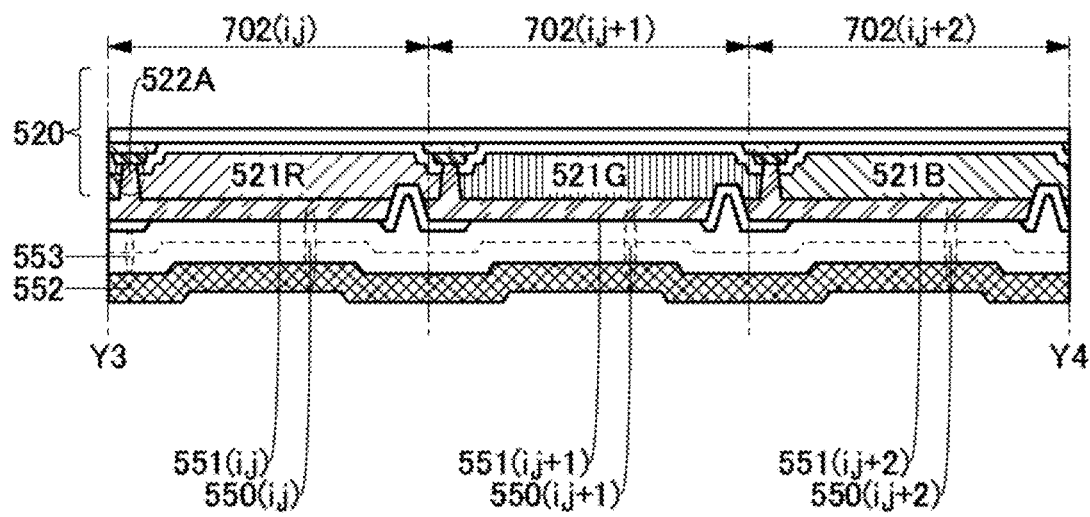
Figures 1, 40C:
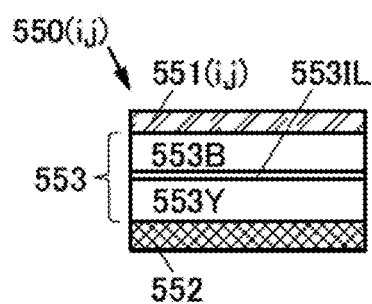
Figures 2, 40C:
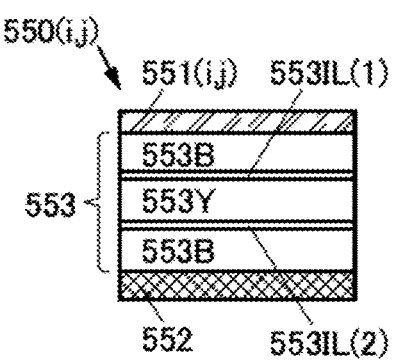

FIGS. 40A and 40B are each a cross-sectional view taken along line Y3-Y4 in the display element in FIG. 38B which can be used in the display panel. FIGS. 40C-1 and 40C-2 are cross-sectional views each illustrating a layer which contains a light-emitting organic compound and which can be used in the display element.

The display panel 700 includes the display region 231, the driver circuit GD, a driver circuit SD(1), a driver circuit SD(2), and the terminal 519B (see FIG. 38A).

The display panel 700 includes the functional layer 520. The functional layer 520 includes the pixel circuit $530(i,j)$ (see FIG. 39A).

<<Display Region 231>>

The display region 231 includes the pixel $702(i,j)$ (see FIG. 38A).

For example, the display region 231 includes a plurality of pixels. The plurality of pixels have a function of representing colors with different hues. Alternatively, colors with hues that cannot be represented by each of the plurality of pixels can be represented by additive color mixing with the use of the plurality of pixels. Note that when a plurality of pixels capable of representing colors with different hues are used for color mixture, each of the pixels can be referred to as a subpixel. In addition, a set of subpixels can be referred to as a pixel.

For example, the pixel 702($i,j$), the pixel 702($i,j$+1), or the pixel 702($i,j$+2) can be referred to as a subpixel, and the pixel 702($i,j$), a pixel 702($i,j$+1), and a pixel 702($i,j$+2) can be collectively referred to as a pixel 703($i,k$) (see FIG. 38B).

Specifically, a subpixel that represents blue, a subpixel that represents green, and a subpixel that represents red can be collectively used as the pixel 703($i,k$). Alternatively, a subpixel that represents cyan, a subpixel that represents magenta, and a subpixel that represents yellow can be collectively used as the pixel 703($i,k$).

Alternatively, for example, the above set to which a subpixel that represents white is added can be used as the pixel (see FIG. 38C).

<<Pixel 702($i,j$)>>

The pixel 702($i,j$) includes the display element 550($i,j$) and the pixel circuit 530($i,j$) (see FIGS. 39A and 39B).

The display element 550($i,j$) is electrically connected to the pixel circuit 530($i,j$). For example, the display element 550($i,j$) is electrically connected to the pixel circuit 530($i,j$) in the opening portion 522A (see FIG. 39A).

<<Display Element 550($i,j$)>>

The display element 550($i,j$) includes the electrode 551($i,j$), the electrode 552, and a layer 553 containing a light-emitting material (see FIG. 40A or FIG. 40B). The layer 553 containing a light-emitting material includes a region positioned between the electrode 551($i,j$) and the electrode 552.

The electrode 551($i,j$) is electrically connected to the pixel circuit 530($i,j$) in the opening portion 522A, for example.

For example, a material which reflects visible light can be used for the electrode 552.

For example, a material which reflects part of visible light and transmits part of visible light can be used for the electrode 551($i,j$) (see FIG. 40A). Specifically, a metal film which is thin enough to transmit light or a metal film with a thickness of several nanometers can be used as the electrode 551($i,j$). For example, a material containing silver, palladium, and the like or a material containing silver, copper, and the like can be used for the metal film.

For example, a stacked-layer material in which a light-transmitting conductive film is stacked over the material which reflects part of visible light and transmits part of visible light can be used for the electrode 551($i,j$) and the electrode 551($i,j$+2). Thus, for example, a distance d0 between the electrode 552 and a portion of the electrode 551($i,j$) that reflects part of visible light can be adjusted. Alternatively, the extraction efficiency of light with a predetermined wavelength can be increased. Specifically, red light and blue light can be efficiently extracted.

For example, a stacked-layer material in which a light-transmitting conductive film is stacked over the material which reflects part of visible light and transmits part of visible light can be used for the electrode 551 ($i,j$+1). Thus, for example, a distance d1 between the electrode 552 and a portion of the electrode 551($i,j$) that reflects part of visible light can be adjusted. Alternatively, the extraction efficiency of light with a predetermined wavelength can be increased. Specifically, green light can be efficiently extracted.

Furthermore, a light-transmitting material can be used for the electrode 551($i,j$), the electrode 551($i,j$+1), and the electrode 551($i,j$+2) (see FIG. 40B). Thus, white light can be extracted.

<<Layer 553 Containing Light-Emitting Material>>

A plurality of materials which emit light with different hues can be used for the layer 553 containing a light-emitting material. For example, a stacked-layer material can be used for the layer 553 containing a light-emitting material (see FIGS. 40C-1 and 40C-2).

For example, a material that emits blue light can be used for a layer 553B containing a light-emitting material. Furthermore, a stacked-layer material in which a layer containing a material emitting green light and a layer containing a material emitting red light are stacked can be used for a layer 553Y containing a light-emitting material.

Then, an intermediate layer 553IL can be used as the layer 553 containing the light-emitting material. The intermediate layer 553IL includes a region sandwiched between the layer 553B containing a light-emitting material and the layer 553Y containing a light-emitting material. In addition, the intermediate layer 553IL has functions of supplying electrons to the anode side and supplying holes to the cathode side.

Specifically, the layer 553 containing a light-emitting material can have a stacked-layer structure in which the layer 553B containing a light-emitting material, the intermediate layer 553IL, and the layer 553Y containing a light-emitting material are stacked (see FIG. 40C-1).

Specifically, the layer 553 containing a light-emitting material can have a stacked-layer structure in which the layer 553B containing a light-emitting material, an intermediate layer 553IL(1), the layer 553Y containing a light-emitting material, an intermediate layer 553IL(2), and the layer 553B containing a light-emitting material are stacked (see FIG. 40C-2).

<<Insulating Film 521>>

The functional layer 520 includes the insulating film 521. For example, a material containing a coloring material can be used for the insulating film 521.

Specifically, a film containing a red coloring material, a film containing a green coloring material, and a film containing a blue coloring material can be used as the insulating film 521R, the insulating film 521G, and the insulating film 521B, respectively (see FIGS. 40A and 40B).

Note that this embodiment can be combined with any of the other embodiments in this specification as appropriate.

Embodiment 2

Described in this embodiment is a metal oxide that can be used in a semiconductor layer of a transistor disclosed in one embodiment of the present invention. Note that in the case where a metal oxide is used in a semiconductor layer of a transistor, the metal oxide can be rephrased as an oxide semiconductor.

Oxide semiconductors can be classified into a single crystal oxide semiconductor and a non-single-crystal oxide semiconductor. Examples of the non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

Furthermore, as an example of the non-single-crystal oxide semiconductor, an oxide semiconductor which is called a semi-crystalline oxide semiconductor can be given.

The semi-crystalline oxide semiconductor has an intermediate structure between the single-crystal oxide semiconductor and the amorphous oxide semiconductor. The structure of the semi-crystalline oxide semiconductor is more stable than that of the amorphous oxide semiconductor. For example, as an example of the semi-crystalline oxide semiconductor, an oxide semiconductor with a CAAC structure and a cloud-aligned composite (CAC) structure is given. The details of the CAC will be described below.

For the semiconductor layer of the transistor disclosed in one embodiment of the present invention, a cloud-aligned composite oxide semiconductor (CAC-OS) may be used.

Note that the above-described non-single-crystal oxide semiconductor or CAC-OS can be suitably used for the semiconductor layer of the transistor disclosed in one embodiment of the present invention. As the non-single-crystal oxide semiconductor, the nc-OS or the CAAC-OS can be suitably used.

In one embodiment of the present invention, the CAC-OS is preferably used for the semiconductor layer of the transistor. With the use of the CAC-OS, the transistor can have excellent electrical characteristics or high reliability.

The CAC-OS will be described in detail below.

The CAC-OS or a CAC metal oxide has a conducting function in a part of the material and has an insulating function in another part of the material, as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, high on-state current and high field-effect mobility, can be obtained.

In other words, the CAC-OS or the CAC metal oxide can be called a matrix composite or a metal matrix composite.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite metal oxide with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to the element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InOn_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Furthermore, with a transistor in which the CAAC-OS or the CAC-OS is used for the semiconductor film, the channel length can be shortened, the on-state current can be increased, the off-state current can be significantly decreased, the variation can be reduced, and the reliability can be increased. The transistor can be formed on a large glass substrate, such as approximately the 8th-generation glass substrate to the 10th-generation glass substrate. Thus, the transistor can be suitable used in a backplane of a large organic EL television.

This embodiment can be combined with any of other embodiments as appropriate.

Embodiment 3

In this embodiment, a structure of a display panel of one embodiment of the present invention will be described with reference to FIG. 25, FIGS. 26A and 26B, FIGS. 27A and 27B, FIG. 28, FIGS. 29A and 29B, FIG. 30, FIGS. 31A and 31B, FIG. 32, and FIG. 33.

Note that the display panel described in this embodiment is different from the display panel described in Embodiment 1 in that the display region is provided with a second signal line in addition to a first signal line and that part of one group of pixels arranged in the column direction are electrically connected to the first signal line and another part thereof is electrically connected to the second signal line. Different portions will be described in detail below, and the above description is referred to for the other similar portions.

Figure 25:
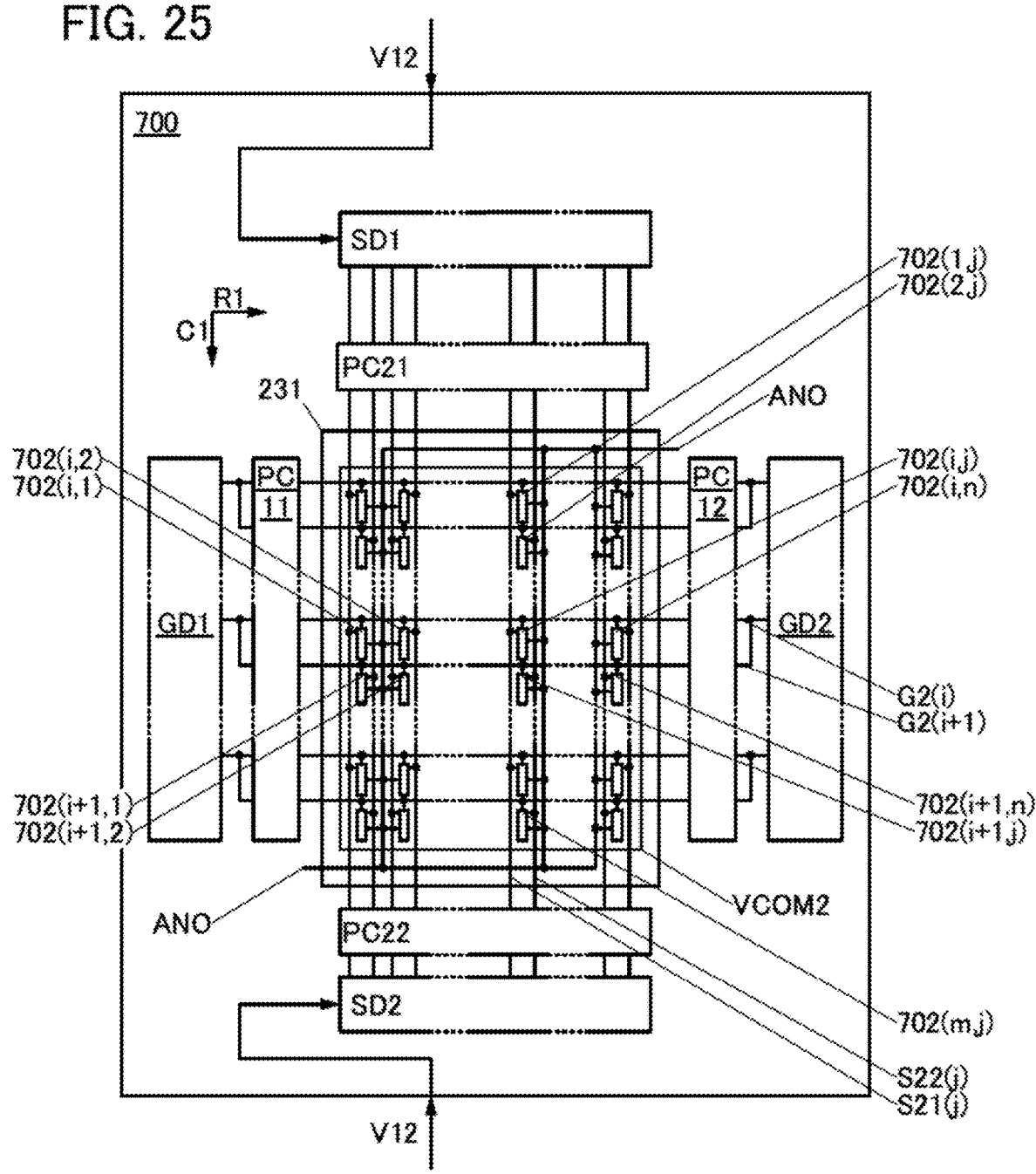
FIG. 25 is a block diagram illustrating a structure of a display panel of one embodiment.

FIG. 25 is a block diagram illustrating a structure of the display panel of one embodiment of the present invention.

Figure 26A:
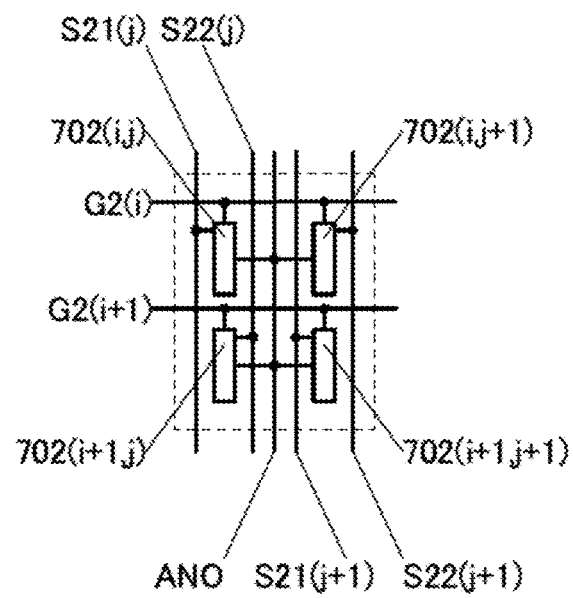
FIGS. 26A and 26B are a block diagram and a circuit diagram illustrating a structure of a display panel of one embodiment.
Figure 26B:
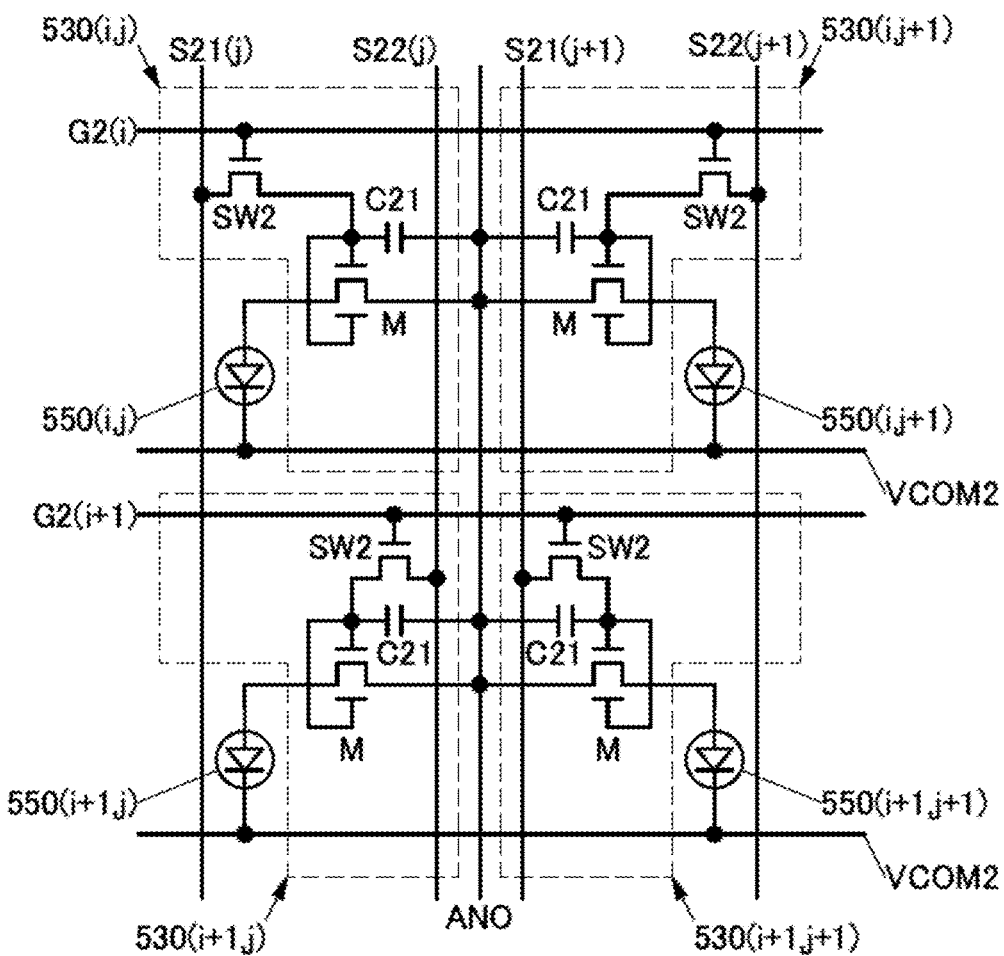

FIG. 26A is a block diagram illustrating part of the structure of the display panel in FIG. 25. FIG. 26B is a circuit diagram illustrating a structure of a pixel that can be used in the display panel in FIG. 26A.

Figure 27A:
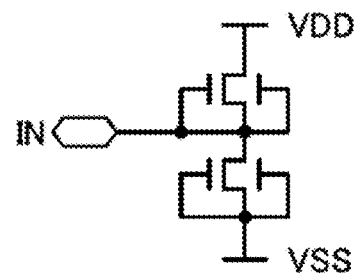
FIGS. 27A and 27B are a circuit diagram and a block diagram illustrating a structure of a protective circuit of one embodiment.
Figure 27B:
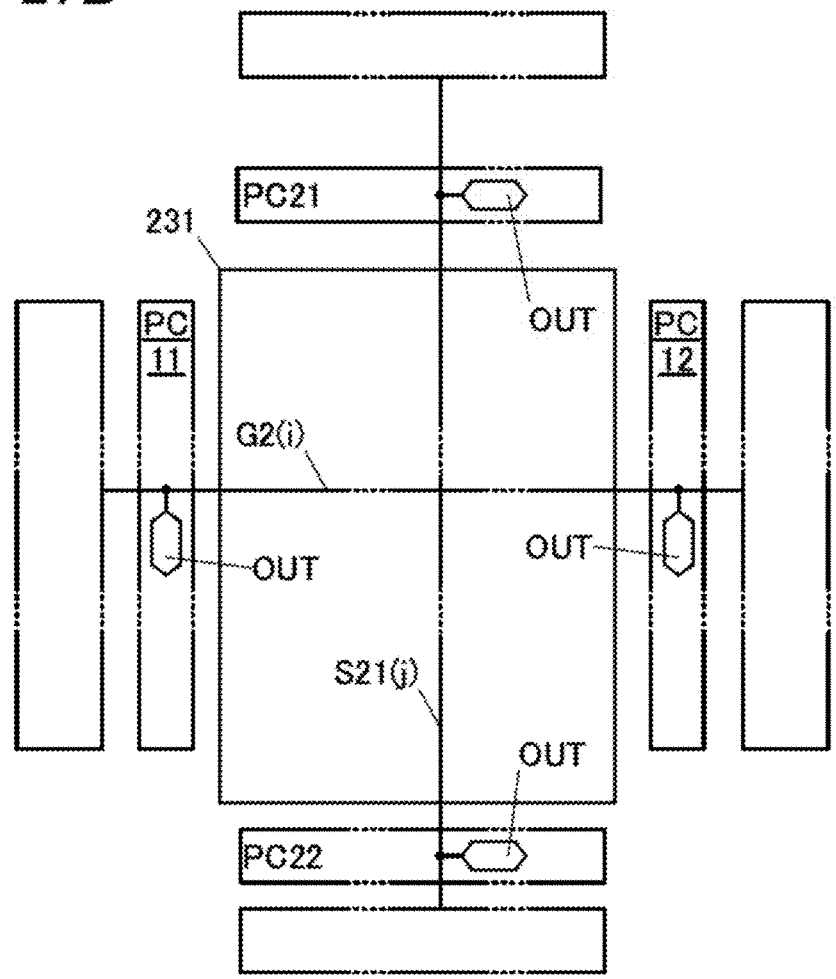

FIG. 27A is a circuit diagram illustrating a structure of a protective circuit which can be used in the display panel in FIG. 25. FIG. 27B is a block diagram illustrating a position at which the protective circuit in FIG. 27A can be electrically connected to a wiring.

Figure 28:
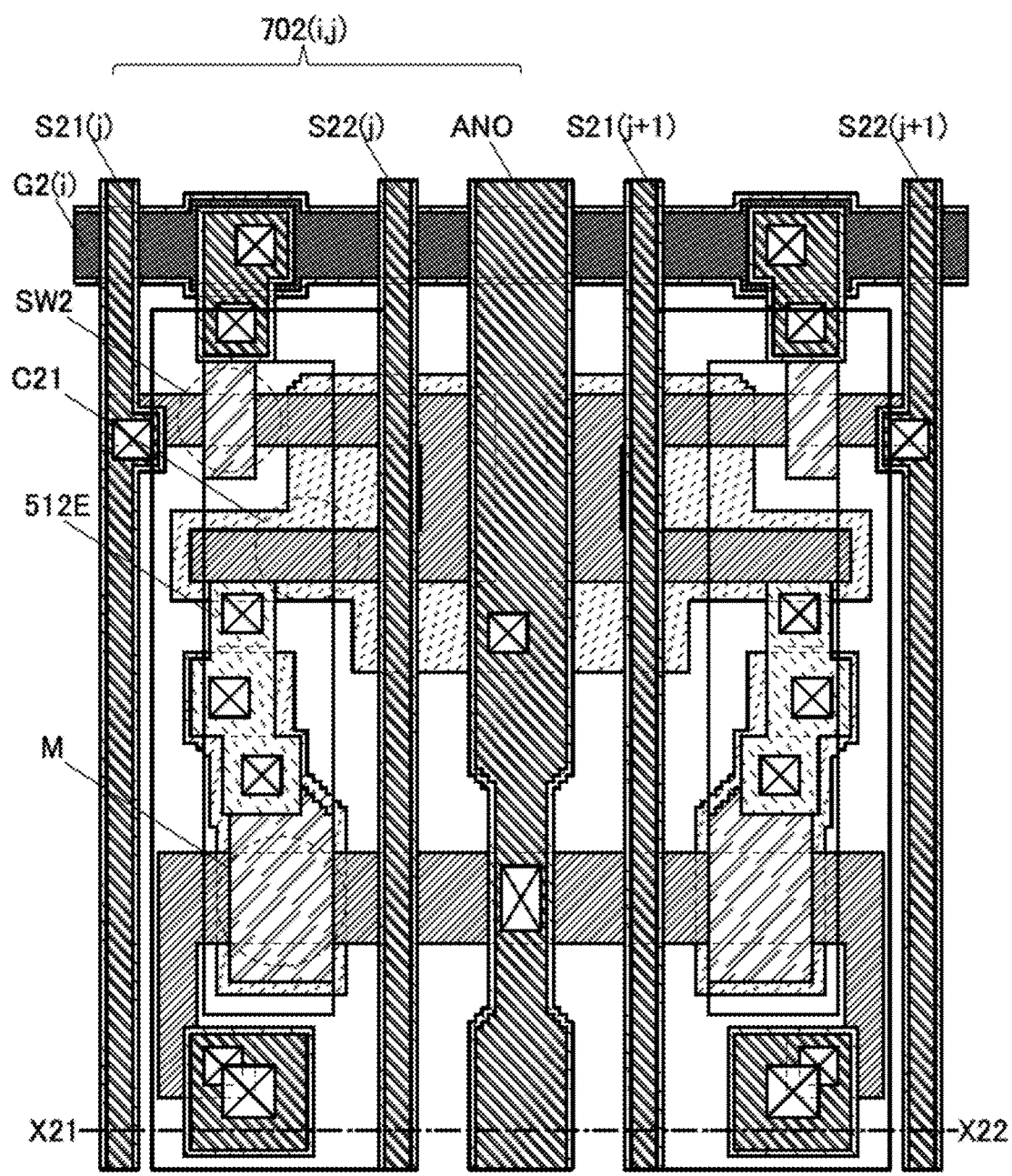
FIG. 28 is a bottom view illustrating a structure of a pixel in a display panel of one embodiment.

FIG. 28 is a bottom view illustrating a structure of a pixel in the display panel in FIG. 1A.

Figure 29A:
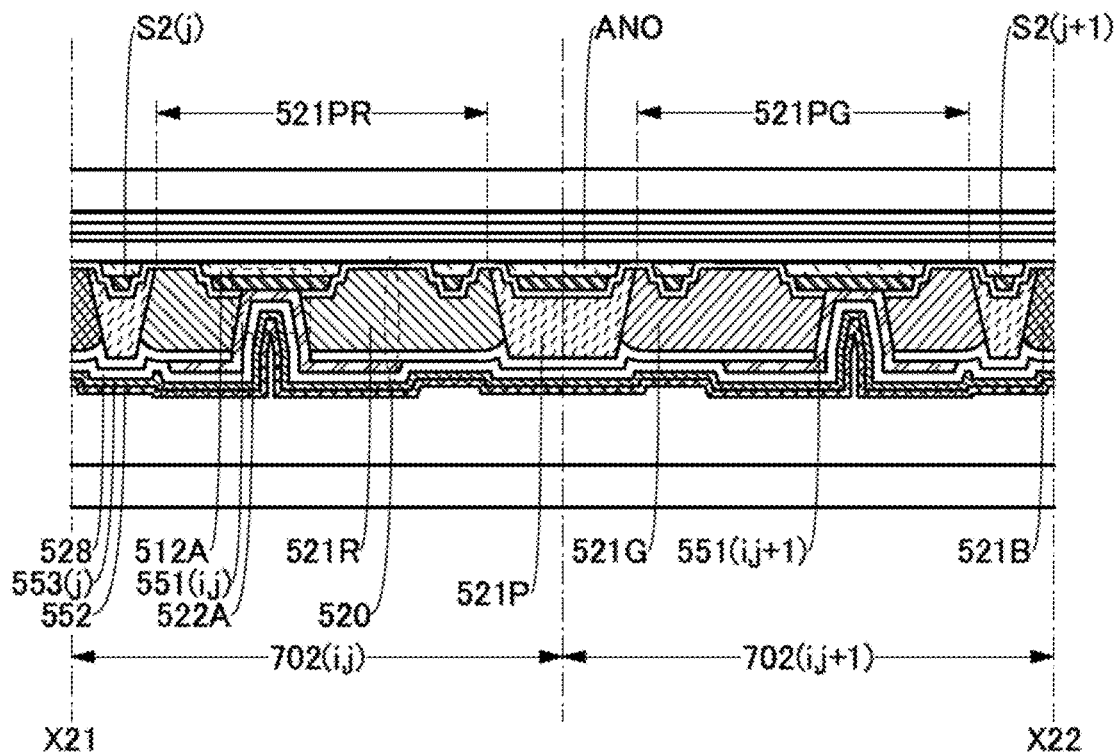
FIGS. 29A and 29B are a cross-sectional view and a perspective view illustrating a structure of pixels in a display panel of one embodiment.

FIG. 29A is a cross-sectional view taken along line X21-X22 in FIG. 28.

<Structure Example 1 of Display Panel>

The display panel described in this embodiment includes a display region 231 (see FIG. 25).

<<Structure Example 1 of Display Region>>

The display region 231 includes a first group of pixels 702(i,1) to 702(i,n), a second group of pixels 702(i+1,1) to 702($i$+1,n), a third group of pixels, a fourth group of pixels, a first scan line G2($i$), a second scan line G2($i$+1), a first signal line S21($j$), and a second signal line S22($j$). Furthermore, the display region 231 includes a conductive film VCOM2 and a conductive film ANO. Note that i is an integer greater than or equal to 1 and less than or equal to m,j is an integer greater than or equal to 1 and less than or equal to n, and each of m and n is an integer greater than or equal to 1.

The first group of pixels 702($i$,1) to 702($i$,n) include the first pixel 702($i$,$j$) and are provided in the row direction (the direction indicated by the arrow R1 in the drawing). Furthermore, the first group of pixels 702($i$,1) to 702($i$,n) include the pixel 702($i$,$j$) and the pixel 702($i$,$j$+1) (see FIGS. 26A and 26B).

The second group of pixels 702($i$+1,1) to 702($i$+1,n) include the second pixel 702($i$+1,$j$) and are provided in the row direction (see FIG. 25). Furthermore, the second group of pixels 702($i$+1,1) to 702($i$+1,n) include the pixel 702($i$+1,$j$) and the pixel 702($i$+1,$j$+1) (see FIGS. 26A and 26B).

The third group of pixels include the first pixel 702($i$,$j$) and are provided in the column direction which intersects the row direction (the direction indicated by the arrow C1 in the drawing). For example, some pixels selected from the pixels 702(1,$j$) to 702($m$,$j$) can be used in the third group of pixels.

The fourth group of pixels include the second pixel 702($i$+1,$j$) and are provided in the column direction. For example, the other pixels selected from the pixels 702(1,$j$) to 702($m$,$j$), except the pixels in the third group of pixels, can be used in the fourth group of pixels (see FIG. 25).

The first signal line S21($j$) is electrically connected to the third group of pixels. For example, the first signal line S21($j$) is electrically connected to the pixel 702($i$,$j$).

The second signal line S22($j$) is electrically connected to the fourth group of pixels. For example, the second signal line S22($j$) is electrically connected to the pixel 702($i$+1,$j$).

The first scan line G2($i$) is electrically connected to the first group of pixels 702($i$,1) to 702($i$,n). For example, the first scan line G2($i$) is electrically connected to the pixel 702($i$,$j$) and the pixel 702($i$,$j$+1).

The second scan line G2($i$+1) is electrically connected to the second group of pixels 702($i$+1,1) to 702($i$+1,n). For example, the first scan line G2($i$) is electrically connected to the pixel 702($i$+1,$j$) and the pixel 702($i$+1,$j$+1).

Thus, image data can be supplied to a plurality of pixels. Consequently, a novel display panel that is highly convenient or reliable can be provided.

<<Structure Example 2 of Display Region>>

The fourth group of pixels and the third group of pixels are alternately arranged.

The second pixel 702($i$+1,$j$) is adjacent to the first pixel 702($i$,$j$) in the column direction. For example, pixels arranged in the odd-numbered row can be used in the third group of pixels and pixels arranged in the even-numbered row can be used in the fourth group of pixels.

Specifically, the pixel 702(1,$j$), a pixel 702(3,$j$), a pixel 702(5,$j$), and the like selected from the pixels 702(1,$j$) to 702($m$,$j$) can be used in the third group of pixels, and a pixel 702(2,$j$), a pixel 702(4,$j$), a pixel 702(6,$j$), and the like selected from the pixels 702(1,$j$) to 702($m$,$j$) can be used in the fourth group of pixels.

Thus, the third group of pixels and the fourth group of pixels can be arranged to be mixed. Alternatively, a difference between display on the third group of pixels and display on the fourth group of pixels can be hardly distinguished. Consequently, a novel display panel that is highly convenient or reliable can be provided.

<<Structure Example of Scan Lines>>

The first scan line G2($i$) is supplied with a selection signal. For example, the selection signal can be supplied using a driver circuit GD1 and a driver circuit GD2.

The second scan line G2($i$+1) is supplied with the selection signal in a period during which the first scan line G2($i$) is supplied with the selection signal.

The second scan line G2($i$+1) may be electrically connected to the first scan line G2($i$).

Thus, while one scan line is supplied with a selection signal, the other scan line can be supplied with the selection signal. Alternatively, while one scan line is supplied with a selection signal, image data which is different from image data supplied to pixels electrically connected to one scan line can be supplied to pixels electrically connected to the other scan line. Consequently, a novel display panel that is highly convenient or reliable can be provided.

For example, a stacked-layer material for emitting white light can be used for a layer 553($j$) containing a light-emitting material and the layer 553($j$) containing a light-emitting material can be used in the display element 550($i$,$j$), a display element 550($i$,$j$+1), and a display element 550($i$, $j$+2). Thus, a display element which emits white light can be formed in one step.

<<Structure of Insulating Film 521>>

For example, a coloring material which has a region overlapping with the display element 550($i$,$j$) and through which red light is obtained from white light emitted from the display element 550($i$,$j$) can be used for the first insulating film 521. Specifically, an insulating film 521R containing a coloring material through which red light is obtained can be used for the subpixel 702($i$,$j$) (see FIGS. 29A and 29B). Thus, the subpixel 702($i$,$j$) can represent red.

For example, a coloring material which has a region overlapping with the display element 550($i$,$j$+1) and through which green light is obtained from white light emitted from the display element 550($i$,$j$+1) can be used for the first insulating film 521. Specifically, an insulating film 521G containing a coloring material through which green light is obtained can be used for the subpixel 702($i$,$j$+1). Thus, the subpixel 702($i$,$j$+1) can represent green.

For example, a coloring material which has a region overlapping with the display element 550($i$,$j$+2) and through which blue light is obtained from white light emitted from the display element 550($i$,$j$+2) can be used for the first insulating film 521. Specifically, an insulating film 521B containing a coloring material through which blue light is obtained can be used for the subpixel 702($i$,$j$+2). Thus, the subpixel 702($i$,$j$+2) can represent blue.

<<Structure Example 3 of Display Region>>

Figure 29B:
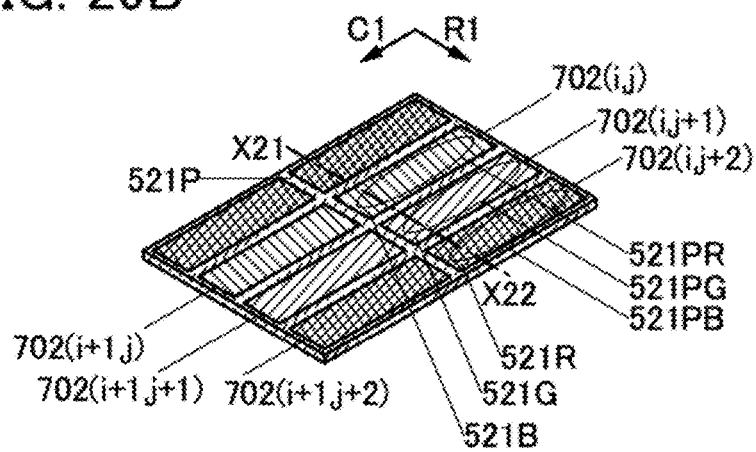

In addition, the display region 231 includes a partition wall 521P, the insulating film 521R, the insulating film 521G, and the insulating film 521B (see FIGS. 29A and 29B).

The partition wall 521P includes an opening portion 521PR, an opening portion 521PG, and an opening portion 521PB.

The opening portion 521PR has a region overlapping with the insulating film 521R. The opening portion 521PG has a region overlapping with the insulating film 521G. The opening portion 521PB has a region overlapping with the insulating film 521B.

For example, the material that can be used for the insulating film 521 can be used for the partition wall 521P. Specifically, a film formed using a photosensitive material can be used as the partition wall 521P. For example, a film formed using photosensitive polyimide, photosensitive acrylic, a photosensitive cardo resin, or the like can be used as the partition wall 521P. Specifically, with the use of a photomask and photosensitive acrylic, the partition wall 521P including an opening portion with a definition of 200 ppi (pixels per inch) or more, preferably 300 ppi or more, further preferably 500 ppi or more can be formed.

For example, a liquid repellent material can be used for the partition wall 521P. Thus, solutions containing different materials can be distributed into the opening portions of the partition wall so as not to be mixed. Alternatively, for example, the insulating films 521 containing different coloring materials can be formed in the respective regions which are separated by the partition wall 521P.

For example, a printing method, an inkjet method, or the like can be used as a method for distributing the solutions containing coloring materials into the respective opening portions. Alternatively, for example, the solutions containing coloring materials can be distributed with a nozzle for discharging materials continuously.

Specifically, the insulating film 521R can be formed by a method for distributing a solution containing a coloring material which extracts red light into the opening portion 521PR and solidifying the solution. The insulating film 521G can be formed by a method for distributing a solution containing a coloring material which extracts green light into the opening portion 521PG and solidifying the solution. The insulating film 521B can be formed by a method for distributing a solution containing a coloring material which extracts blue light into the opening portion 521PB and solidifying the solution. For example, the insulating films 521R, 521G, and 521B can be formed without any photomask other than the photomask which is used when the partition wall 521P is formed.

Thus, the insulating films containing different materials can be formed. For example, the insulating films containing different coloring materials can be formed. Alternatively, the insulating films containing different coloring materials can be separately formed without any photomask other than the photomask which is used when the partition wall 521P is formed. Alternatively, the number of photomasks that are used can be reduced. Alternatively, cost or the usage amount of material can be reduced. Consequently, a display panel that is highly convenient or reliable can be provided.

<Structure Example 2 of Display Panel>

The display panel described in this embodiment includes a protective circuit PC11, a protective circuit PC21, and a common wiring. Furthermore, a protective circuit PC12 and a protective circuit PC22 can be used in the display panel.

<<Configuration Example of Protective Circuit>

The protective circuit PC11 is electrically connected to the first scan line G2($i$) and the common wiring. For example, as the protective circuit PC11, a circuit including a diode through which the common wiring VSS and the first scan line G2($i$) are connected to each other so that current flows from the common wiring VSS to the first scan line G2($i$) when the first scan line G2($i$) is supplied with a potential sufficiently lower than the potential the common wiring VSS supplies and a diode through which the first scan line G2($i$) and the common wiring VDD are connected to each other so that current flows from the first scan line G2($i$) to the common wiring VDD when the first scan line G2($i$) is supplied with a potential sufficiently higher than the potential the common wiring VDD supplies can be used (see FIGS. 27A and 27B). Note that the common wiring VDD supplies a higher potential than the common wiring VSS.

Specifically, the gate electrode of the transistor is electrically connected to the source electrode or the drain electrode to form a diode. For example, a transistor including a semiconductor film which can be formed through the same process as the semiconductor film used in the transistor of the pixel circuit 530($i,j$) can be used for a diode.

The protective circuit PC21 is electrically connected to the first signal line S21($j$) and the common wiring. For example, as the protective circuit PC21, a circuit including a diode through which the common wiring VSS and the first signal line S21($j$) are connected to each other so that current flows from the common wiring VSS to the first signal line S21($j$) when the first signal line S21($j$) is supplied with a potential sufficiently lower than the potential the common wiring VSS supplies and a diode through which the first signal line S21($j$) and the common wiring VDD are connected to each other so that current flows from the first signal line S21($j$) to the common wiring VDD when the first signal line S21($j$) is supplied with a potential sufficiently higher than the potential the common wiring VDD supplies can be used (see FIGS. 27A and 27B).

Thus, the pixel can be protected from noise, surge, electrostatic discharge, and the like. Consequently, a display panel that is highly convenient or reliable can be provided.

For example, the protective circuit PC12 is electrically connected to the first scan line G2($i$) and is positioned so that the display region 231 is sandwiched between the protective circuit PC11 and the protective circuit PC12 (see FIG. 25).

In addition, the protective circuit PC22 is electrically connected to the first signal line S21($j$) and is positioned so that the display region 231 is sandwiched between the protective circuit PC21 and the protective circuit PC22.

<Structure Example 3 of Display Panel>

The display panel described in this embodiment includes the first driver circuit GD1 and a first signal line driver circuit SD1 (see FIG. 25).

The first driver circuit GD1 is electrically connected to the first scan line G2($i$) and the second scan line G2($i$+1).

The first signal line driver circuit SD1 is electrically connected to the first signal line S21($j$) and the second signal line S22($j$).

Thus, in a period during which the first scan line is supplied with a selection signal, the second scan line can be supplied with the selection signal. Alternatively, in a period during which the first signal line is supplied with image data, image data which is different from image data supplied to the first signal line can be supplied to the second signal line. Consequently, a display panel that is highly convenient or reliable can be provided.

<Structure Example 4 of Display Panel>

The display panel described in this embodiment includes the first driver circuit GD1, the second driver circuit GD2, the first signal line driver circuit SD1, and the second driver circuit SD2 (see FIG. 25).

The first driver circuit GD1 is electrically connected to one end of the first scan line G2($i$) and one end of the second scan line G2($i$+1).

The second driver circuit GD2 is electrically connected to the other end of the first scan line G2($i$) and the other end of the second scan line G2($i$+1). In addition, the second driver circuit GD2 supplies a selection signal in synchronization with the first driver circuit GD1.

The first signal line driver circuit SD1 is electrically connected to one end of the first signal line S21($j$) and one end of the second signal line S22($j$).

The second driver circuit SD2 is electrically connected to the other end of the first signal line S21($j$) and the other end of the second signal line S22(j). In addition, the second driver circuit SD2 supplies data in synchronization with the first signal line driver circuit SD1.

Thus, for example, deterioration of a selection signal due to wiring resistance or capacitive coupling can be suppressed. Alternatively, a selection signal whose deterioration is suppressed can be supplied to a plurality of pixels. For example, deterioration of image data de to wiring resistance or capacitive coupling can be suppressed. Alternatively, image data whose deterioration is suppressed can be supplied to a plurality of pixels. Alternatively, the diagonal size of the display region can be greater than or equal to 40 inches, preferably greater than or equal to 50 inches, further preferably greater than or equal to 65 inches. Consequently, a display panel that is highly convenient or reliable can be provided.

<Structure Example 5 of Display Panel>

Figure 30:
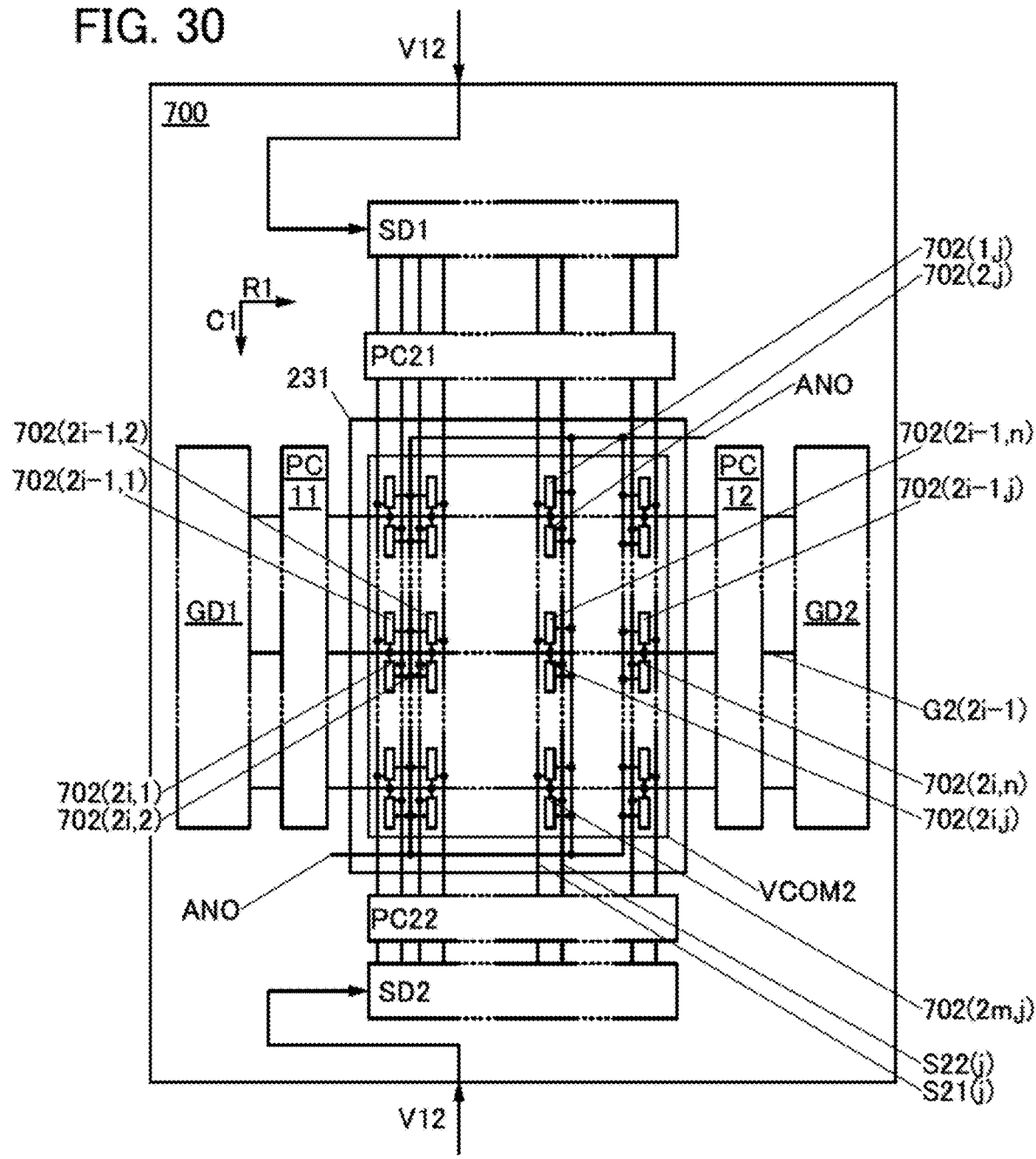
FIG. 30 is a block diagram illustrating a structure of a display panel of one embodiment.
Figure 31A:
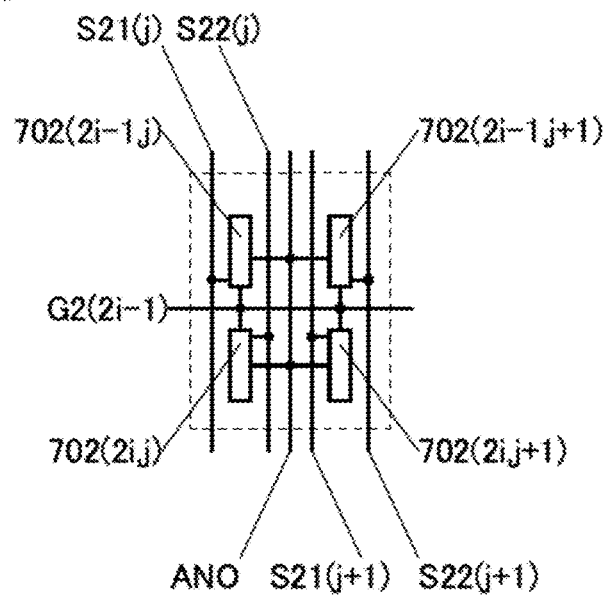
FIGS. 31A and 31B are a block diagram and a circuit diagram illustrating a structure of a display panel of one embodiment.
Figure 31B:
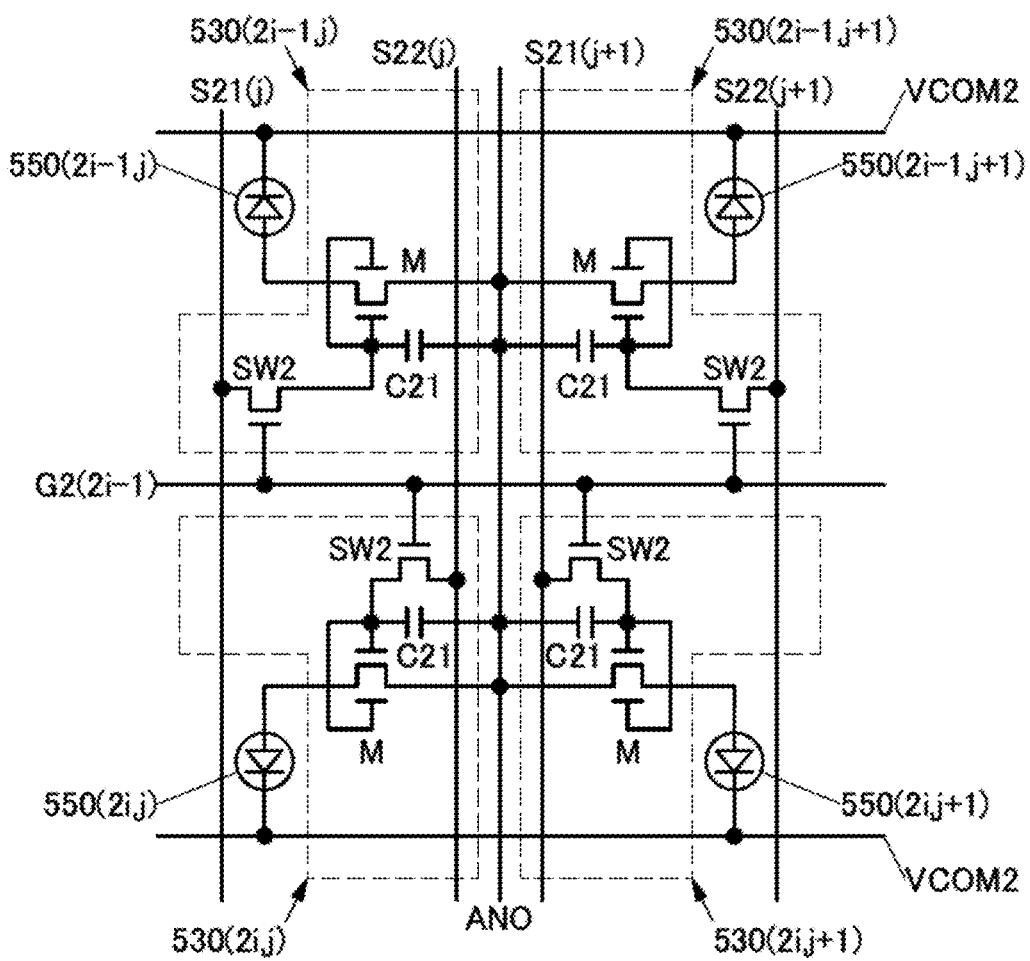

The display panel 700 described in the structure example of this embodiment is different from the display panel described with reference to FIG. 25 in that a first scan line G2(2i−1) is electrically connected to a first group of pixels 702(2i−1,1) to 702(2i−1,n) and a second group of pixels 702(2i,1) to 702(2i,n) (see FIG. 30 and FIGS. 31A and 31B). Different portions will be described in detail below, and the above description is referred to for the other similar portions.

<<Structure Example 4 of Display Region>>

The display region 231 includes a first group of pixels 702(2i−1,1) to 702(2i−1,n), a second group of pixels 702(2i,1) to 702(2i,n), a third group of pixels, a fourth group of pixels, a first scan line G2(2i−1), a first signal line S21(j), and a second signal line S22(j). Furthermore, the display region 231 includes a conductive film VCOM2 and a conductive film ANO. Note that 2i is an integer greater than or equal to 2 and less than or equal to 2m, j is an integer greater than or equal to 1 and less than or equal to n, and each of m and n is an integer greater than or equal to 1.

The first group of pixels 702(2i−1,1) to 702(2i−1,n) include the first pixel 702(2i−1,j) and are provided in the row direction (the direction indicated by the arrow R1 in the drawing). Furthermore, the first group of pixels 702(2i−1,1) to 702(2i−1,n) include the pixel 702(2i−1,j) and the pixel 702(2i−1,j+1) (see FIGS. 31A and 31B).

The second group of pixels 702(2i,1) to 702(2i,n) include the second pixel 702(2i,j) and are provided in the row direction (see FIG. 25). Furthermore, the second group of pixels 702(2i,1) to 702(2i,n) include the pixel 702(2i,j) and the pixel 702(2i,j+1) (see FIGS. 31A and 31B).

The third group of pixels include the first pixel 702(2i−1,j) and are provided in the column direction which intersects the row direction (the direction indicated by the arrow C1 in the drawing). For example, some pixels selected from the pixels 702(2i−1,j) to 702(2m,j) can be used in the third group of pixels.

The fourth group of pixels include the second pixel 702(2i,j) and are provided in the column direction. For example, the other pixels selected from the pixels 702(2i−1,j) to 702(2m,j), except the pixels in the third group of pixels, can be used in the fourth group of pixels (see FIG. 30).

The first signal line S21(j) is electrically connected to the third group of pixels. For example, the first signal line S21(j) is electrically connected to the pixel 702(2i−1,j).

The second signal line S22(j) is electrically connected to the fourth group of pixels. For example, the second signal line S22(j) is electrically connected to the pixel 702(2i,j).

The first scan line G2(2i−1) is electrically connected to the first group of pixels 702(2i−1,1) to 702(2i−1,n). For example, the first scan line G2(2i−1) is electrically connected to the pixel 702(2i−1,j), the pixel 702(2i−1,j+1), the pixel 702(2i,j), and the pixel 702(2i,j+1).

Thus, image data can be supplied to a plurality of pixels. Alternatively, in a period during which one selection signal is supplied, different image data can be supplied to groups of pixels in two rows which are arranged with a scan line provided therebetween and electrically connected to one scan line to which the selection signal is supplied. Furthermore, the number of scan lines can be reduced. Furthermore, on the basis of the image data, a plurality of display elements can be driven. Furthermore, image data can be displayed using the display region. Consequently, a display panel that is highly convenient or reliable can be provided.

<Structure Example 6 of Display Panel>

Figure 32:
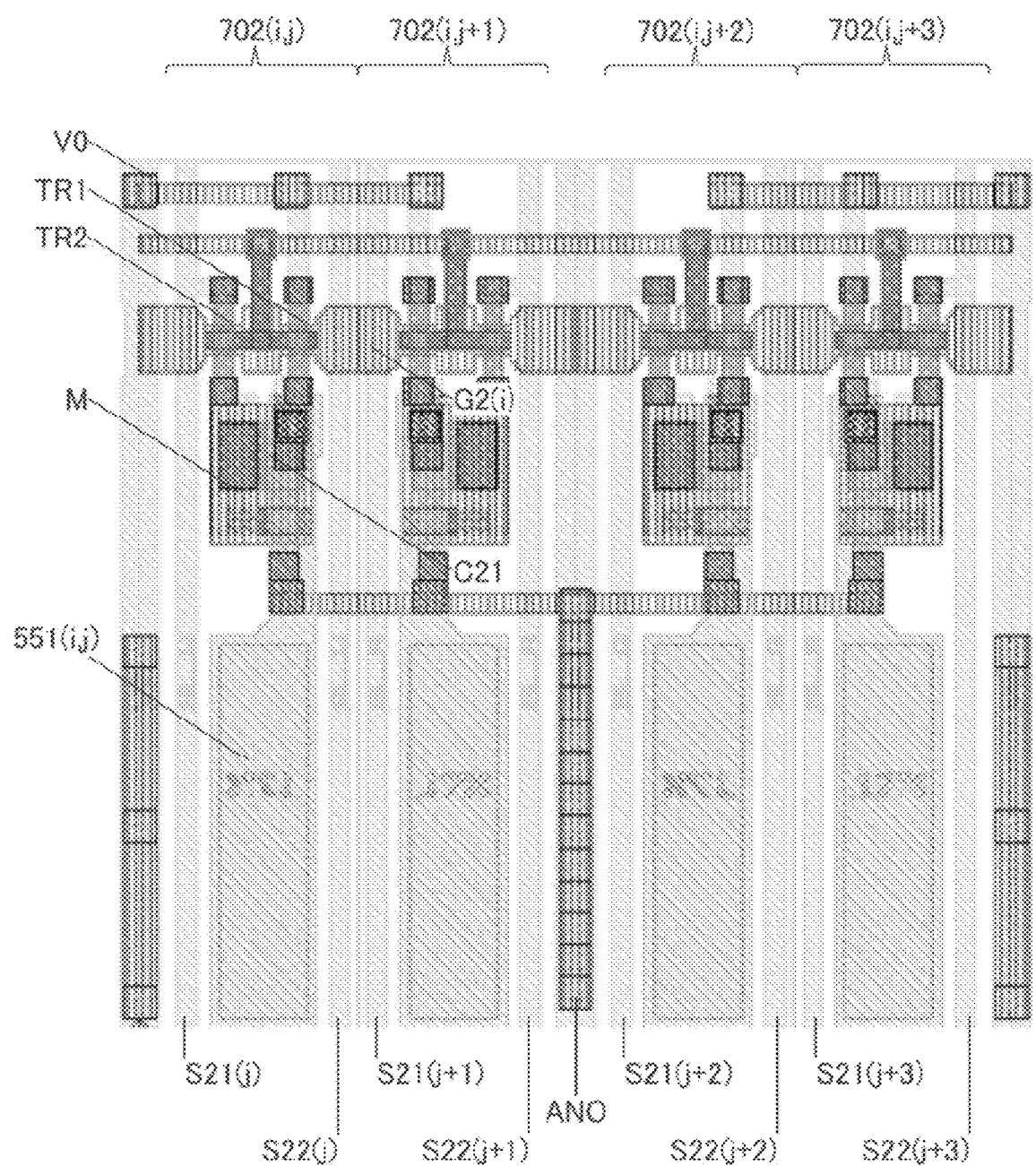
FIG. 32 is a bottom view illustrating a structure of pixels in a display panel of one embodiment.
Figure 33:
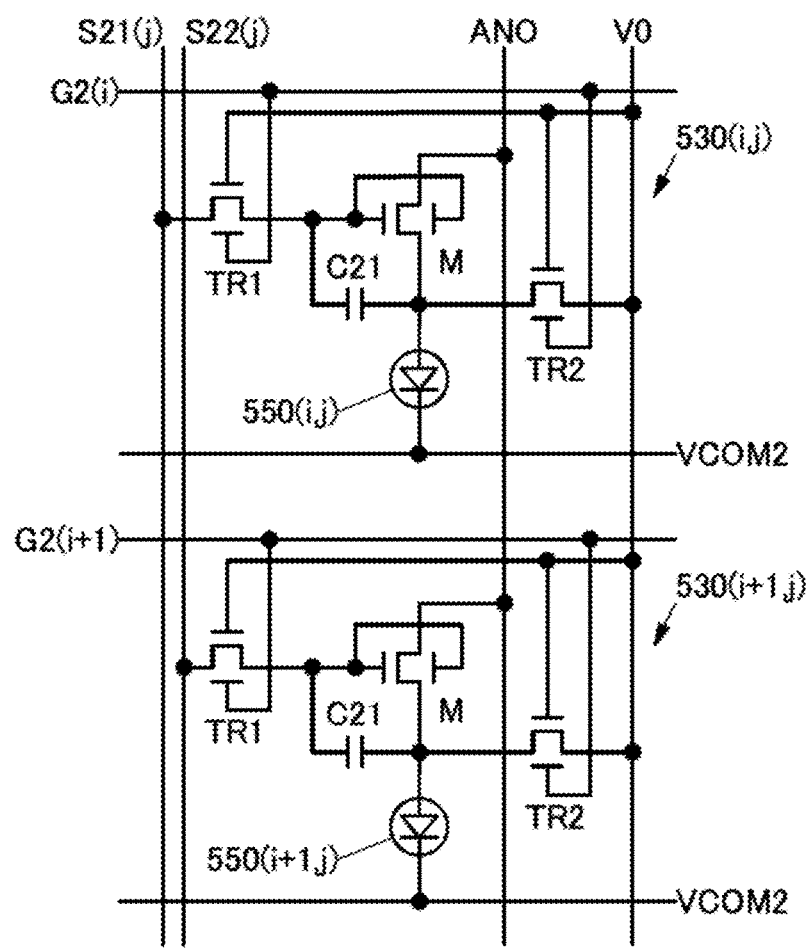
FIG. 33 is a circuit diagram illustrating a pixel circuit in a display panel of one embodiment.

A structure example of a pixel in the display panel described in this embodiment is described with reference to FIG. 32 and FIG. 33. FIG. 32 is a bottom view illustrating the structure of the pixel. FIG. 33 is a circuit diagram illustrating a configuration of a pixel circuit.

The structure example is different from the structure example of the display panel described with reference to FIGS. 26A and 26B in that one conductive film ANO is electrically connected to four pixels arranged in the column direction with the conductive film ANO provided therebetween and that the pixel circuit includes three transistors. Different portions will be described in detail below, and the above description is referred to for the other similar portions.

Accordingly, the area occupied by one conductive film can be reduced. Alternatively, the aperture ratio can be increased. Variations in the electrical characteristics of the transistor can be compensated. Alternatively, display unevenness of the display region can be reduced. Alternatively, a 65-inch diagonal display panel in which 7680 pixels are included in the row direction and 4320 pixels are included in the column direction can be provided. Alternatively, one group of pixels arranged in the column direction can be electrically connected to one signal line. Alternatively, for example, a seamless image can be displayed from an upper side to a lower side of the display region. Note that when a non-light-transmitting material is used, the aperture ratio is 17.4%.

<<Operation Example>>

Table 3 shows a structure example of a pixel in the display panel described in this embodiment. The pixel circuit includes a top-gate transistor. Furthermore, Table 4 shows evaluation results of the operation of a display panel having the structure shown in Table 3 that are obtained using a computer.

TABLE 3

| | |
|---|---|
| Panel size | 65 inch |
| Effective pixels | 7680 × RGBW(H) × 4320(V): 8K |
| Coloring method | White tandem OLED, Bottom emission, Color filter |
| FET | CAC-OS TGSA-FET |
| Gray scale | 12 bit |
| Pixel circuit | 3 transistors, 1 capacitor |
| Gate driver | Integrated circuit connected by COF method |
| Source driver | Integrated circuit connected by COF method |
| Source lines | Two per one column |

TABLE 4

| Source lines | Aperture ratio | Aperture ratio | Frequency | Writing time | One horizontal period | Operation judgement |
|---|---|---|---|---|---|---|
| Two | 17.4% | 21.7% | 60 Hz | 2.76 μs | 7.68 μs | Good |
|  |  |  | 120 Hz | 2.76 μs | 3.84 μs | Good |

From the calculation results, it is found that the display panel favorably operates at a frame rate of 60 Hz. In addition, it is found that the display panel can operate at a frame rate of 120 Hz.

Note that this embodiment can be combined with any of the other embodiments in this specification as appropriate.

Embodiment 4

In this embodiment, the structures of display devices of embodiments of the present invention will be described with reference to FIGS. 8A and 8B and FIGS. 9A to 9B-3.

Figure 8B:
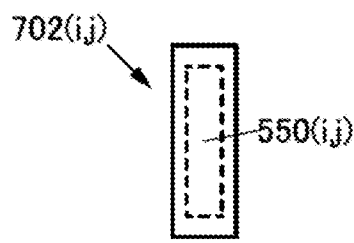

FIG. 8A is a block diagram illustrating the structure of the display device of one embodiment of the present invention. FIG. 8B is a block diagram illustrating the structure of a pixel illustrated in FIG. 8A.

FIG. 9A is a block diagram illustrating a structure different from the structure of the display panel illustrated in FIG. 8A. FIGS. 9B-1 to 9B-3 are external views of display devices of embodiments of the present invention.

<Structure Example of Display Device>

The display device described in this embodiment includes a control portion 238 and the display panel 700 (see FIG. 8A).

<<Control Portion 238>>

The control portion 238 has a function of receiving image data V1 and control data SS.

The control portion 238 has a function of generating data V12 on the basis of the image data V1. The control portion 238 has a function of supplying the data V12. For example, the data V2 includes a gray scale of 12 bits or more.

For example, the control portion 238 includes a decompression circuit 234 and an image processing circuit 235M.

<<Display Panel 700>>

The display panel 700 has a function of receiving the data V12. The display panel 700 includes the pixel 702(i,j). For example, the scan line G2(i) is supplied with a selection signal with a frequency of greater than or equal to 120 Hz.

The pixel 702(i,j) includes the display element 550(i,j) (see FIG. 8B).

The display element 550(i,j) has a function of performing display on the basis of the data V12. The display element 550(i,j) is a light-emitting element.

For example, any of the display panels described in Embodiment 1 can be used as the display panel 700. For example, a television receiver system (see FIG. 9B-1), a video monitor (see FIG. 9B-2), a laptop computer (see FIG. 9B-3), or the like can be provided.

With such a structure, image data can be displayed using the display element. Consequently, a novel display device that is highly convenient or reliable can be provided.

<<Decompression Circuit 234>>

The decompression circuit 234 has a function of decompressing the image data V1 supplied in a compressed state. The decompression circuit 234 includes a memory portion. The memory portion has a function of storing decompressed image data, for example.

<<Image Processing Circuit 235M>>

The image processing circuit 235M includes a region, for example.

The region has a function of storing data contained in the image data V1, for example.

The image processing circuit 235M has a function of generating the data V12 by correcting the image data V1 on the basis of a predetermined characteristic curve and a function of supplying the data V12, for example. Specifically, the image processing circuit 235M has a function of generating the data V12 so that the display element 550(i,j) displays a favorable image.

Note that this embodiment can be combined with any of the other embodiments in this specification as appropriate.

Embodiment 5

In this embodiment, the structure of an input/output device of one embodiment of the present invention will be described with reference to FIG. 10.

Figure 10:
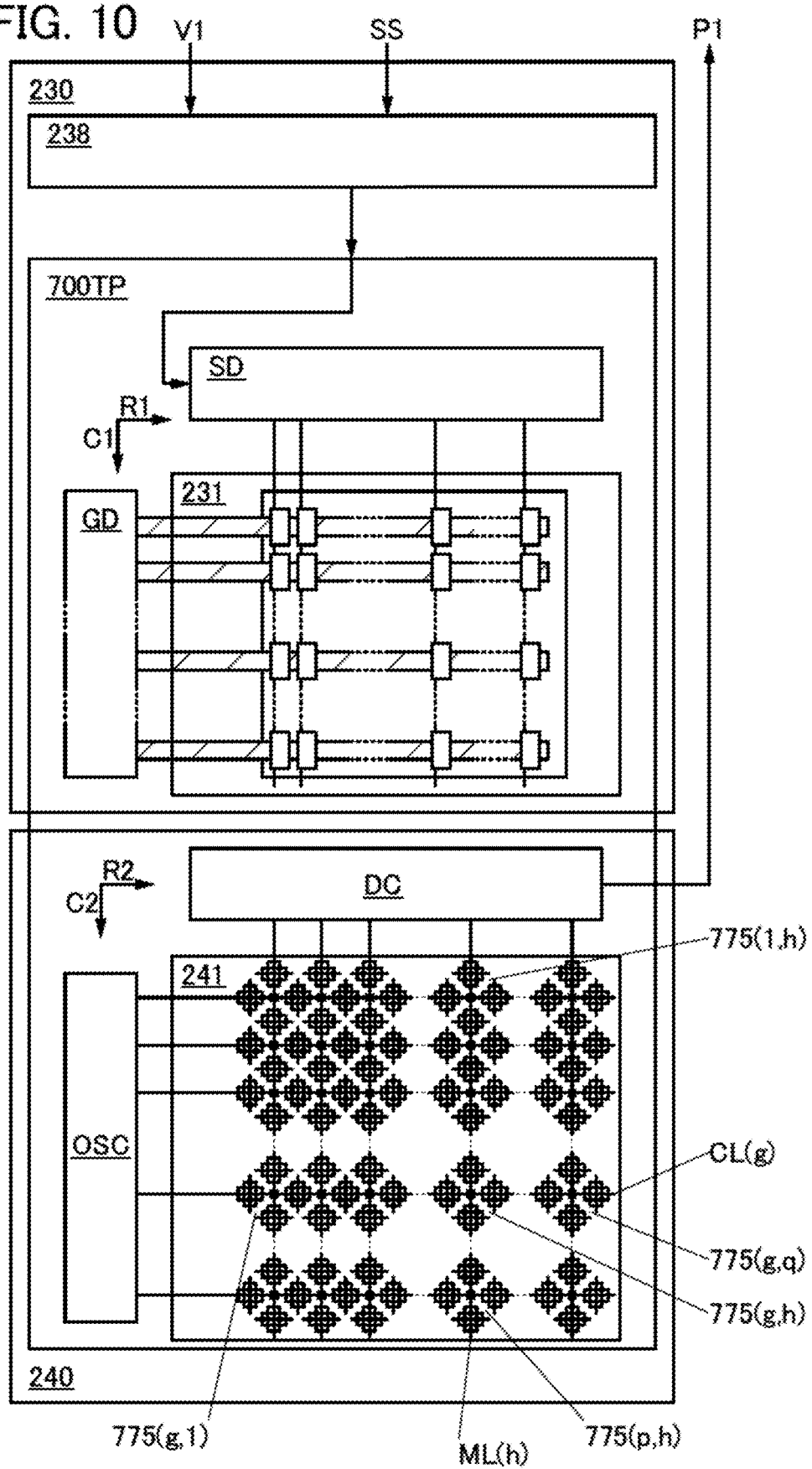
FIG. 10 is a block diagram illustrating a structure of an input/output device of one embodiment.

FIG. 10 is a block diagram illustrating the structure of the input/output device of one embodiment of the present invention.

<Structure Example of Input/Output Device>

The input/output device described in this embodiment includes a display portion 230 and an input portion 240 (see FIG. 10). For example, the display panel 700 described in Embodiment 1 can be used for the display portion 230.

The input portion 240 includes a sensing region 241 and has a function of sensing an object that approaches the sensing region 241.

The sensing region 241 includes a region overlapping with the pixel 702(i,j).

<<Input Portion 240>>

The input portion 240 includes a sensing region 241 and can include an oscillator circuit OSC and a detection circuit DC (see FIG. 10).

<<Sensing Region 241>>

The sensing region 241 can include one or a plurality of sensor elements, a control line, and a sensor signal line, for example.

The sensing region 241 includes one group of sensor elements 775(g,1) to 775(g,q), another group of sensor elements 775(1,h) to 775(p,h), a control line CL(g), and a sensor signal line ML(h) (see FIG. 10). Note that g is an integer greater than or equal to 1 and less than or equal to p, h is an integer greater than or equal to 1 and less than or equal to q, and each of p and q is an integer greater than or equal to 1.

The one group of sensor elements 775(g,1) to 775(g,q) include the sensor element 775(g,h) and are arranged in the row direction (indicated by the arrow R2 in the drawing). Note that the direction indicated by the arrow R2 in FIG. 10 may be the same as or different from the direction indicated by the arrow R1 in FIG. 10.

The another group of sensor elements 775(1,h) to 775(p,h) include the sensor element 775(g,h) and are provided in the column direction (indicated by the arrow C2 in the drawing) that intersects the row direction.

The control line CL(g) is electrically connected to the one group of sensor elements $775(g,1)$ to $775(g,q)$ provided in the row direction.

The sensor signal line ML(h) is electrically connected to the another group of sensor elements $775(1,h)$ to $775(p,h)$ provided in the column direction.

<<Sensor Element>>

A sensor element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensor element.

Alternatively, a plurality of kinds of sensor elements can be used in combination. For example, a sensor element that senses a finger and a sensor element that senses a stylus pen can be used in combination. This allows determination of the kind of a pointer. Alternatively, an instruction can be associated with sensing data depending on the kind of a pointer. Specifically, in the case where it is determined that a finger is used as a pointer, sensing data can be associated with a gesture. In the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with any of the other embodiments in this specification as appropriate.

Embodiment 6

In this embodiment, the structure of a data processing device of one embodiment of the present invention will be described with reference to FIGS. 11A to 11C, FIGS. 12A and 12B, and FIGS. 13A and 13B.

Figure 11B:
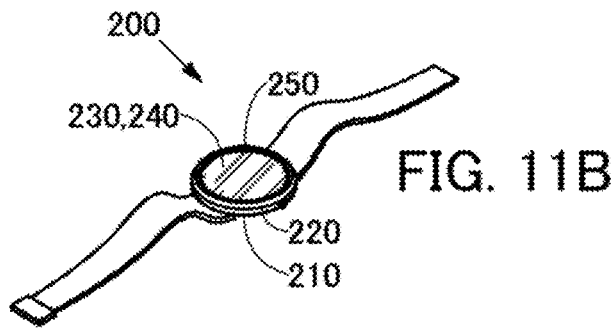
Figure 11C:
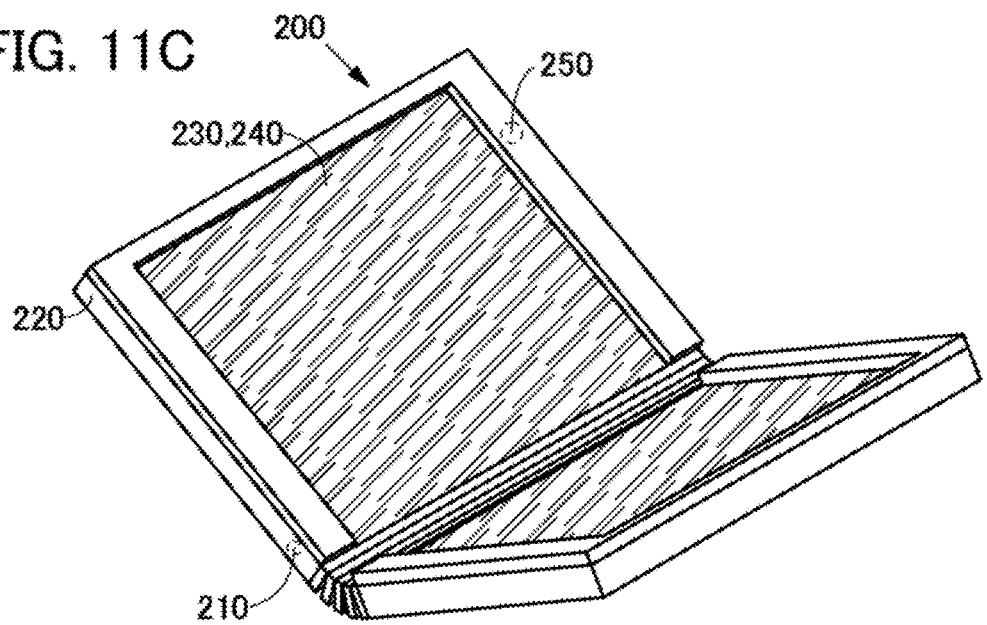

FIG. 11A is a block diagram illustrating the structure of the data processing device of one embodiment of the present invention. FIGS. 11B and 11C are projection views each illustrating an example of an external view of the data processing device 200.

Figure 12A:
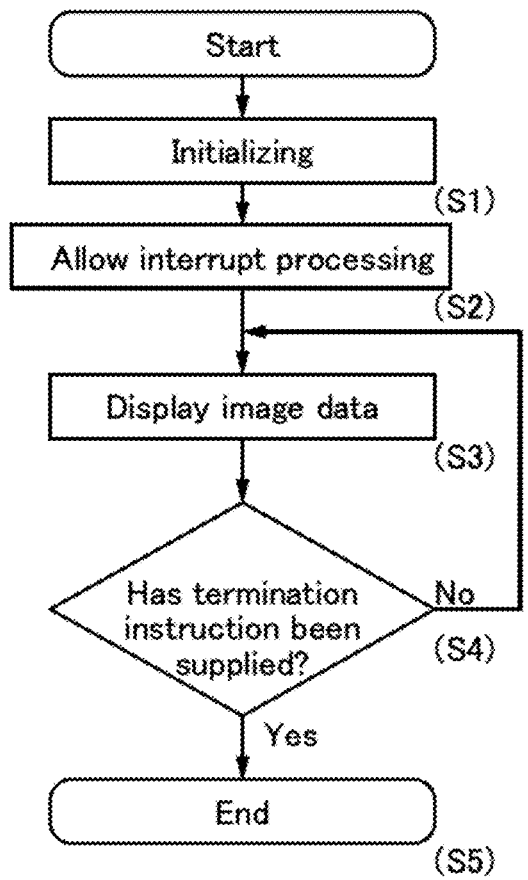
FIGS. 12A and 12B are flow charts showing a method for driving a data processing device of one embodiment.
Figure 12B:
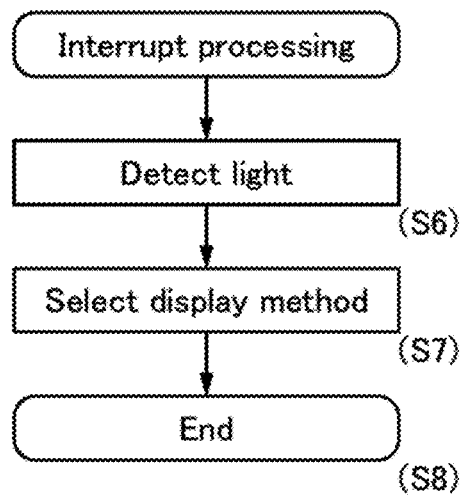

FIGS. 12A and 12B are flow charts showing a program of one embodiment of the present invention. FIG. 12A is a flow chart showing main processing of the program of one embodiment of the present invention. FIG. 12B is a flow chart showing interrupt processing.

Figure 13A:
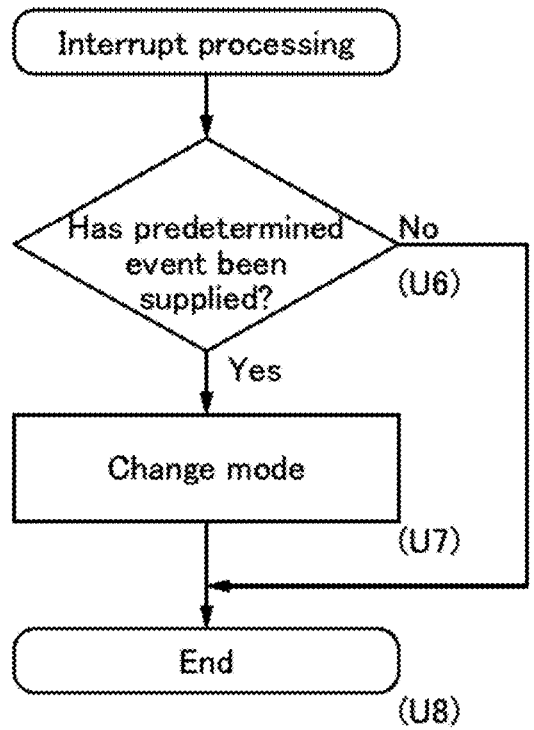
FIGS. 13A and 13B are a flow chart and a timing chart illustrating a method for driving a data processing device of one embodiment.
Figure 13B:
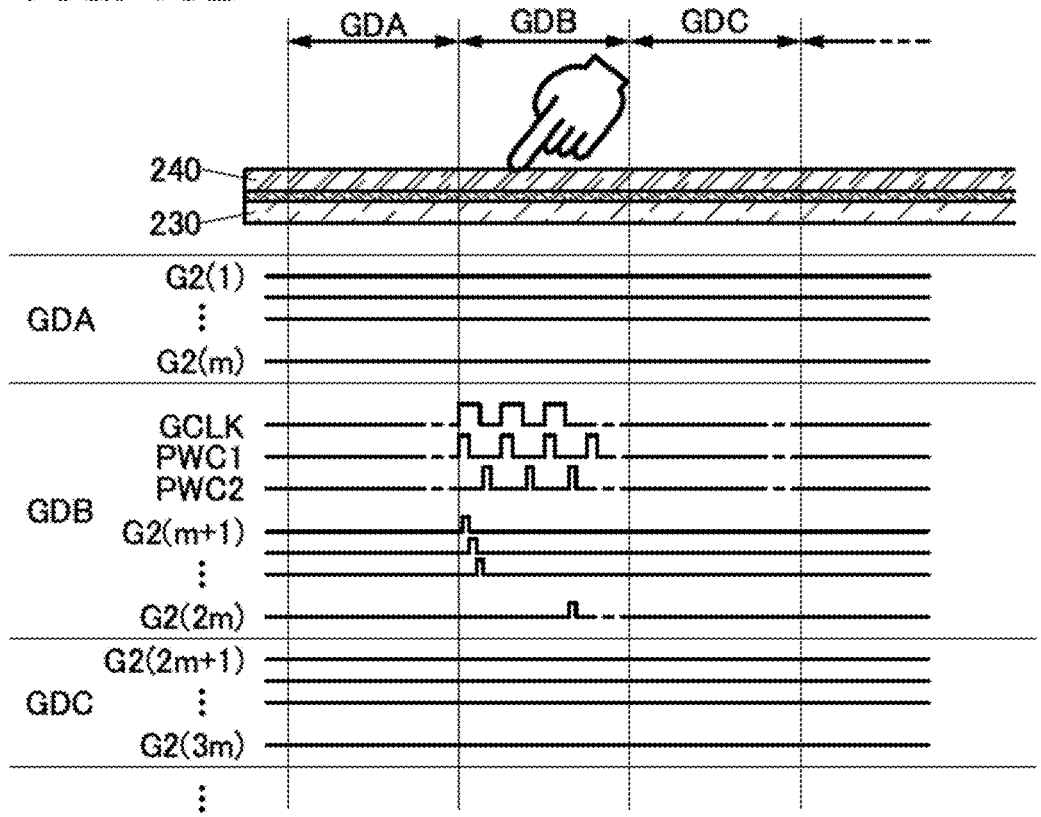

FIGS. 13A and 13B illustrate the program of one embodiment of the present invention. FIG. 13A is a flow chart showing interrupt processing of the program of one embodiment of the present invention. FIG. 13B is a timing chart showing the operation of the data processing device of one embodiment of the present invention.

<Structure Example 1 of Data Processing Device>

The data processing device 200 described in this embodiment includes an input/output device 220 and an arithmetic device 210 (see FIG. 11A). The input/output device 220 is electrically connected to the arithmetic device 210. Furthermore, the data processing device 200 can include a housing (see FIG. 11B or 11C).

The input/output device 220 includes the display portion 230 and the input portion 240 (see FIG. 11A). The input/output device 220 includes a sensor portion 250. The input/output device 220 can include a communication portion 290.

The input/output device 220 has a function of receiving the image data V1 or the control data SS and a function of supplying the positional data P1 or sensing data S1.

The arithmetic device 210 has a function of receiving the positional data P1 or the sensing data S1. The arithmetic device 210 has a function of supplying the image data V1. The arithmetic device 210 has a function of operating on the basis of the positional data P1 or the sensing data S1.

Note that the housing has a function of housing the input/output device 220 or the arithmetic device 210. Alternatively, the housing has a function of supporting the display portion 230 or the arithmetic device 210.

The display portion 230 has a function of displaying an image on the basis of the image data V1. The display portion 230 has a function of displaying an image on the basis of the control data SS.

The input portion 240 has a function of supplying the positional data P1.

The sensor portion 250 has a function of supplying the sensing data S1. The sensor portion 250 has a function of sensing the illuminance of the environment where the data processing device 200 is used and a function of supplying illuminance data, for example.

Thus, the data processing device can determine the intensity of light received by the housing of the data processing device and operate in a usage environment. Alternatively, a user of the data processing device can select a display method. Consequently, a novel data processing device with high convenience or high reliability can be provided.

Individual components included in the data processing device will be described below. Note that these components cannot be clearly distinguished from each other and one component may also serve as another component or include part of another component. For example, a touch panel in which a touch sensor is provided to overlap with a display panel serves as an input portion as well as a display portion.

<<Structure Example>>

The data processing device 200 of one embodiment of the present invention includes a housing or the arithmetic device 210.

The arithmetic device 210 includes an arithmetic portion 211, a memory portion 212, a transmission path 214, and an input/output interface 215.

The data processing device of one embodiment of the present invention includes the input/output device 220.

The input/output device 220 includes the display portion 230, the input portion 240, the sensor portion 250, and the communication portion 290.

<<Data Processing Device>>

The data processing device of one embodiment of the present invention includes the arithmetic device 210 and the input/output device 220.

<<Arithmetic Device 210>>

The arithmetic device 210 includes the arithmetic portion 211 and the memory portion 212. The arithmetic device 210 also includes the transmission path 214 and the input/output interface 215.

<<Arithmetic Portion 211>>

The arithmetic portion 211 has a function of executing a program, for example.

<<Memory Portion 212>>

The memory portion 212 has a function of, for example, storing a program executed by the arithmetic portion 211, initial data, setting data, an image, or the like.

Specifically, a hard disk, a flash memory, a memory including a transistor including an oxide semiconductor, or the like can be used for the memory portion 212.

<<Input/Output Interface 215 and Transmission Path 214>>

The input/output interface 215 includes a terminal or a wiring and has a function of supplying and receiving data. The input/output interface 215 can be electrically connected to the transmission path 214 and the input/output device 220.

The transmission path 214 includes a wiring and has a function of supplying and receiving data. For example, the transmission path 214 can be electrically connected to the input/output interface 215. In addition, the transmission path 214 can be electrically connected to the arithmetic portion 211 or the memory portion 212.

<<Input/Output Device 220>>

The input/output device 220 includes the display portion 230, the input portion 240, the sensor portion 250, and the communication portion 290. For example, the input/output device described in Embodiment 5 can be used. In that case, power consumption can be reduced.

<<Display Portion 230>>

The display portion 230 includes the control portion 238, the driver circuit GD, the driver circuit SD, and the display panel 700 (see FIG. 8A). For example, any of the display devices described in Embodiment 4 can be used for the display portion 230.

<<Input Portion 240>>

Any of a variety of human interfaces or the like can be used as the input portion 240 (see FIGS. 11A to 11C).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel or a touch screen.

For example, a user can make various gestures (e.g., tap, drag, swipe, and pinch in) using his/her finger as a pointer on the touch panel.

The arithmetic device 210, for example, analyzes data on the position, track, or the like of the finger on the touch panel and determines that a specific gesture is supplied when the analysis results meet predetermined conditions. Therefore, the user can supply a certain operation instruction associated with a predetermined gesture by using the gesture.

For instance, the user can supply a "scrolling instruction" for changing a portion where image data is displayed by using a gesture of touching and moving his/her finger on the touch panel.

<<Sensor Portion 250>>

The sensor portion 250 has a function of sensing the ambient conditions and supplying the sensing data. Specifically, the sensor portion 250 can supply illuminance data, attitude data, pressure data, positional data, and the like.

For example, a photosensor, an attitude sensor, an acceleration sensor, a direction sensor, a global positioning system (GPS) signal receiving circuit, a pressure sensor, a temperature sensor, a humidity sensor, a camera, or the like can be used as the sensor portion 250.

<<Communication Portion 290>>

The communication portion 290 has a function of supplying and acquiring data to/from a network.

<<Program>>

The program of one embodiment of the present invention has the following steps (see FIG. 12A).

[First Step]

In a first step, setting is initialized (see S1 in FIG. 12A).

For example, predetermined image data which is to be displayed on start-up and data for determining a predetermined mode of displaying the image data and a predetermined method of displaying the image data are acquired from the memory portion 212. Specifically, still image data or moving image data can be used as the predetermined image data. Furthermore, a first mode or a second mode can be used as the predetermined mode.

[Second Step]

In a second step, interrupt processing is allowed (see S2 in FIG. 12A). Note that an arithmetic device allowed to execute the interrupt processing can perform the interrupt processing in parallel with the main processing. The arithmetic device which has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is ready to be executed after the program is started up.

[Third Step]

In a third step, image data is displayed in a predetermined mode or a predetermined display method selected in the first step or the interrupt processing (see S3 in FIG. 12A). Note that the predetermined mode identifies a mode for displaying the data, and the predetermined display method identifies a method for displaying image data. For example, the image data V1 or the data V12 can be used for data to be displayed.

For example, a method for displaying the image data V1 can be associated with the first mode. Another method for displaying the image data V1 can be associated with the second mode. Thus, a display method can be selected on the basis of the selected mode.

<<First Mode>>

Specifically, a method of supplying selection signals to a scan line at a frequency of 30 Hz or more, preferably 60 Hz or more, and performing display in accordance with the selection signals can be associated with the first mode.

For example, the supply of selection signals at a frequency of 30 Hz or more, preferably 60 Hz or more, can display a smooth moving image.

For example, an image is refreshed at a frequency of 30 Hz or more, preferably 60 Hz or more, so that an image smoothly following the user's operation can be displayed on the data processing device 200 the user operates.

<<Second Mode>>

Specifically, a method of supplying selection signals to a scan line at a frequency of less than 30 Hz, preferably less than 1 Hz, further preferably less than once a minute and performing display in accordance with the selection signals can be associated with the second mode.

The supply of selection signals at a frequency of less than 30 Hz, preferably less than 1 Hz, more preferably less than once a minute, can perform display with flickering reduced. Furthermore, power consumption can be reduced.

For example, when the data processing device 200 is used for a clock or watch, the display can be refreshed at a frequency of once a second, once a minute, or the like.

For example, when a light-emitting element is used as the display element, the light-emitting element can be made to emit light in a pulsed manner so as to display image data. Specifically, an organic EL element can be made to emit light in a pulsed manner, and its afterglow can be used to display image data. An organic EL element has excellent frequency characteristics; therefore, time for driving the light-emitting element can be shortened and thus power consumption can be reduced in some cases. Alternatively, heat generation can be inhibited, and thus the deterioration of the light-emitting element can be suppressed in some cases.

[Fourth Step]

In a fourth step, the next step is determined as follows: a fifth step is selected when a termination instruction has been supplied, whereas the third step is selected when the termination instruction has not been supplied (see S4 in FIG. 12A).

For example, the termination instruction supplied in the interrupt processing can be used to determine the next step.

[Fifth Step]

In the fifth step, the program terminates (see S5 in FIG. 12A).

<<Interrupt Processing>>

The interrupt processing includes sixth to eighth steps described below (see FIG. 12B).

[Sixth Step]

In the sixth step, the illuminance of the environment where the data processing device 200 is used can be sensed using the sensor portion 250, for example (see S6 in FIG. 12B). Note that the color temperature or chromaticity of ambient light can be sensed instead of the illuminance of the environment.

[Seventh Step]

In the seventh step, a display method is determined on the basis of the sensed illuminance data (see S7 in FIG. 12B). For example, a display method is determined so that the brightness of display is not too bright or too dark.

In the case where color temperature or chromaticity of the ambient light is sensed in the sixth step, the color of display may be adjusted.

[Eighth Step]

In the eighth step, the interrupt processing terminates (see S8 in FIG. 12B).

<Structure Example 2 of Data Processing Device>

Another structure of the data processing device of one embodiment of the present invention will be described with reference to FIGS. 13A and 13B.

FIG. 13A is a flow chart showing a program of one embodiment of the present invention. The interrupt processing in the flow chart in FIG. 13A is different from that in FIG. 12B.

Note that Structure example 3 of the data processing device is different from the interrupt processing in FIG. 12B in that the interrupt processing includes a step in which a mode is changed on the basis of a supplied predetermined event. Different structures will be described in detail below, and the above description is referred to for the similar portions.

<<Interrupt Processing>>

The interrupt processing includes sixth to eighth steps described below (see FIG. 13A).

[Sixth Step]

In the sixth step, the processing proceeds to the seventh step when a predetermined event has been supplied, whereas the processing proceeds to the eighth step when the predetermined event has not been supplied (see U6 in FIG. 13A). For example, whether the predetermined event is supplied in a predetermined period or not can be a branch condition. Specifically, the predetermined period can be longer than 0 seconds and shorter than or equal to 5 seconds, preferably shorter than or equal to 1 second, more preferably shorter than or equal to 0.5 seconds, still more preferably shorter than or equal to 0.1 seconds.

[Seventh Step]

In the seventh step, the mode is changed (see U7 in FIG. 13A). Specifically, the mode is changed to the second mode when the first mode has been selected, or the mode is changed to the first mode when the second mode has been selected.

For example, a display mode of part of a region in the display portion 230 can be changed. Specifically, a display mode of a region where one driver circuit in the display portion 230 including the driver circuit GDA, the driver circuit GDB, and a driver circuit GDC supplies a selection signal can be changed (see FIG. 13B).

For example, when a predetermined event is supplied to the input portion 240 in a region overlapping with a region to which the driver circuit GDB supplies a selection signal, a display mode of the region to which the driver circuit GDB supplies a selection signal can be changed. Specifically, in accordance with an event supplied to a touch panel with a finger or the like (e.g., "tap"), the frequency of the selection signal supplied by the driver circuit GDB can be changed. Thus, for example, the driver circuit GDB can supply a selection signal without supplying a selection signal by the driver circuits GDA and GDC. Furthermore, display of a region to which a selection signal is supplied by the driver circuit GDB can be refreshed without changing display of regions to which selection signals are supplied by the driver circuits GDA, GDC, and GDD. Furthermore, power consumed by the driver circuit can be reduced.

[Eighth Step]

In the eighth step, the interrupt processing terminates (see U8 in FIG. 13A). Note that in a period in which the main processing is executed, the interrupt processing may be repeatedly executed.

<<Predetermined Event>>

For example, the following events can be used: events supplied using a pointing device such as a mouse (e.g., "click" and "drag") and events supplied to a touch panel with a finger or the like used as a pointer (e.g., "tap", "drag", and "swipe").

For example, the position of a slide bar pointed by a pointer, the swipe speed, and the drag speed can be used as parameters assigned to various instructions. Furthermore, for example, the position of a slide bar pointed by a pointer, the swipe speed, and the drag speed can be used as parameters assigned to an instruction associated with a predetermined event.

For example, data sensed by the sensor portion 250 is compared to a predetermined threshold value, and the compared results can be used for the event.

Specifically, a pressure sensor or the like in contact with a button or the like that can be pushed in a housing can be used as the sensor portion 250.

<<Instruction Associated with Predetermined Event>>

For example, the termination instruction can be associated with a predetermined event.

For example, "page-turning instruction" for switching displayed image data from one to another can be associated with a predetermined event. Note that a parameter for determining the page-turning speed or the like when the "page-turning instruction" is executed can be supplied using the predetermined event.

For example, "scroll instruction" for moving the display position of part of image data and displaying another part continuing from that part can be associated with a predetermined event. Note that a parameter for determining the moving speed of the display position, or the like, when the "scroll instruction" is executed can be supplied using the predetermined event.

For example, an instruction for setting the display method or an instruction for generating image data can be associated with a predetermined event. Note that a parameter for determining the brightness of a generated image can be associated with a predetermined event. Note that a parameter for determining the brightness of a generated image may be determined on the basis of ambient brightness sensed by the sensor portion 250.

For example, an instruction for acquiring data distributed via a push service using the communication portion 290 can be associated with a predetermined event.

Note that positional data sensed by the sensor portion 250 may be used for the determination of the presence or absence of a qualification for acquiring data. Specifically, it may be determined that there is a qualification for acquiring data when a user is in a predetermined class room, school conference room, office, building, or the like. For example, educational materials can be fed from a classroom of a school or a university, so that the data processing device 200 can be used as a schoolbook or the like (see FIG. 11C). Alternatively, materials distributed from a conference room in, for example, a company can be received and used for a conference material.

Note that this embodiment can be combined with any of the other embodiments in this specification as appropriate.

Embodiment 7

In this embodiment, a method for manufacturing the display panel of one embodiment of the present invention will be described with reference to FIG. 14, FIG. 15, FIGS. 16A to 16C, FIGS. 17A to 17C, FIGS. 18A to 18D, FIGS. 19A to 19C, FIGS. 20A to 20C, and FIGS. 21A to 21C.

Figure 14:
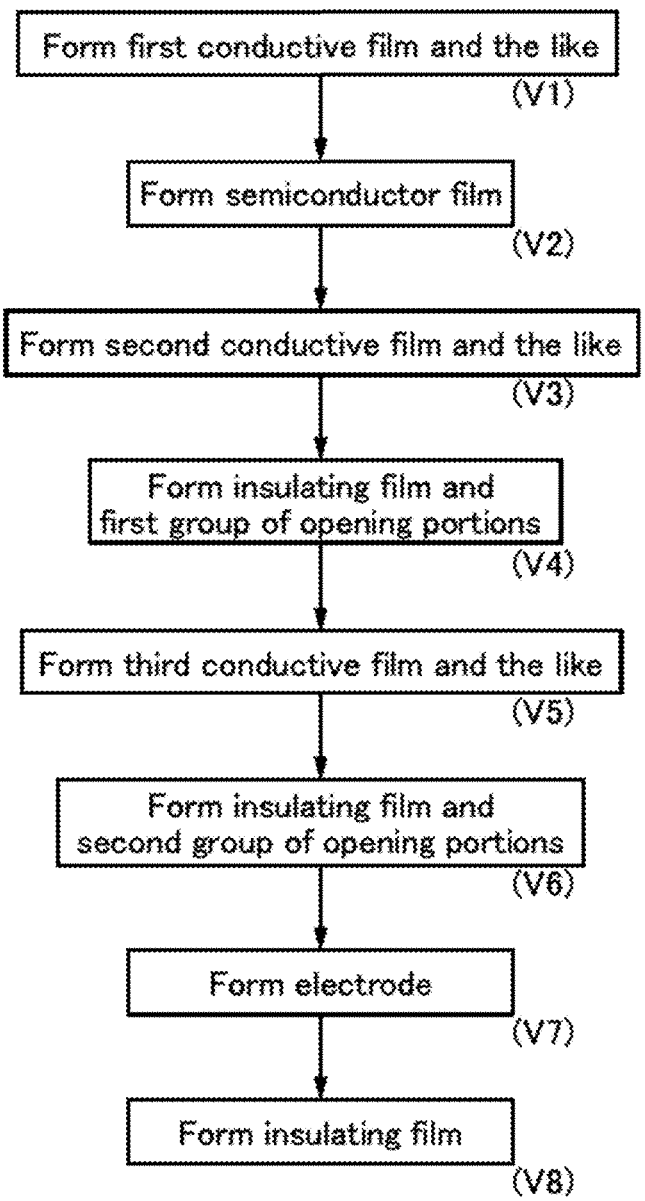
FIG. 14 is a flow chart illustrating a method for manufacturing a display panel of one embodiment.
Figure 15:
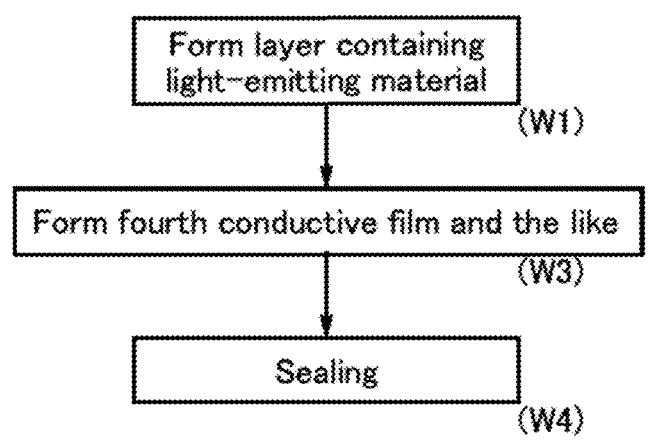
FIG. 15 is a flow chart illustrating a method for manufacturing a display panel of one embodiment.

FIG. 14 and FIG. 15 are flow charts showing a manufacturing method of the display panel of one embodiment of the present invention. FIG. 14 is a flow chart showing a method for forming the functional layer 520 over the base 510. FIG. 15 is a flow chart showing a method for forming a display element over the functional layer 520 to form a display panel.

FIGS. 16A to 16C, FIGS. 17A to 17C, FIGS. 18A to 18D, FIGS. 19A to 19C, FIGS. 20A to 20C, and FIGS. 21A to 21C each illustrate the structure of the display panel of one embodiment of the present invention in a manufacturing process. FIGS. 16A to 16C, FIGS. 18A to 18D, and FIGS. 20A to 20C are cross-sectional views taken along lines X1-X2 and X3-X4 in FIG. 1A and line X5-X6 in FIG. 4. FIGS. 17A to 17C, FIGS. 19A to 19C, and FIGS. 21A to 21C are cross-sectional views taken along line X7-X8 in FIG. 4 and line X9-X10 in FIG. 1A.

<Method for Manufacturing Display Panel>

A method for manufacturing a display panel described in this embodiment includes the following steps.

[First Step]

Figure 17A:
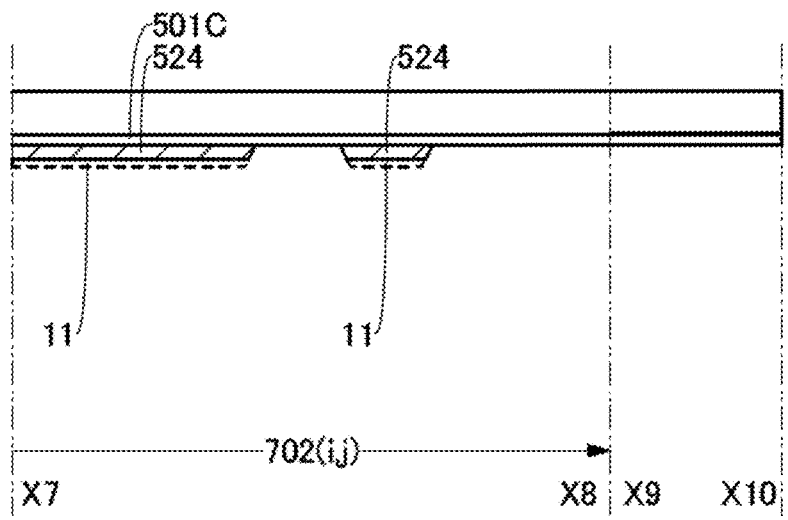
FIGS. 17A to 17C are cross-sectional views illustrating a method for manufacturing a display panel of one embodiment.

In the first step, a first conductive film and the like are formed (see V1 in FIG. 14, FIG. 16A, and FIG. 17A).

For example, the insulating film 501C is formed over the base 510, and a light-transmitting conductive film and a metal film are formed over the insulating film 501C.

Next, a resist mask 11 including a thin region is formed using a first photomask. Specifically, a gray tone mask, a half tone mask, or the like and a photosensitive resin are used. Thus, for example, in a positive photosensitive resin, regions with the different amount of light exposure can be formed, or the resist mask 11 including regions with different thicknesses can be formed with one photomask.

Then, with the resist mask 11, the light-transmitting conductive film and the metal film are processed into desired shapes.

Then, the resist mask 11 is changed in shape to form a resist mask 12. Specifically, a thin region is removed by an ashing method or the like. Thus, the shape of the resist mask can be changed.

Next, with the resist mask 12, a metal film exposed from the resist mask 12 is processed into a desired shape to form a conductive film 524B and a conductive film 524. Thus, with one photomask, a wiring including a metal film, a light-transmitting wiring, and the like can be formed. Furthermore, the number of photomasks can be reduced.

[Second Step]

Figure 17B:
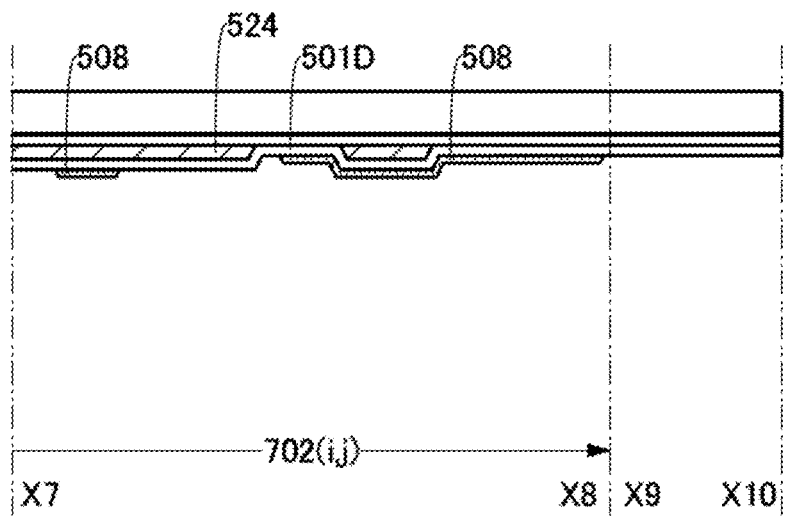

In the second step, a semiconductor film 508 is formed (see V2 in FIG. 14, FIG. 16B, and FIG. 17B).

For example, the insulating film 501D is formed over the conductive film 524 and the like, and a semiconductor film is formed over the insulating film 501D. Specifically, the semiconductor film can be formed by a sputtering method in which an In—Ga—Zn oxide is used as a target.

Then, a resist mask is formed using a second photomask. With the resist mask, the semiconductor film is processed into a desired shape to form the semiconductor film 508.

[Third Step]

Figure 17C:
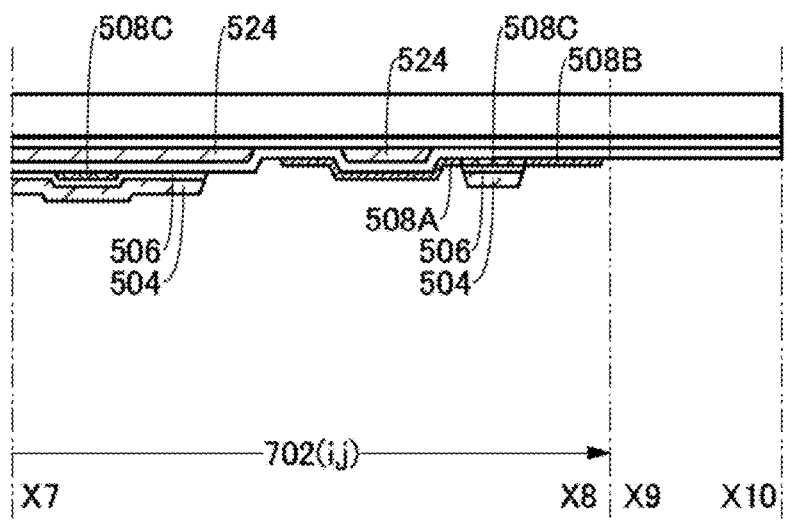

In the third step, a second conductive film and the like are formed (see V3 in FIG. 14, FIG. 16C, and FIG. 17C).

For example, an insulating film is formed over the semiconductor film 508 and the like, and a conductive film is formed over the insulating film.

Then, a resist mask is formed using a third photomask. With the resist mask, the conductive film and the insulating film are processed into desired shapes to form the conductive film 504 and the insulating film 506. Note that the external shape of the insulating film 506 is the same as the external shape of the conductive film 504 in a self-aligned manner.

Next, the first region 508A and the second region 508B are formed in the semiconductor film 508. The first region 508A and the second region 508B can be formed using a method for performing plasma treatment on the semiconductor film 508 or a method for adding impurities using an ion implantation method, an ion doping method, or the like. Specifically, regions in the semiconductor film 508, which are exposed to argon plasma, can be the first region 508A and the second region 508B. Note that a region in the semiconductor film 508, which overlap with the insulating film 506, is not exposed to argon plasma. Thus, the region 508C can be formed.

[Fourth Step]

Figure 18A:
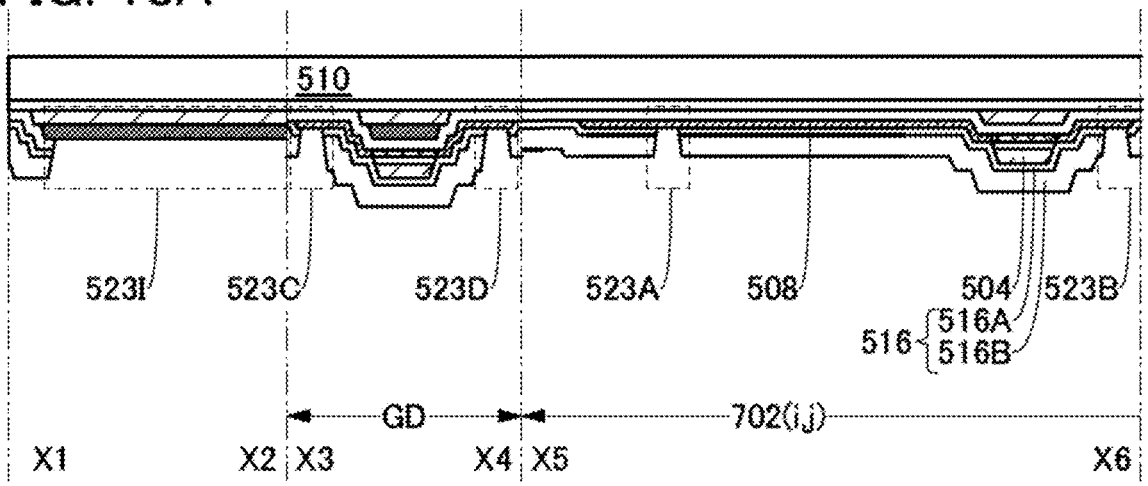
FIGS. 18A to 18D are cross-sectional views illustrating a method for manufacturing a display panel of one embodiment.

In the fourth step, the insulating film 516, a first group of opening portions, and the like are formed (see V4 in FIG. 14, FIG. 18A, and FIG. 19A).

For example, an insulating film is formed over the conductive film 524 and the like.

Then, a resist mask is formed using a fourth photomask. With the resist mask, the insulating film is processed into a desired shape to form the insulating film 516. For example, opening portions 523A, 523B, 523C, 523D, 523E, 523F, 523G, 523H, and 523I are formed in the insulating film.

For example, an insulating film in which the insulating film 516A and the insulating film 516B are stacked can be used as the insulating film 516.

[Fifth Step]

Figure 18B:
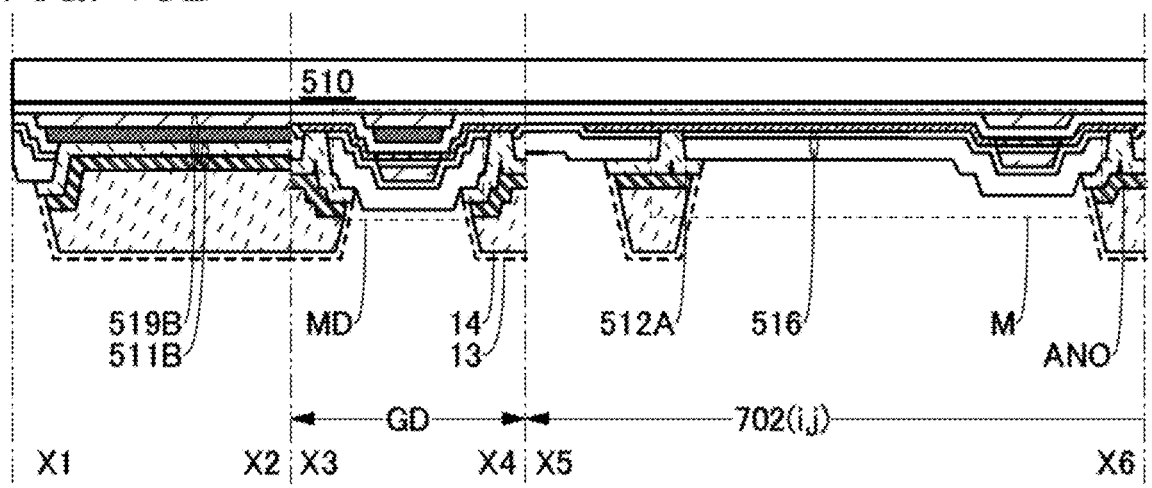
Figure 18C:
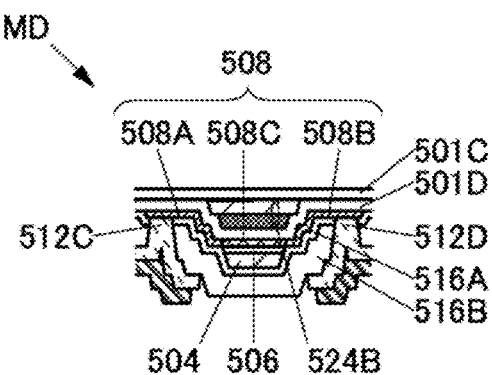
Figure 18D:
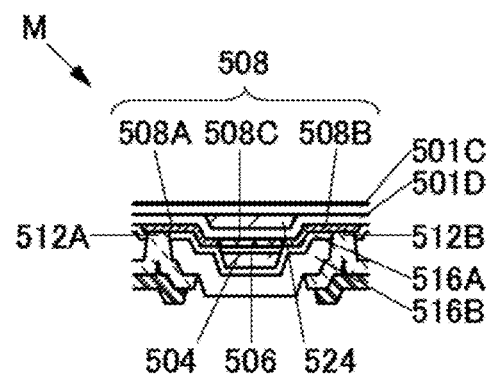

In the fifth step, a third conductive film and the like are formed (see V5 in FIG. 14, FIG. 18B, FIG. 18C. FIG. 19B, and FIG. 19C).

For example, a light-transmitting conductive film and metal film are formed over the insulating film 516.

Next, a resist mask 13 including a thin region is formed using a fifth photomask. Specifically, a gray tone mask, a half tone mask, or the like and a photosensitive resin are used. Thus, for example, in a positive photosensitive resin, regions with the different amount of light exposure can be formed, or the resist mask 13 including a thin region can be formed with one photomask.

Then, with the resist mask 13, the light-transmitting conductive film and the metal film are processed into desired shapes.

Then, the resist mask 13 is changed in shape to form a resist mask 14. Specifically, a thin region is removed by an ashing method or the like. Thus, the shape of the resist mask can be changed.

Next, with the resist mask 14, a conductive film 512A, a conductive film 512B, a conductive film 512C, a conductive film 512D, a conductive film 512E, and a conductive film 512F are formed. Thus, with one photomask, a wiring including a metal film, a light-transmitting wiring, and the like can be formed. Furthermore, the number of photomasks can be reduced.

[Sixth Step]

Figure 20A:
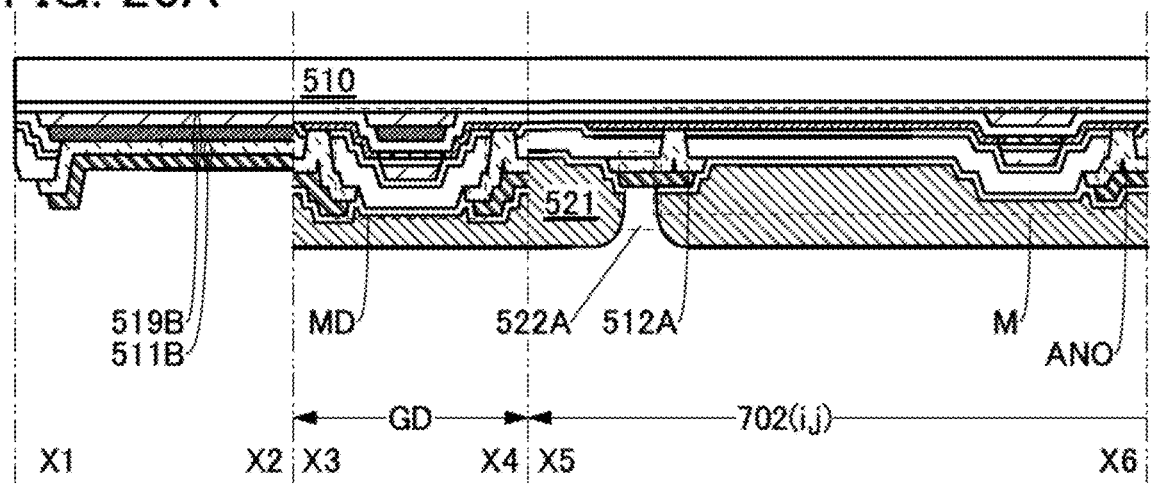
FIGS. 20A to 20C are cross-sectional views illustrating a method for manufacturing a display panel of one embodiment.
Figure 21A:
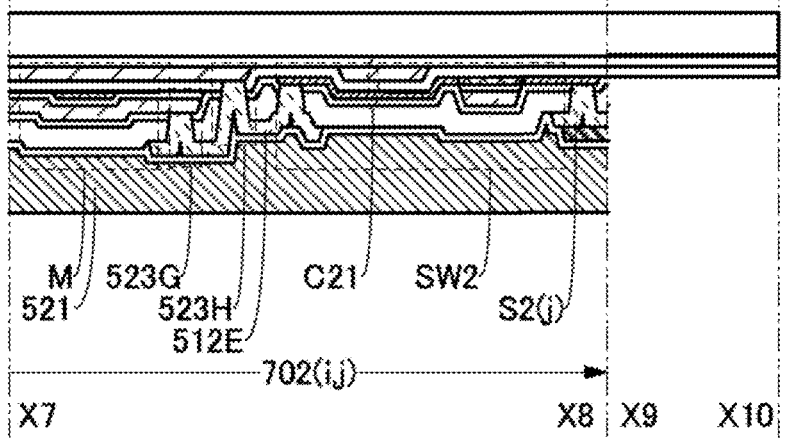
FIGS. 21A to 21C are cross-sectional views illustrating a method for manufacturing a display panel of one embodiment.

In the sixth step, the insulating film 518, the insulating film 521, and a second group of opening portions are formed (see V6 in FIG. 14, FIG. 20A, and FIG. 21A).

For example, the insulating film 518 is formed over the conductive film 512A, the conductive film 512E, and the like. Then, the insulating film 521 is formed over the insulating film 518. Specifically, with a sixth photomask and a photosensitive resin, the insulating film 521 including the opening portion 522A(1) is formed (see FIG. 7A).

Next, with the use of the insulating film 521 as a mask, the opening portion 522A(2) is formed in the insulating film 518. Thus, with one photomask, the insulating film 521 including the opening portion 522A(1) and the insulating film 518 including the opening portion 522A(2) can be formed. Furthermore, the number of photomasks can be reduced.

For example, the insulating film 521 can be formed using a resin containing a coloring material. Specifically, the insulating film 521 of the pixel 702($i,j$) which displays red can be formed using a resin containing a material transmitting red light, the insulating film 521 of the pixel 702($i,j$+1) which displays green can be formed using a resin containing a material transmitting green light, and the insulating film 521 of the pixel 702($i,j$+2) which displays blue can be formed using a resin containing a material transmitting blue light. Thus, the insulating film 521 can be used as a color filter. Furthermore, the photomask for forming the insulating film 521 can be used as part of a photomask for forming a color filter. Specifically, with three photomasks, three kinds of insulating films 518 which transmit light of different colors can be formed. Furthermore, the number of photomasks can be reduced.

[Seventh Step]

Figure 20B:
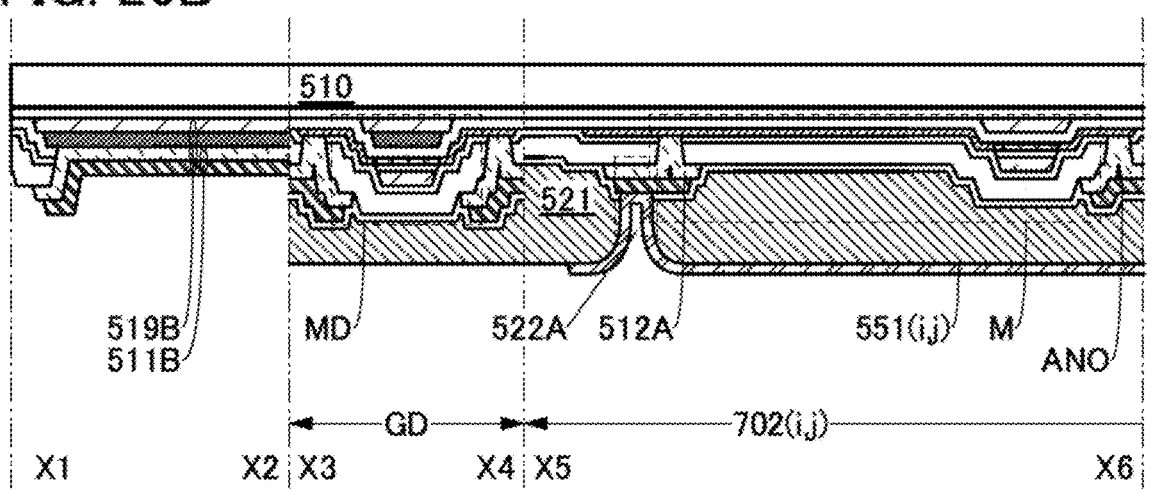
Figure 21B:
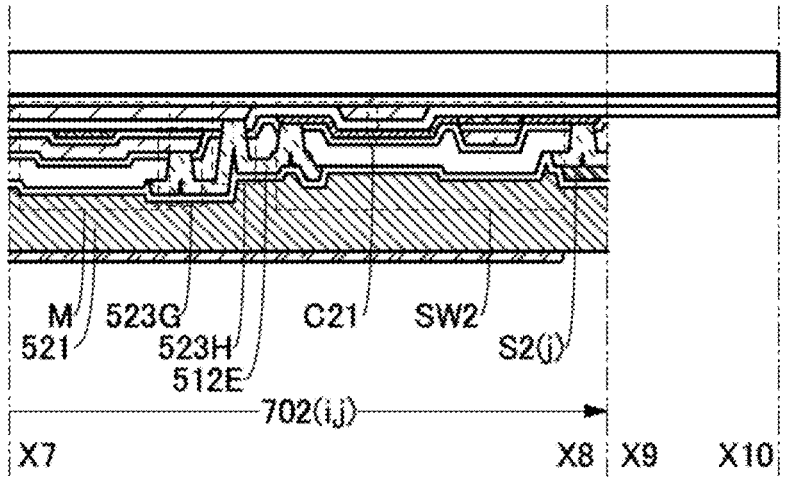

In the seventh step, the electrode 551($i,j$) is formed (see V7 in FIG. 14, FIG. 20B, and FIG. 21B).

For example, a conductive film is formed over the conductive film 512A which is exposed in the opening portion 522A, the insulating film 521, and the like. Specifically, a light-transmitting conductive film is formed.

Then, a resist mask is formed using a seventh photomask. With the resist mask, the conductive film is processed into a desired shape to form the electrode 551($i,j$).

[Eighth Step]

Figure 20C:
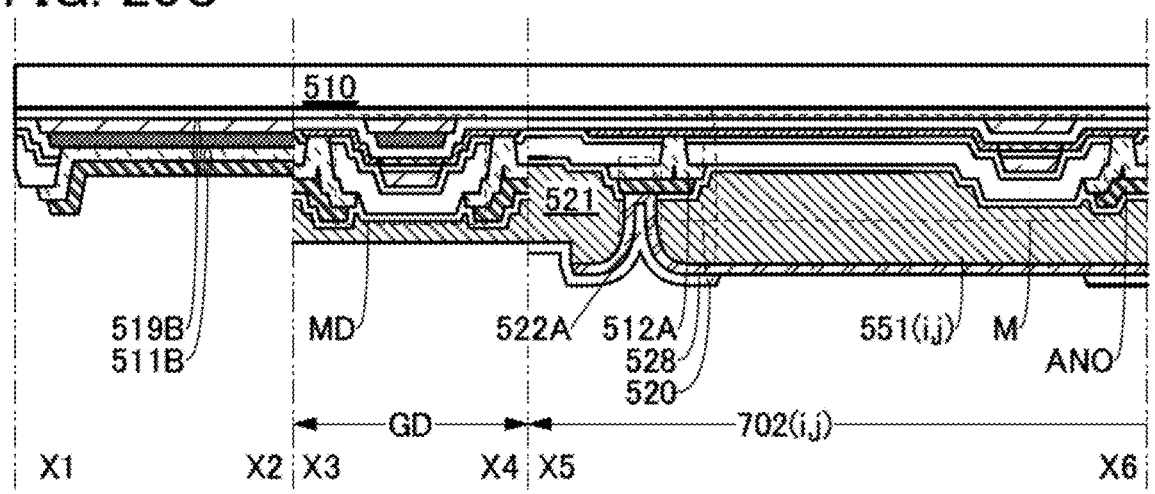
Figure 21C:
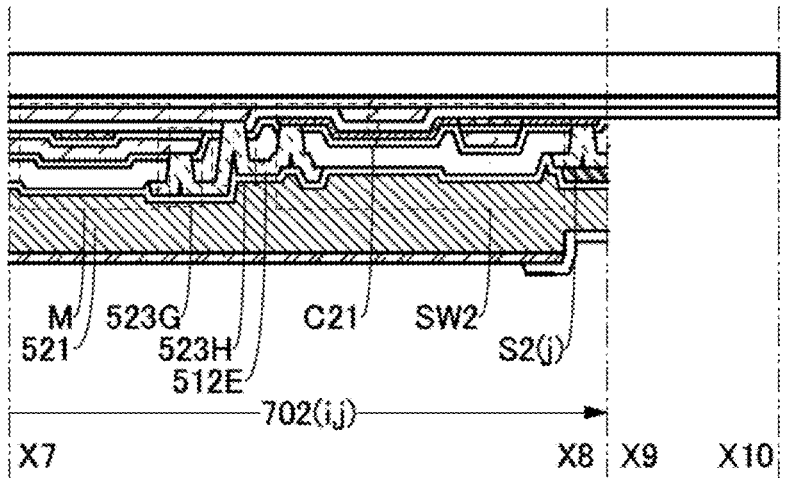

In the eighth step, the insulating film 528 is formed (see V8 in FIG. 14, FIG. 20C, and FIG. 21C).

Before an insulating film is formed, with the use of the electrode 551($i,j$) as a mask, the insulating film 521 is processed, for example. Specifically, the insulating film 521 in a region not overlapping with the electrode 551($i,j$) is made thinner. For example, in the case where a resin is used for the insulating film 521, the processing is performed by an ashing method or the like. Thus, the insulating film 521 in a region not overlapping with the electrode 551($i,j$) can be made thinner. Furthermore, steps can be formed on the insulating film 521 along the periphery of the electrode 551($i,j$).

An insulating film is formed over the electrode 551($i,j$). For example, a film containing silicon oxide is formed using a chemical vapor deposition method. Thus, an insulating film covering the steps which are formed along the periphery of the electrode 551($i,j$) can be formed.

Then, a resist mask is formed using an eighth photomask. With the resist mask, the insulating film is processed into a desired shape to form the insulating film 528. Thus, the insulating film 528 including an opening portion in a region overlapping with the electrode 551($i,j$) and covering the insulating film formed along the periphery of the electrode 551($i,j$) can be formed.

[Ninth Step]

In the ninth step, the layer 553($j$) containing a light-emitting material is formed (see W1 in FIG. 15). For example, the layer 553($j$) containing a light-emitting material has a structure with which white light is emitted. Thus, the layer 553($j$) containing a light-emitting material can be formed in adjacent pixels through one process. Furthermore, with such a structure, the yield can be improved as compared with a method for forming the layers 553($j$) each containing a light-emitting material in adjacent pixels through different processes.

For example, the layer 553($j$) containing a light-emitting material can be formed using a vacuum evaporation method, a coating method, a printing method, an ink-jet method, or the like. Alternatively, for example, the layer 553($j$) containing a light-emitting material can be formed using a nozzle for discharging materials continuously.

The thickness of the layer 553($j$) containing a light-emitting material can be small at the step which is formed along the periphery of the electrode 551($i,j$). Specifically, on the side surface of the step, the thickness of the layer 553($j$) containing a light-emitting material can be small. Thus, current flowing to the adjacent pixel through the layer 553($j$) containing a light-emitting material can be reduced. Furthermore, occurrence of unintended display by the display element included in the adjacent pixel due to current flowing to the adjacent pixel can be suppressed. Furthermore, occurrence of a crosstalk phenomenon can be prevented.

[Tenth Step]

In the tenth step, a fourth conductive film and the like are formed (see W2 in FIG. 15).

For example, a conductive film is formed over the layer 553($j$) containing a light-emitting material to form the electrode 552.

[Eleventh Step]

In the eleventh step, the base 510 and the base 770 are bonded to each other with the bonding layer 505 (see W3 in FIG. 15). Note that the base 510 and the base 770 are bonded to each other so that the dry agent 578 is provided in a region surrounded by the base 510, the base 770, and the bonding layer 505.

Through the aforementioned steps, the display panel can be manufactured.

Note that this embodiment can be combined with any of the other embodiments in this specification as appropriate.

Embodiment 8

In this embodiment, the structures of data processing devices of one embodiment of the present invention will be described with reference to FIGS. 22A to 22E and FIGS. 23A to 23E.

Figure 22A:
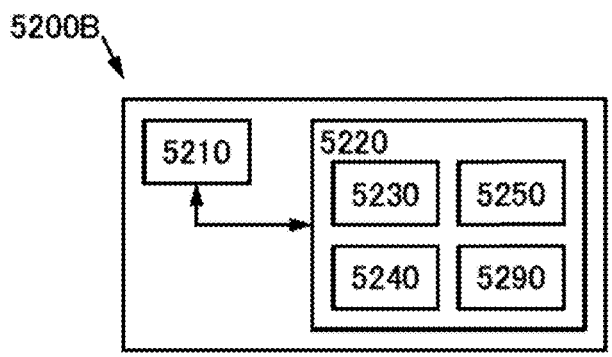
FIGS. 22A to 22E illustrate structures of data processing devices of embodiments.

FIGS. 22A to 22E and FIGS. 23A to 23E illustrate structures of the data processing device of one embodiment of the present invention. FIG. 22A is a block diagram of the data processing device, and FIGS. 22B to 22E are perspective views illustrating the structures of the data processing device. FIGS. 23A to 23E are perspective views illustrating the structures of the data processing device.

<Data Processing Device>

A data processing device 5200B described in this embodiment includes an arithmetic device 5210 and an input/output device 5220 (see FIG. 22A).

The arithmetic device 5210 has a function of receiving operation data and a function of supplying image data on the basis of the operation data.

The input/output device 5220 includes a display portion 5230, an input portion 5240, a sensor portion 5250, and a communication portion 5290 and has a function of supplying operation data and a function of receiving image data. The input/output device 5220 also has a function of supplying sensing data, a function of supplying communication data, and a function of receiving communication data.

The input portion 5240 has a function of supplying operation data. For example, the input portion 5240 supplies operation data on the basis of operation by the user of the data processing device 5200B.

Specifically, a keyboard, a hardware button, a pointing device, a touch sensor, an audio input device, an eye-gaze input device, or the like can be used as the input portion 5240.

The display portion 5230 includes a display panel and has a function of displaying image data. For example, the display panel described in Embodiment 1 can be used for the display portion 5230.

The sensor portion 5250 has a function of supplying sensing data. For example, the sensor portion 5250 has a function of sensing a surrounding environment where the data processing device is used and supplying sensing data.

Specifically, an illuminance sensor, an imaging device, an attitude determination device, a pressure sensor, a human motion sensor, or the like can be used as the sensor portion 5250.

The communication portion 5290 has a function of receiving and supplying communication data. For example, the communication portion 5290 has a function of being connected to another electronic device or a communication network through wireless communication or wired communication. Specifically, the communication portion 5290 has a function of wireless local area network communication, telephone communication, or near field communication, for example.

<<Structure Example 1 of Data Processing Device>>

Figure 22B:
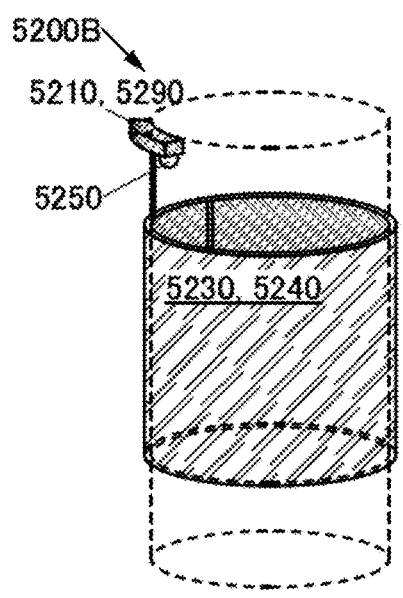

For example, the display portion 5230 can have an outer shape along a cylindrical column (see FIG. 22B). The display portion 5230 can change its display method in accordance with the illuminance of a usage environment. In addition, the display portion 5230 can change the displayed content in response to sensed existence of a person. This allows the data processing device 5200B to be provided on a column of a building, for example. The data processing device 5200B can display advertising, guidance, or the like. The data processing device 5200B can be used for digital signage or the like.

<<Structure Example 2 of Data Processing Device>>

Figure 22C:
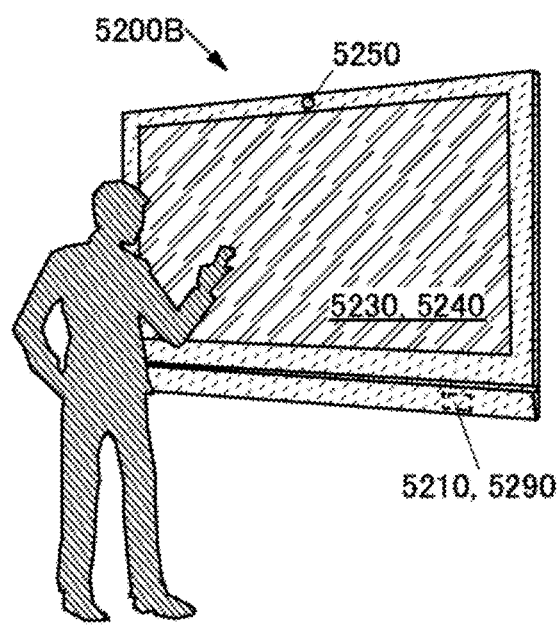

For example, the data processing device 5200B has a function of generating image data on the basis of the path of a pointer used by a user (see FIG. 22C). Specifically, the display panel with a diagonal size of 20 inches or longer, preferably 40 inches or longer, further preferably 55 inches or longer can be used. Alternatively, a plurality of display panels can be arranged in one display region. Alternatively, a plurality of display panels can be arranged and used for multiscreen. Thus, the data processing device 5200B can be used for an electronic blackboard, an electronic bulletin board, or digital signage, for example.

<<Structure Example 3 of Data Processing Device>>

Figure 22D:
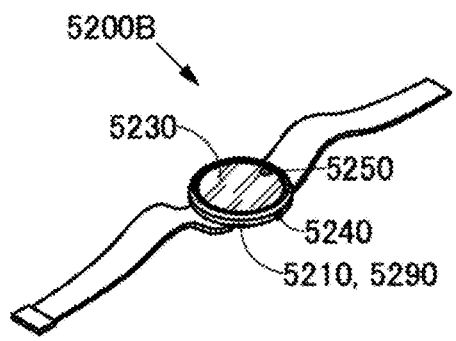

For example, the data processing device 5200B has a function of changing a display method in accordance with the illuminance of a usage environment (see FIG. 22D). Thus, for example, the power consumption of a smartwatch can be reduced. Alternatively, for example, a smartwatch can display an image in such a manner that the smartwatch can be suitably used in an environment under strong external light, e.g., outdoors in fine weather.

<<Structure Example 4 of Data Processing Device>>

Figure 22E:
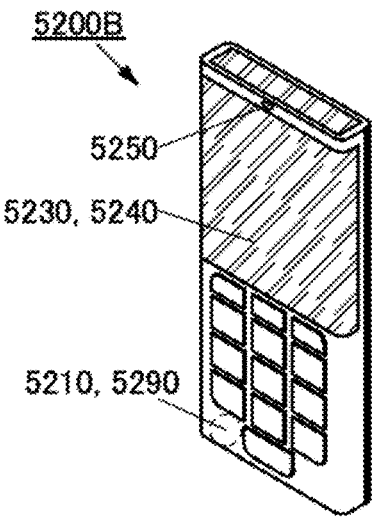

For example, the display portion 5230 has a surface gently curved along a side surface of a housing (see FIG. 22E). The display portion 5230 includes a display panel that can display an image on the front surface, the side surfaces, and the top surface, for example. Accordingly, image data can be displayed on the side surfaces and the top surface of a mobile phone in addition to the front surface, for example.

<<Structure Example 5 of Data Processing Device>>

Figure 23A:
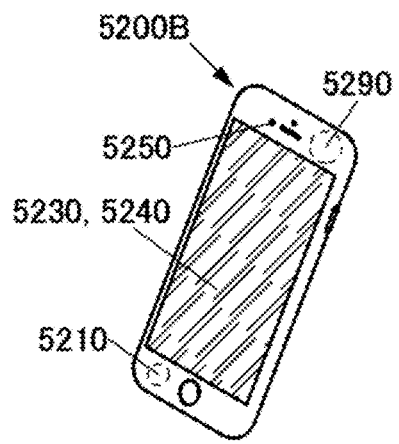
FIGS. 23A to 23E illustrate structures of data processing devices of embodiments.

For example, the data processing device 5200B has a function of changing a display method in accordance with the illuminance of a usage environment (see FIG. 23A). Thus, the power consumption of a smartphone can be reduced. Alternatively, for example, a smartphone can display an image in such a manner that the smartphone can be suitably used in an environment under strong external light, e.g., outdoors in fine weather.

<<Structure Example 6 of Data Processing Device>>

Figure 23B:
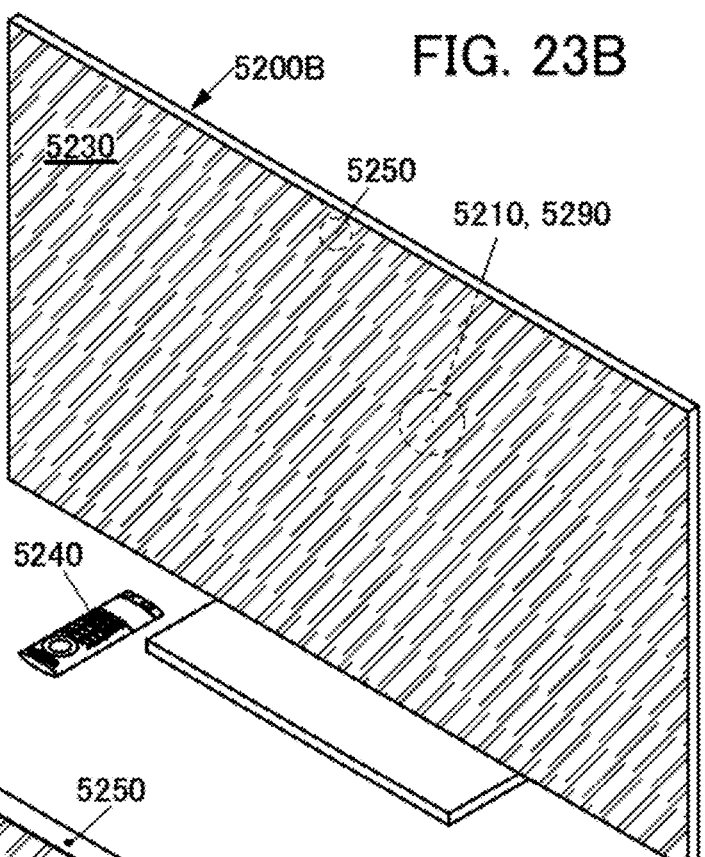

For example, the data processing device 5200B has a function of changing a display method in accordance with the illuminance of a usage environment (see FIG. 23B). Accordingly, a television system can display an image in such a manner that the television system can be suitably used even when irradiated with strong external light that enters the room from the outside in fine weather.

<<Structure Example 7 of Data Processing Device>>

Figure 23C:
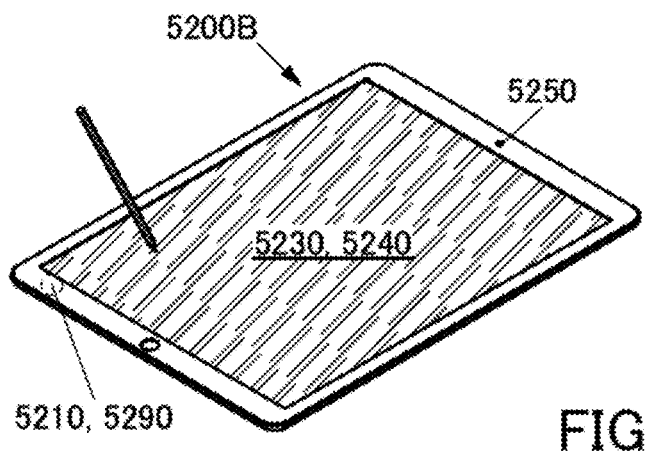

For example, the data processing device 5200B has a function of changing a display method in accordance with the illuminance of a usage environment (see FIG. 23C). Accordingly, for example, a tablet computer can display an image in such a manner that the tablet computer can be suitably used in an environment under strong external light, e.g., outdoors in fine weather.

<<Structure Example 8 of Data Processing Device>>

Figure 23D:
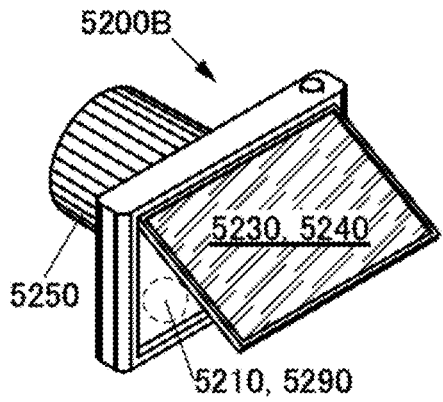

For example, the data processing device 5200B has a function of changing a display method in accordance with the illuminance of a usage environment (see FIG. 23D). Accordingly, for example, a digital camera can display an image of an object to be captured in such a manner that the displayed image can be clearly seen in an environment under strong external light, e.g., outdoors in fine weather.

<<Structure Example 9 of Data Processing Device>>

Figure 23E:
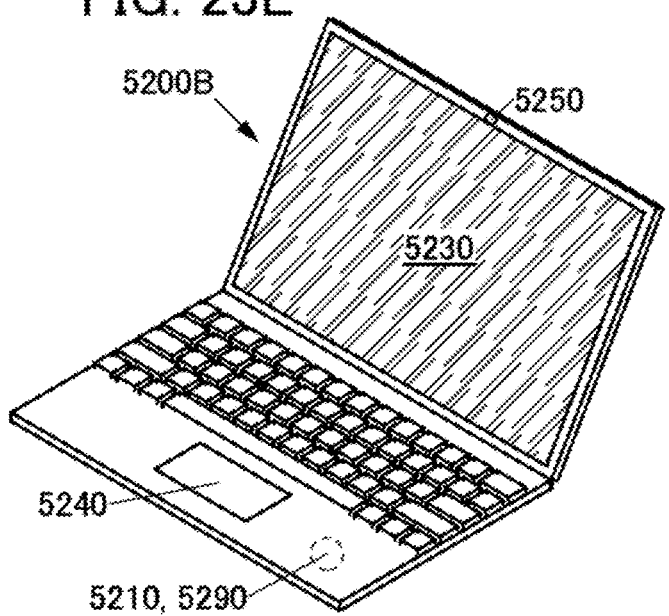

For example, the data processing device 5200B has a function of changing a display method in accordance with the illuminance of a usage environment (see FIG. 23E). Accordingly, for example, a personal computer can display an image in such a manner that the personal computer can be suitably used in an environment under strong external light, e.g., outdoors in fine weather.

Note that this embodiment can be combined with any of the other embodiments in this specification as appropriate.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least Z1 on a first connection path, the first connection path does not include a second connection path, the second connection path includes a connection path on which the transistor is present, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Example

In this example, a fabricated display panel of one embodiment of the present invention will be described with reference to Table 5 and FIG. 37.

<<Structure of Display Panel>>

The fabricated display panel of one embodiment of the present invention includes a display region, a gate driver, and a source driver (see Table 5). Note that a gate driver and a source driver can be referred to as a driver circuit GD and a driver circuit SD, respectively.

<<Structure of Display Region>>

The display region has a diagonal size of 13.3 inches. The display region includes 7680 pixels in the row direction and 4320 pixels in the column direction. The display region includes a plurality of signal lines extended in the column direction.

<<Structure of Pixel>>

The pixel includes a subpixel that represents red, a subpixel that represents green, and a subpixel that represents blue in the row direction.

A plurality of subpixels arranged in the column direction are electrically connected to one signal line.

The subpixel includes a pixel circuit. The subpixel has an aperture ratio of 25.9% and includes an insulating film containing a coloring material which transmits red, green, or blue light. The subpixel includes a tandem organic electroluminescence element. The tandem organic electroluminescence element emits white light.

The pixel circuit includes a capacitor and two transistors. The transistor has a top-gate structure. Note that as a semiconductor of the transistor, a CAC-OS is used.

<<Gate Driver>>

A gate driver has a function of supplying a selection signal to the pixel. For example, the gate driver has a function of supplying a selection signal at a frequency of 60 Hz or 120 Hz. Furthermore, the gate driver includes a semiconductor formed through the same process as that in a transistor used for the pixel circuit.

<<Source Driver>>

The source driver has a function of generating and supplying an image signal. Furthermore, as the source driver, an integrated circuit in which a single crystal silicon is contained in a semiconductor can be used. Note that the source driver is electrically connected to a signal line by a COF method.

TABLE 5

| | |
|---|---|
| Panel size | 13.3 inch |
| Effective pixels | 7680 × RGB(H) × 4320(V): 8K |
| Pixel density | 664 ppi |
| Aperture ratio | 25.9% |
| Frame frequency | 60 Hz/120 Hz |
| Coloring method | White tandem OLED, Bottom emission, Color filter |
| FET | CAC-OS TGSA-FET |
| Gray scale | 12 bit |
| Pixel circuit | 2 transistors, 1 capacitor |
| Gate driver | Incorporated |
| Source driver | Integrated circuit connected by COF method |
| Source lines | One per one column |

<Evaluation>

Figure 37:
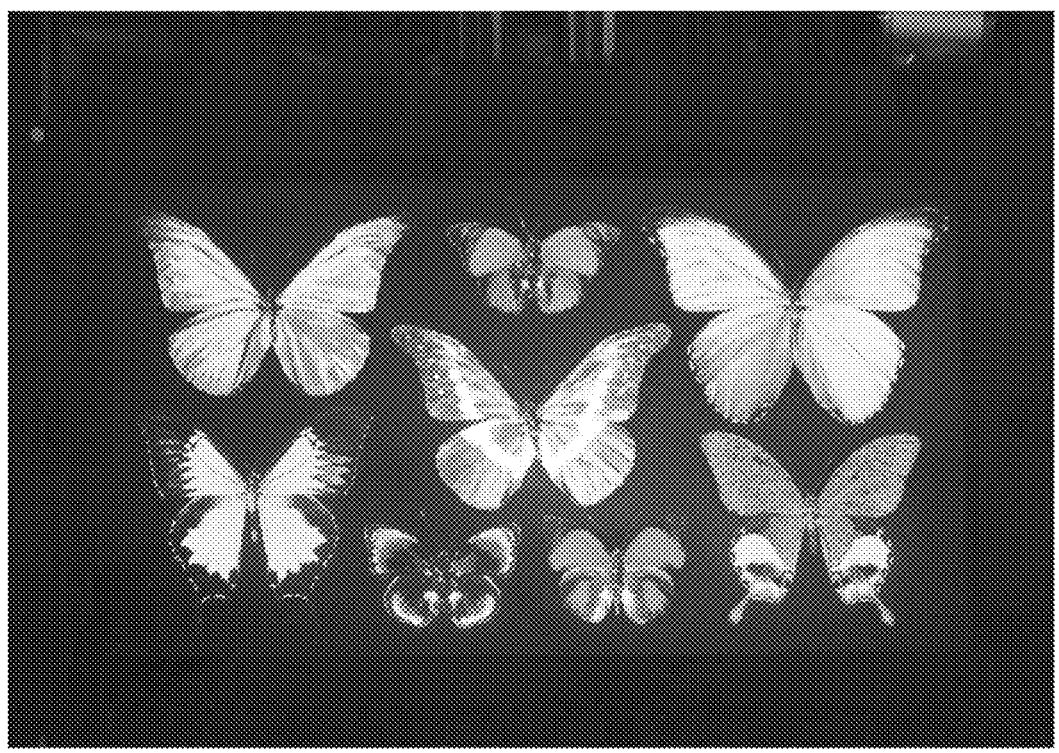
FIG. 37 is a photograph showing a display state of a display panel of Example.

Display of an image on the fabricated display panel is shown (see FIG. 37). Then, a so-called 8K image can be favorably displayed.

REFERENCE NUMERALS d0: distance, d1: distance, DC: detection circuit, OSC: oscillator circuit, P1: positional data, SD: driver circuit, GD: driver circuit, GDA: driver circuit, GDB: driver circuit, GDC: driver circuit, GDD: driver circuit, CP: conductive material, ANO: conductive film, SS: control data, ACF1: conductive material, C21: capacitor, G2(*i*): scan line, S1: sensing data, S2(*j*): signal line, S21(*j*): signal line, S22(*j*): signal line, SD2: driver circuit, SW2: switch, V0: wiring, VDD: common wiring, VSS: common wiring, V1: image data, V12: data, VCOM2: conductive film, FPC1: flexible printed circuit, 200: data processing device, 210: arithmetic device, 211: arithmetic portion, 212: memory portion, 214: transmission path, 215: input/output interface, 220: input/output device, 230: display portion, 231: display region, 234: decompression circuit, 235M: image processing circuit, 238: control portion, 240: input portion, 241: sensing region, 250: sensor portion, 290: communication portion, 501C: insulating film, 501D: insulating film, 504: conductive film, 504E: conductive film, 505: bonding layer, 506: insulating film, 508: semiconductor film, 508A: region, 508B: region, 508C: region, 510: base, 511B: conductive film, 512A: conductive film, 512B: conductive film, 512C: conductive film, 512D: conductive film, 512E: conductive film, 512F: conductive film, 516: insulating film, 516A: insulating film, 516B: insulating film, 518: insulating film, 519B: terminal, 520: functional layer, 520T: light-transmitting region, 521: insulating film, 521R: insulating film, 521G: insulating film, 521B: insulating film, 521PR: opening portion, 521PG: opening portion, 521PB: opening portion, 522A: opening portion, 523A: opening portion, 523B: opening portion, 523C: opening portion, 523D: opening portion, 523E: opening portion, 523F: opening portion, 523G: opening portion, 523H: opening portion, 523I: opening portion, 524: conductive film, 524B: conductive film, 524C: conductive film, 528: insulating film, 530(*i,j*): pixel circuit, 550(*i,j*): display element, 551: electrode, 552: electrode, 553(*j*): layer containing light-emitting material, 553B: layer containing light-emitting material, 553IL: intermediate layer, 553Y: layer containing light-emitting material, 700: display panel, 700B: display panel, 702(i,j): pixel, 770: base, 770P: functional film, 775(g,h): sensor element, 5200B: data processing device, 5210: arithmetic device, 5220: input/output device, 5230: display portion, 5240: input portion, 5250: sensor portion, 5290: communication portion.

This application is based on Japanese Patent Application Serial No. 2016-253066 filed with Japan Patent Office on Dec. 27, 2016, Japanese Patent Application Serial No. 2017-006410 filed with Japan Patent Office on Jan. 18, 2017, and Japanese Patent Application Serial No. 2017-074196 filed with Japan Patent Office on Apr. 4, 2017, the entire contents of which are hereby incorporated by reference.

The invention claimed is:

1. A display panel comprising:
a pixel that comprises a functional layer and a display element,
wherein the functional layer comprises a light-transmitting region transmitting visible light,
wherein the functional layer comprises a pixel circuit electrically connected to the display element,
wherein the pixel circuit comprises a conductive film, three transistors, and a capacitor,
wherein the conductive film comprises a region transmitting visible light in the light-transmitting region,
wherein one of the three transistors comprises a semiconductor film, a first electrode, a second electrode, and a gate electrode,
wherein the semiconductor film comprises a first region, a second region, and a region overlapping with the gate electrode between the first region and the second region,
wherein the first region comprises a region electrically connected to the first electrode,
wherein the first region comprises a region transmitting visible light in the light-transmitting region,
wherein the second region comprises a region electrically connected to the second electrode,
wherein the second region comprises a region transmitting visible light in the light-transmitting region,
wherein one electrode of the capacitor functions as an electrode of at least one of the three transistors,
wherein the pixel circuit comprises the capacitor in the light-transmitting region,
wherein the capacitor comprises the first region or the second region,
wherein the display element is configured to emit visible light through the light-transmitting region, and
wherein the pixel has an aperture ratio of higher than or equal to 20%.

2. The display panel according to claim 1,
wherein the capacitor is provided between the one of the three transistors and another of the three transistors,
wherein a band gap of the semiconductor film is greater than or equal to 2.5 eV, and
wherein the conductive film comprises a conductive oxide.

3. The display panel according to claim 1, wherein the light-transmitting region has a transmittance to red, green, or blue light of higher than or equal to 60%.

4. The display panel according to claim 1,
wherein the functional layer comprises a first insulating film and a second insulating film,
wherein the first insulating film comprises a region sandwiched between the pixel circuit and the display element,
wherein the first insulating film comprises a first opening portion,
wherein the second insulating film comprises a region sandwiched between the pixel circuit and the first insulating film,
wherein the second insulating film comprises a second opening portion,
wherein the second opening portion comprises a region overlapping with the first opening portion,
wherein the second opening portion has an outer edge aligned with an outer edge of the first opening portion, and
wherein the display element is electrically connected to the pixel circuit through the first opening portion and the second opening portion.

5. The display panel according to claim 1, further comprising a display region,
wherein the display region comprises one group of pixels, another group of pixels, a scan line comprising a metal film, and a signal line comprising a metal film,
wherein the one group of pixels comprise the pixel,
wherein the one group of pixels are arranged in a row direction,
wherein the another group of pixels comprise the pixel,
wherein the another group of pixels are arranged in a column direction intersecting the row direction,
wherein the scan line is electrically connected to the one group of pixels, and
wherein the signal line is electrically connected to the another group of pixels.

6. The display panel according to claim 1, further comprising:
a first base;
a second base;
a bonding layer; and
a dry agent,
wherein the second base comprises a region overlapping with the first base,
wherein the functional layer comprises a region sandwiched between the first base and the second base,
wherein the bonding layer is capable of bonding the first base with the second base, and
wherein the dry agent is positioned in a region surrounded by the first base, the second base, and the bonding layer.

7. A display device comprising:
the display panel according to claim 5; and
a control portion,
wherein the control portion is supplied with image data and control data,
wherein the control portion generates data on the basis of the image data,
wherein the control portion supplies the data,
wherein the data has a gray scale of greater than or equal to 12 bit,
wherein the display panel is supplied with the data,
wherein the scan line is supplied with a selection signal at a frequency of greater than or equal to 120 Hz, and
wherein the display element performs display on the basis of the data.

8. A display panel comprising:
a plurality of pixels, one of the plurality of pixels comprises a functional layer and a display element,
wherein the functional layer comprises a light-transmitting region transmitting visible light, wherein the functional layer comprises a pixel circuit electrically connected to the display element,
wherein the pixel circuit comprises a conductive film, a first transistor, and a second transistor,
wherein the conductive film comprises a region transmitting visible light in the light-transmitting region,
wherein the first transistor comprises a semiconductor film, a first electrode, a second electrode, and a gate electrode,
wherein the semiconductor film comprises a first region, a second region, and a region overlapping with the gate electrode between the first region and the second region,
wherein the first region comprises a region electrically connected to the first electrode,
wherein the first region comprises a region transmitting visible light in the light-transmitting region,
wherein the second region comprises a region electrically connected to the second electrode,
wherein the second region comprises a region transmitting visible light in the light-transmitting region,
wherein the display element is configured to emit visible light through the light-transmitting region,
wherein the pixel circuit comprises a capacitor in the light-transmitting region,
wherein the pixel has an aperture ratio of higher than or equal to 20%,
wherein the capacitor is between the first transistor and the second transistor,
wherein the capacitor is formed by an electrode of the second transistor and the semiconductor film of the first transistor,
wherein the capacitor comprises the first region or the second region, and
wherein the capacitor has a light-transmitting property.

9. The display panel according to claim 8,
wherein the plurality of pixels arranged in the column direction is electrically connected to one signal line, and
wherein any one of a light-transmitting material and a non-light transmitting material is used for the signal line.

10. The display panel according to claim 8,
wherein the display panel applies a white tandem OLED, and
wherein the display panel is a bottom-emission type display panel.

11. A display panel comprising:
a plurality of pixels, one of the plurality of pixels comprises a functional layer and a display element,
wherein the functional layer comprises a light-transmitting region transmitting visible light,
wherein the functional layer comprises a pixel circuit electrically connected to the display element,
wherein the pixel circuit comprises a conductive film, a first transistor, and a second transistor,
wherein the pixel has an aperture ratio of higher than or equal to 20%,
wherein the conductive film comprises a region transmitting visible light in the light-transmitting region,
wherein the first transistor comprises a semiconductor film, a first electrode, a second electrode, and a gate electrode,
wherein the semiconductor film comprises a first region, a second region, and a region overlapping with the gate electrode between the first region and the second region,
wherein the first region comprises a region electrically connected to the first electrode,
wherein the first region comprises a region transmitting visible light in the light-transmitting region,
wherein the second region comprises a region electrically connected to the second electrode,
wherein the second region comprises a region transmitting visible light in the light-transmitting region,
wherein a capacitor is formed by an electrode of the second transistor and the semiconductor film of the first transistor;
wherein the display element is configured to emit visible light through the light-transmitting region, and
wherein a connection portion between the transistor and a signal line has a light-transmitting property.

12. The display panel according to claim 11,
wherein the electrode of the second transistor is a gate electrode.

13. The display panel according to claim 11,
wherein the plurality of pixels arranged in the column direction is electrically connected to one signal line, and
wherein any one of a light-transmitting material and a non-light transmitting material is used for the signal line.

14. The display panel according to claim 11,
wherein the display panel applies a white tandem OLED, and
wherein the display panel is a bottom-emission type display panel.

* * * * *